US012593586B2

(12) United States Patent
Shang et al.

(10) Patent No.: US 12,593,586 B2
(45) Date of Patent: Mar. 31, 2026

(54) DISPLAY SUBSTRATE AND METHOD FOR MANUFACTURING THE SAME, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Tinghua Shang, Beijing (CN); Wei Zhang, Beijing (CN); Yi Zhang, Beijing (CN); Weiyun Huang, Beijing (CN); Ang Xiao, Beijing (CN); Tingliang Liu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 18/268,401

(22) PCT Filed: Jul. 12, 2022

(86) PCT No.: PCT/CN2022/105240
§ 371 (c)(1),
(2) Date: Jun. 20, 2023

(87) PCT Pub. No.: WO2023/098089
PCT Pub. Date: Jun. 8, 2023

(65) Prior Publication Data
US 2024/0032375 A1 Jan. 25, 2024

(30) Foreign Application Priority Data

Nov. 30, 2021 (CN) .......................... 202111444118.X

(51) Int. Cl.
*H10K 59/35* (2023.01)
*H10K 50/19* (2023.01)
(Continued)

(52) U.S. Cl.
CPC ........... *H10K 59/353* (2023.02); *H10K 50/19* (2023.02); *H10K 59/1201* (2023.02);
(Continued)

(58) Field of Classification Search
CPC .. H10K 59/353; H10K 59/352; H10K 59/122; H10K 59/1201; H10K 50/19; H10K 71/60; H10K 71/00
See application file for complete search history.

(56) References Cited

U.S. PATENT DOCUMENTS

| | | | |
|---|---|---|---|
| 7,732,810 B2 | 6/2010 | Truong et al. | |
| 10,923,543 B1 | 2/2021 | Chen | |

(Continued)

FOREIGN PATENT DOCUMENTS

| | | |
|---|---|---|
| CN | 108493228 A | 9/2018 |
| CN | 108717942 A | 10/2018 |

(Continued)

OTHER PUBLICATIONS

International Search Report in PCT/CN2022/105240 in Chinese dated Sep. 28, 2022 with English translation.
(Continued)

*Primary Examiner* — Anne M Hines
*Assistant Examiner* — Jose M Diaz
(74) *Attorney, Agent, or Firm* — Collard & Roe, P.C.

(57) ABSTRACT

A display substrate and a method for manufacturing the same, and a display device are provided. The display substrate includes a base substrate, a plurality of sub-pixels and an isolation structure. A light-emitting element of each sub-pixel includes a light emitting functional layer, and a
(Continued)

first electrode and a second electrode which are located on two sides of the light emitting functional layer, the first electrode being located between the light emitting functional layer and the base substrate, and the light emitting functional layer including a conductive sub-layer. The isolation structure is located between adjacent sub-pixels, and the conductive sub-layer in the light emitting functional layer is disconnected at the position of the isolation structure. The isolation structure includes a plurality of ring-shaped isolation parts, each of which surrounds one sub-pixel.

19 Claims, 15 Drawing Sheets

(51) Int. Cl.

| | |
|---|---|
| *H10K 59/12* | (2023.01) |
| *H10K 59/122* | (2023.01) |
| *H10K 71/60* | (2023.01) |

(52) U.S. Cl.
CPC ......... *H10K 59/122* (2023.02); *H10K 59/352* (2023.02); *H10K 71/60* (2023.02)

(56) References Cited

U.S. PATENT DOCUMENTS

| | | | |
|---|---|---|---|
| 11,171,304 B2 | 11/2021 | Ban et al. | |
| 2007/0052349 A1 | 3/2007 | Giraldo et al. | |
| 2017/0141169 A1* | 5/2017 | Sim ..................... | H10K 59/122 |
| 2019/0363276 A1 | 11/2019 | Li et al. | |
| 2020/0343322 A1 | 10/2020 | Jia et al. | |
| 2021/0111302 A1 | 4/2021 | Pan | |

| | | | |
|---|---|---|---|
| 2021/0202882 A1 | 7/2021 | Shim et al. | |
| 2021/0296370 A1 | 9/2021 | Song | |
| 2022/0416197 A1 | 12/2022 | Chen | |

FOREIGN PATENT DOCUMENTS

| | | | |
|---|---|---|---|
| CN | 109728068 A | 5/2019 | |
| CN | 109742121 A | 5/2019 | |
| CN | 110137378 A | 8/2019 | |
| CN | 110783382 A | 2/2020 | |
| CN | 111326675 A | 6/2020 | |
| CN | 111834552 A | 10/2020 | |
| CN | 111863929 A | 10/2020 | |
| CN | 112071889 A | 12/2020 | |
| CN | 212874542 A | 4/2021 | |
| CN | 112838103 A | 5/2021 | |
| CN | 113314579 A | 8/2021 | |
| CN | 114628448 A | 6/2022 | |
| CN | 114628451 A | 6/2022 | |
| CN | 216749902 U | 6/2022 | |
| JP | 2005203215 A | 7/2005 | |
| JP | 2008135325 A | 6/2008 | |
| JP | 2017162832 A | 9/2017 | |

OTHER PUBLICATIONS

Written Opinion in PCT/CN2022/105240 in Chinese dated Sep. 28, 2022.
Chinese Office Action in Chinese Application No. 202310078696.9 dated Jun. 28, 2023 with English translation.
Extended European Search Report in European Application No. 22899909.0 dated Sep. 27, 2024.
Written Opinion in PCT/CN2022/105240 in Chinese dated Sep. 28, 2022 with English translation.

\* cited by examiner

100

100

100

100

100

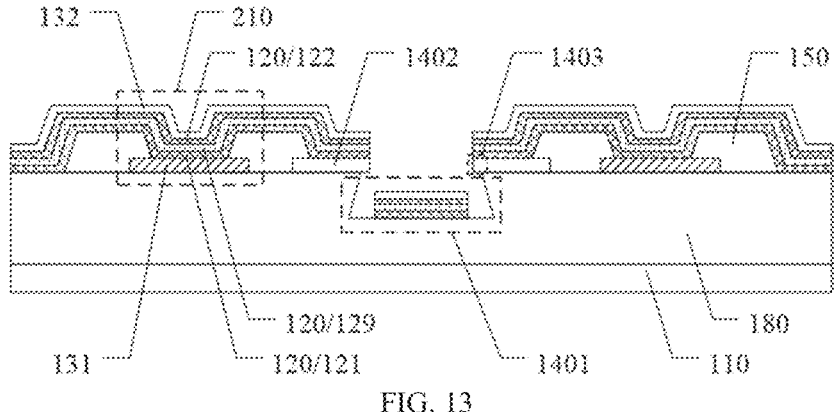
FIG. 13
display device 500
display substrate 100
FIG. 14
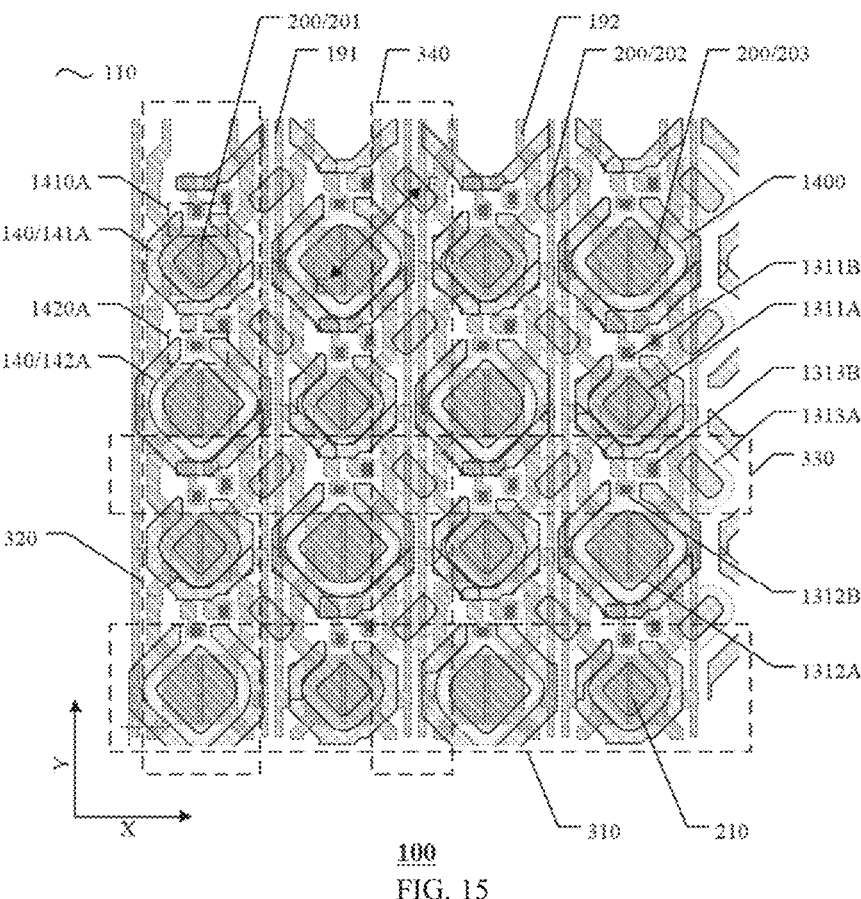
100
FIG. 15

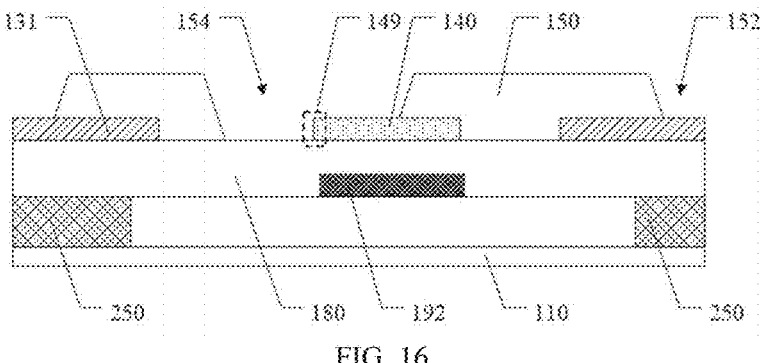
FIG. 16
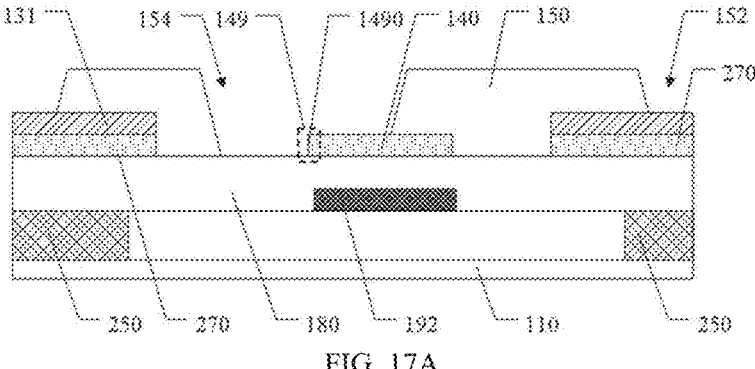
FIG. 17A
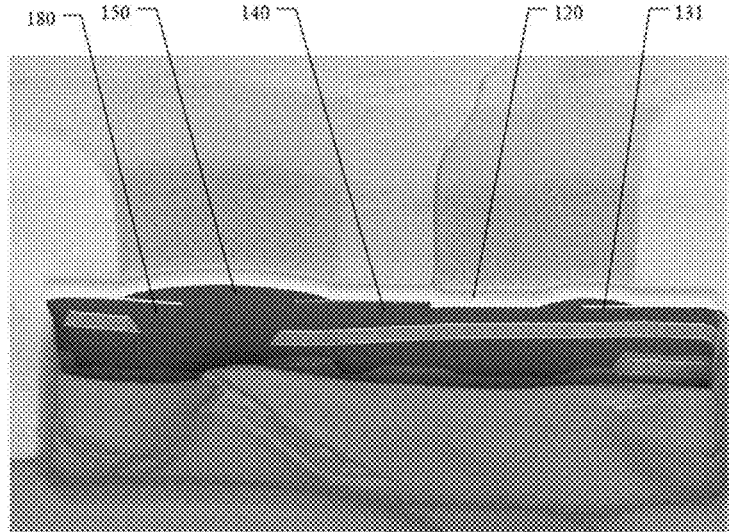
FIG. 17B
display device 500
display substrate 100
FIG. 18

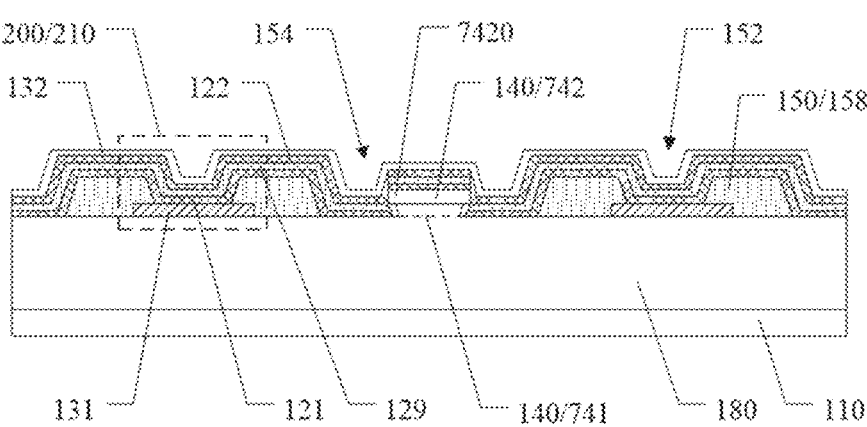
FIG. 21B
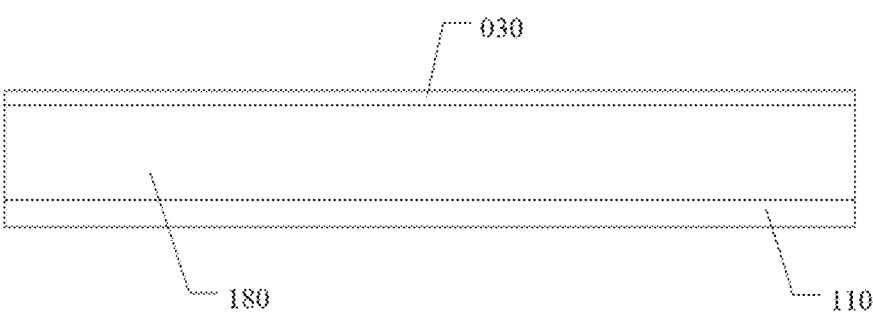
FIG. 22A
FIG. 22B
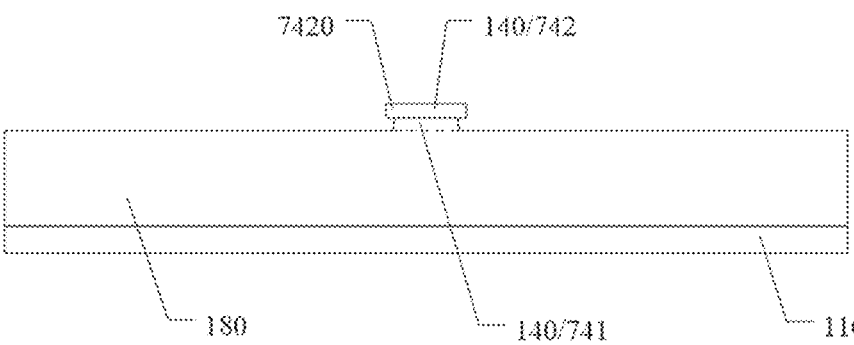
FIG. 22C

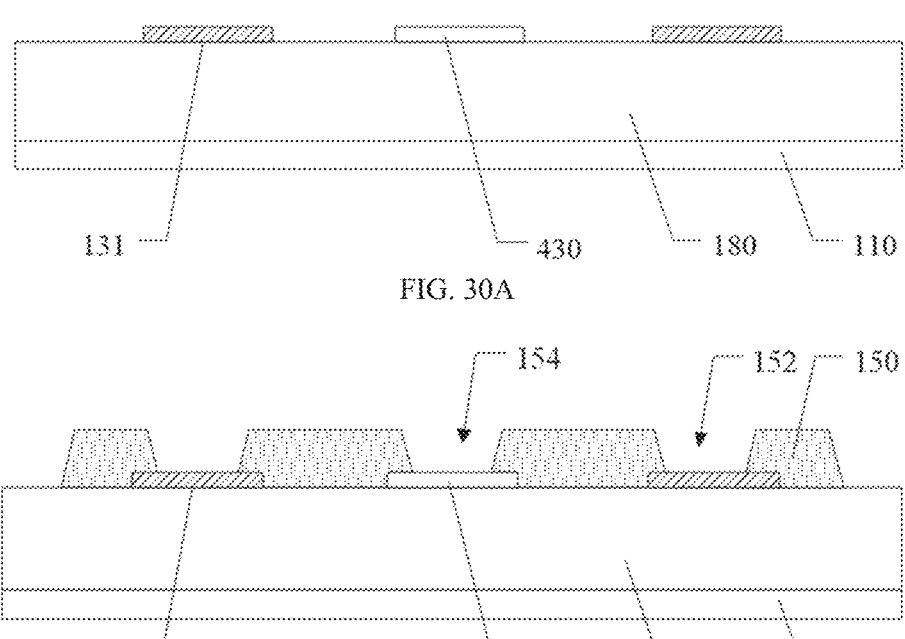
131          430          180      110
FIG. 30A
154          152    150
131          430          180      110
FIG. 30B
140/140S
140R          154          152    150
131          140/140C          180      110
FIG. 30C
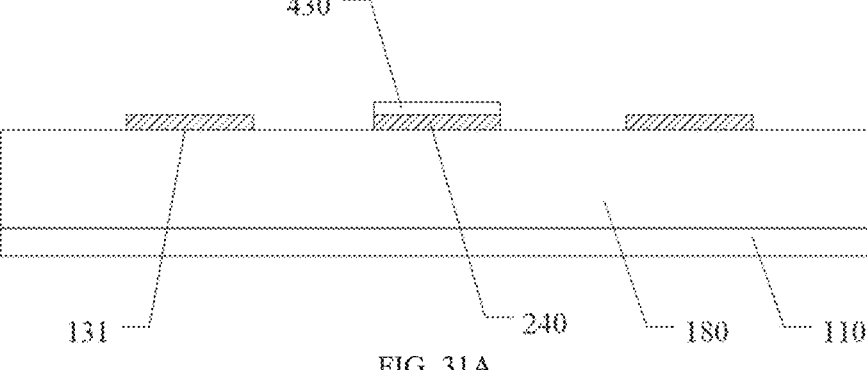
430
131          240          180      110
FIG. 31A

1

DISPLAY SUBSTRATE AND METHOD FOR MANUFACTURING THE SAME, AND DISPLAY DEVICE

CROSS REFERENCE TO RELATED APPLICATIONS

This application is the National Stage of PCT/CN2022/105240 filed on Jul. 12, 2022, which claims priority under 35 U.S.C. § 119 of Chinese Application No. 202111444118.X filed on Nov. 30, 2021, the disclosure of which is incorporated by reference.

TECHNICAL FIELD

The embodiments of the present disclosure relate to a display substrate and a method for manufacturing the same, and a display device.

BACKGROUND

With the continuous development of display technology, organic light emitting diode display (OLED) has become a research hotspot and technology development direction of major manufacturers due to its advantages of wide color gamut, high contrast, thin and light design, self-illumination, and wide viewing angle.

At present, organic light emitting diode display devices (OLEDs) have been widely used in various electronic products, ranging from small electronic products such as smart bracelets, smart watches, smart phones, and tablet computers to large electronic product such as notebook computers, desktop computers, and televisions. Therefore, the market demand for active matrix organic light emitting diode display devices is also increasing.

SUMMARY

Embodiments of the disclosure provide a display substrate and a method for manufacturing the same, and a display device. In the display substrate, through disposing the isolation structure between adjacent sub-pixels, and disconnecting the charge generation layer in the light emitting functional layer at the location of the isolation structure, crosstalk between adjacent sub-pixels due to the charge generation layer with high conductivity is avoided. In addition, since the isolation structure includes a plurality of ring-shaped isolation parts, each ring-shaped isolation parts surrounds one first color sub-pixel, one second color sub-pixel, or one third color sub-pixel, the crosstalk between the adjacent sub-pixels is avoided. On the other hand, since the display substrate can avoid crosstalk between adjacent sub-pixels through the isolation structure, the display substrate can increase pixel density while adopting a tandem EL design. Therefore, the display substrate can have the advantages of long life, low power consumption, high brightness, and high resolution.

At least one embodiment of the disclosure provides a display substrate, comprising: a base substrate; a plurality of sub-pixels, located on the base substrate, wherein each of the plurality of sub-pixels comprises a light emitting element, and the light emitting element comprises a light emitting functional layer, and a first electrode and a second electrode located on two sides of the light emitting functional layer, wherein the first electrode is located between the light emitting functional layer and the base substrate, and the light emitting functional layer comprises a conductive sub-layer; and an isolation structure, located on the base substrate, wherein the isolation structure is located between adjacent sub-pixels of the plurality of sub-pixels, and the conductive sub-layer in the light emitting functional layer is disconnected at a position where the isolation structure is located, the plurality of sub-pixels comprise a plurality of first color sub-pixels, a plurality of second color sub-pixels, and a plurality of third color sub-pixels, and the isolation structure comprises a plurality of ring-shaped isolation parts, each of the plurality of ring-shaped isolation parts surrounds one of one first color sub-pixel, one second color sub-pixel, and one third color sub-pixel.

For example, in the display substrate according to an embodiment of the disclosure, the plurality of ring-shaped isolation parts comprise a plurality of first ring-shaped pixel isolation parts and a plurality of second ring-shaped pixel isolation parts, and the plurality of first ring-shaped pixel isolation parts are disposed in correspondence with the plurality of first color sub-pixels, and the plurality of second ring-shaped pixel isolation parts are disposed in correspondence with the plurality of third color sub-pixels, each of the plurality of first ring-shaped pixel isolation parts surrounds one of the plurality of first color sub-pixels, and each of the plurality of second ring-shaped pixel isolation parts surrounds one of the plurality of third color sub-pixels.

For example, in the display substrate according to an embodiment of the disclosure, the isolation structure between a first color sub-pixel of the plurality of first color sub-pixels and a second color sub-pixel of the plurality of second color sub-pixels that are adjacent to each other only comprises a first ring-shaped pixel isolation part of the plurality of first ring-shaped pixel isolation parts, the isolation structure between a third color sub-pixel of the plurality of third color sub-pixels and a second color sub-pixel of the plurality of second color sub-pixels that are adjacent to each other only comprises a second ring-shaped pixel isolation part of the plurality of second ring-shaped pixel isolation parts.

For example, in the display substrate according to an embodiment of the disclosure, the plurality of first ring-shaped pixel isolation parts respectively comprise first openings, and each of the first openings is located on an extension line of a diagonal of an effective light emitting region of a first color sub-pixel of the plurality of first color sub-pixels.

For example, in the display substrate according to an embodiment of the disclosure, the first electrode of the first color sub-pixel comprises a first body part and a first connection part, and the first connection part is connected to the first body part, and configured to be connected with a pixel driving circuit, the first connection part is located at a position where the first opening is located.

For example, in the display substrate according to an embodiment of the disclosure, the plurality of second ring-shaped pixel isolation parts respectively comprise second openings, and each of the second openings is located on an extension line of a diagonal of an effective light emitting region of a third color sub-pixel of the plurality of third color sub-pixels.

For example, in the display substrate according to an embodiment of the disclosure, the first electrode of the third color sub-pixel comprises a second body part and a second connection part, and the second connection part is connected to the second body part, and configured to be connected with a pixel driving circuit, the second connection part is located at a position where the second opening is located.

For example, in the display substrate according to an embodiment of the disclosure, the first openings are arranged in an array to form first opening rows and first opening columns along a first direction and a second direction, the second openings are arranged in an array to form second opening rows and second opening columns along the first direction and the second direction, the first opening rows are substantially parallel to the second opening rows, and the first opening columns are substantially parallel to the second opening columns.

For example, in the display substrate according to an embodiment of the disclosure, the first opening rows are located between the plurality of first color sub-pixels and the plurality of third color sub-pixels, and the second opening rows are located between the plurality of first color sub-pixels and the plurality of third color sub-pixels.

For example, the display substrate according to an embodiment of the disclosure further comprises: a pixel definition layer, located on the base substrate, wherein the pixel definition layer is partially located on a side of the first electrode away from the base substrate, the pixel definition layer comprises a plurality of pixel openings and a pixel spacing opening, and the plurality of pixel openings are in one-to-one correspondence with the plurality of sub-pixels to define effective light emitting regions of the plurality of sub-pixels, each of the plurality of pixel openings is configured to expose the first electrode, the pixel spacing opening is located between adjacent first electrodes, and at least a portion of the isolation structure is located between the pixel definition layer and the base substrate.

For example, in the display substrate according to an embodiment of the disclosure, an edge of the isolation structure at a side in an arrangement direction of adjacent sub-pixels is located between the pixel definition layer and the base substrate.

For example, the display substrate according to an embodiment of the disclosure further comprises: a planarization layer, located between the base substrate and the first electrode; and a protection structure, located between the planarization layer and the first electrode.

For example, in the display substrate according to an embodiment of the disclosure, an orthographic projection of the first electrode on the base substrate falls within an orthographic projection of the protection structure on the base substrate.

For example, in the display substrate according to an embodiment of the disclosure, wherein the protection structure and the isolation structure are disposed in a same layer.

For example, in the display substrate according to an embodiment of the disclosure, a side of the isolation structure in an arrangement direction of adjacent sub-pixels comprises an isolation surface, and an included angle between the isolation surface and a plane where the base substrate is located ranges from 80 degrees to 100 degrees.

For example, in the display substrate according to an embodiment of the disclosure, a dimension of the isolation structure in a direction perpendicular to the base substrate ranges from 500 Å to 1500 Å.

For example, in the display substrate according to an embodiment of the disclosure, the light emitting functional layer comprises a first light emitting layer and a second light emitting layer located on two sides of the conductive sub-layer in a direction perpendicular to the base substrate, and the conductive sub-layer is a charge generation layer.

For example, in the display substrate according to an embodiment of the disclosure, the plurality of first color sub-pixels and the plurality of third color sub-pixels are alternately arranged along a first direction and a second direction to form a plurality of first pixel rows and a plurality of first pixel columns, and the plurality of second color sub-pixels are arranged in an array along the first direction and the second direction to form a plurality of second pixel rows and a plurality of second pixel columns, the plurality of first pixel rows and the plurality of second pixel columns are alternately arranged along the second direction and staggered from each other in the first direction, the plurality of first pixel columns and the plurality of second pixel columns are alternately arranged along the first direction and staggered from each other in the second direction, the isolation structure is located between adjacent first color sub-pixel and third color sub-pixel, and/or, the isolation structure is located between adjacent second color sub-pixel and third color sub-pixel, and/or, the isolation structure is located between adjacent first color sub-pixel and second color sub-pixel.

An embodiment of the disclosure further provides a display device, comprising the display substrate according to any items as mentioned above.

An embodiment of the disclosure further provides a method for manufacturing a display substrate, comprising: forming a plurality of first electrodes on a base substrate; forming an isolation structure on the base substrate; forming a light emitting functional layer on a side of the isolation structure and the plurality of first electrodes away from the base substrate, and the light emitting functional layer comprises a conductive sub-layer; and forming a second electrode on a side of the light emitting functional layer away from the base substrate, the second electrode, the light emitting functional layer and the plurality of first electrodes form light emitting elements of the plurality of sub-pixels, wherein the isolation structure is located between adjacent sub-pixels of the plurality of sub-pixels, and the conductive sub-layer in the light emitting functional layer is disconnected at a position where the isolation structure is located, the plurality of sub-pixels comprise a plurality of first color sub-pixels, a plurality of second color sub-pixels, and a plurality of third color sub-pixels, and the isolation structure comprises a plurality of ring-shaped isolation parts, and each of the plurality of ring-shaped isolation parts surround one of one first color sub-pixel, one second color sub-pixel and one third color sub-pixel.

BRIEF DESCRIPTION OF DRAWINGS

In order to make the technical solutions of the embodiments of the present disclosure clearer, the accompanying drawings of the embodiments will be briefly introduced below. Apparently, the following described drawings are just related to some embodiments of the disclosure, but not intended to limit the present disclosure.

5

Figure 6:
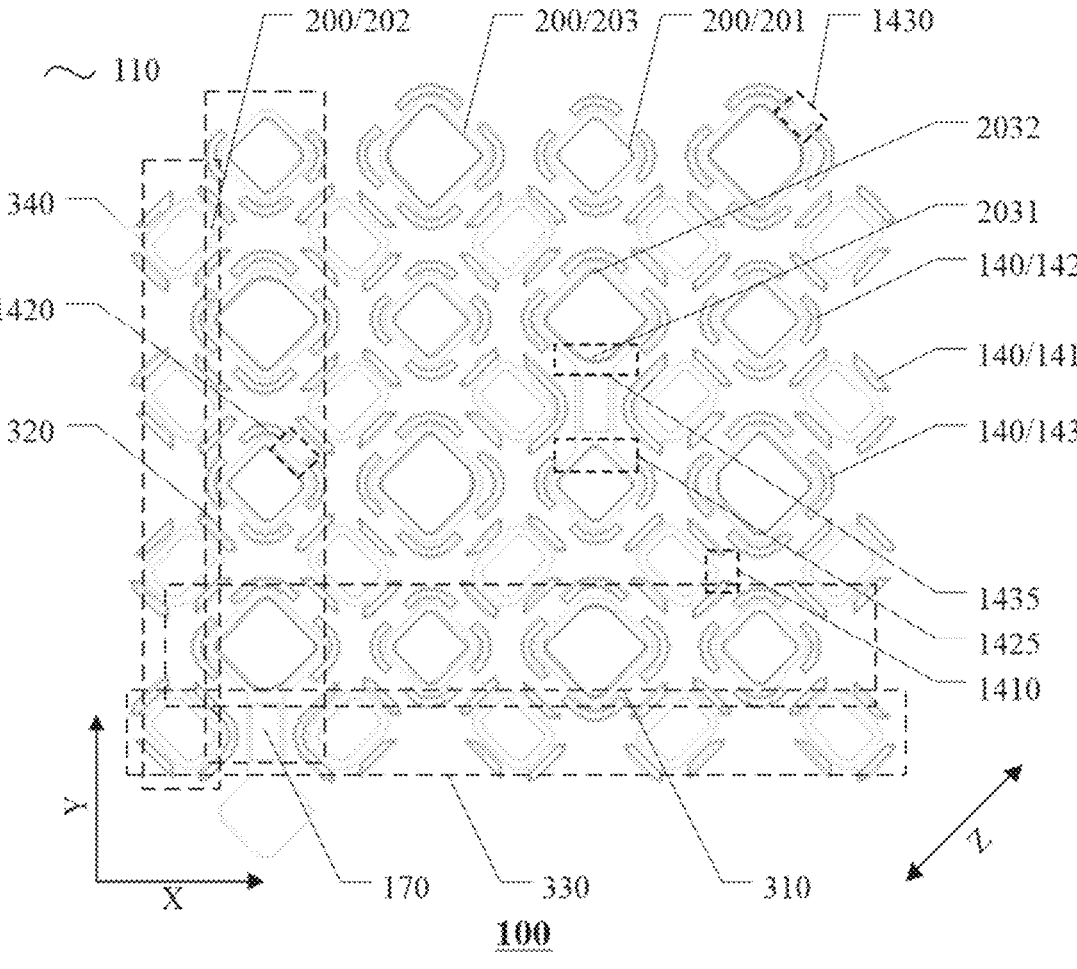
Figure 7:
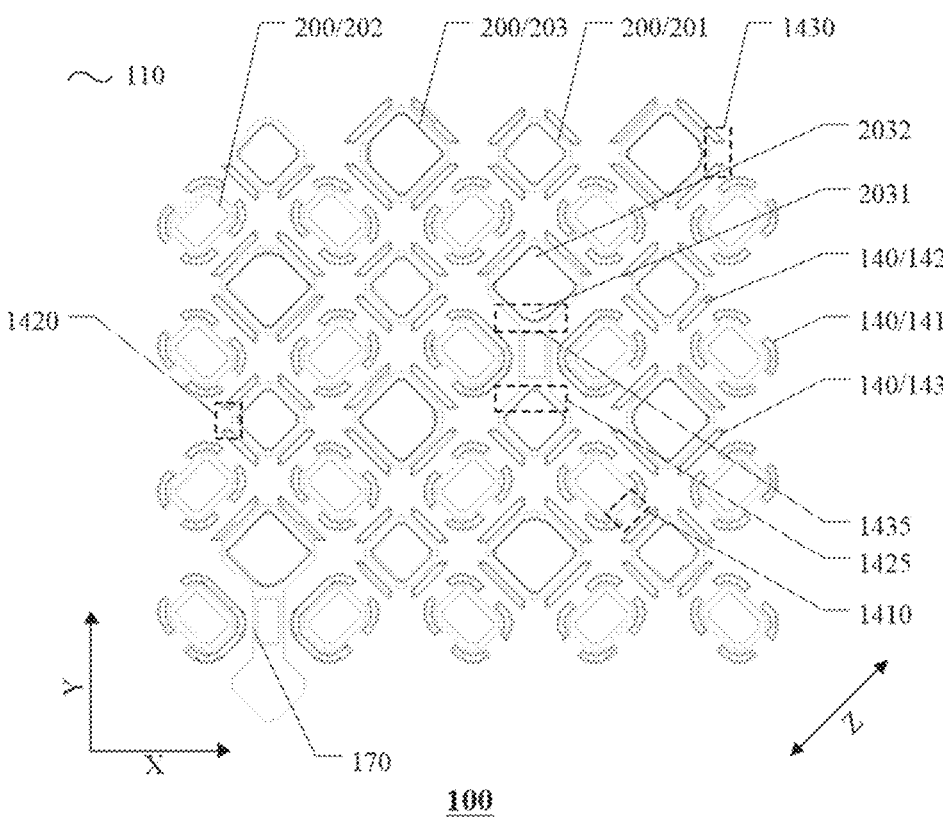
Figure 8:
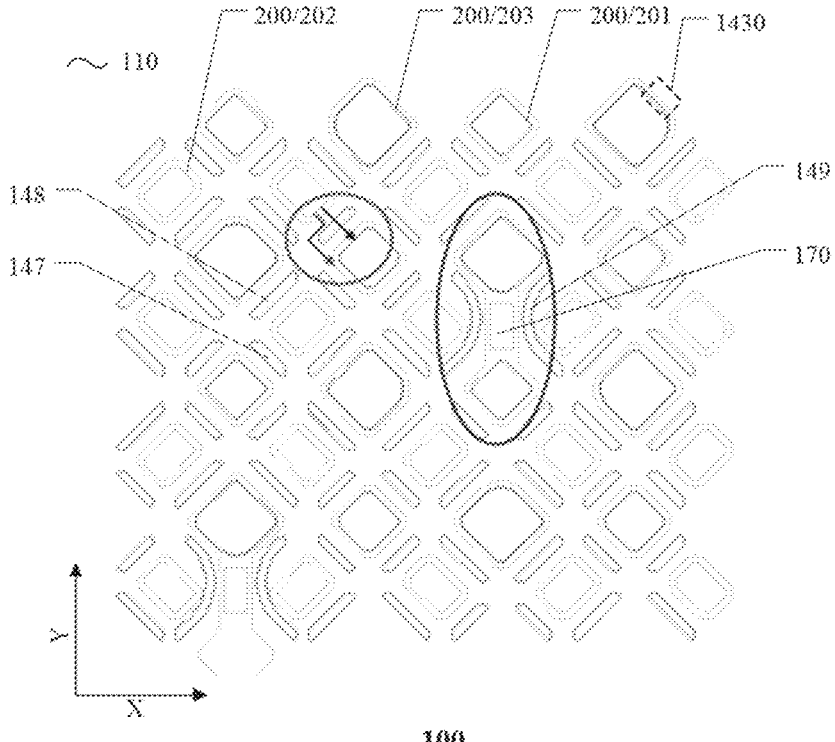
Figure 9:
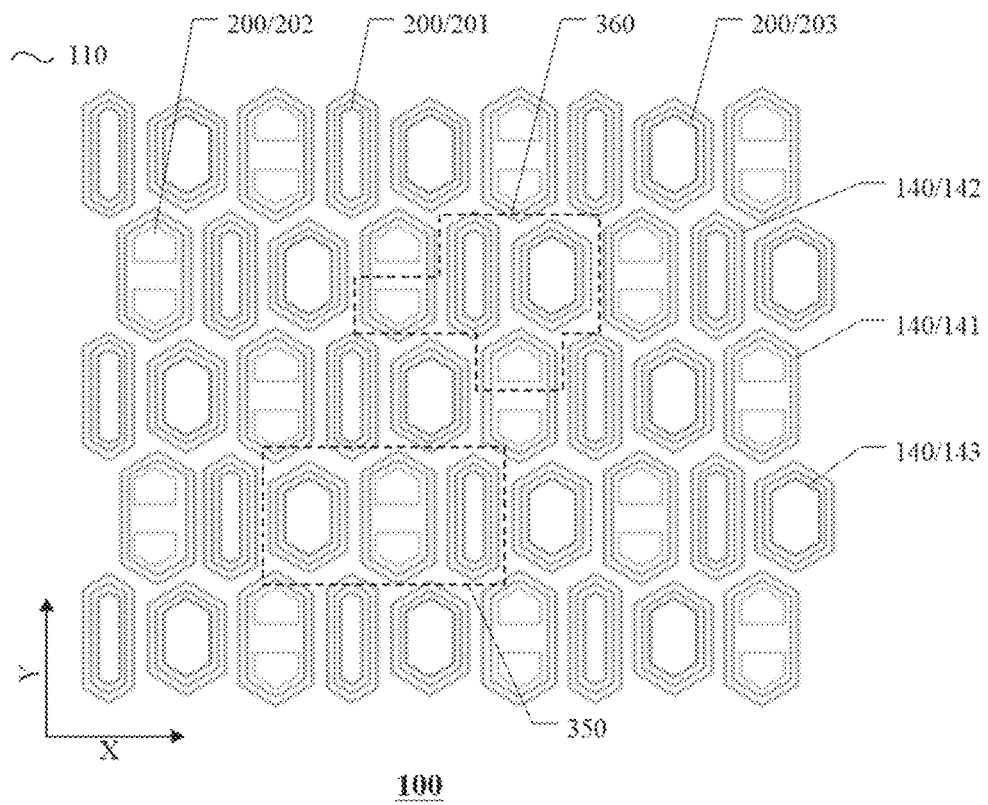
Figure 10:
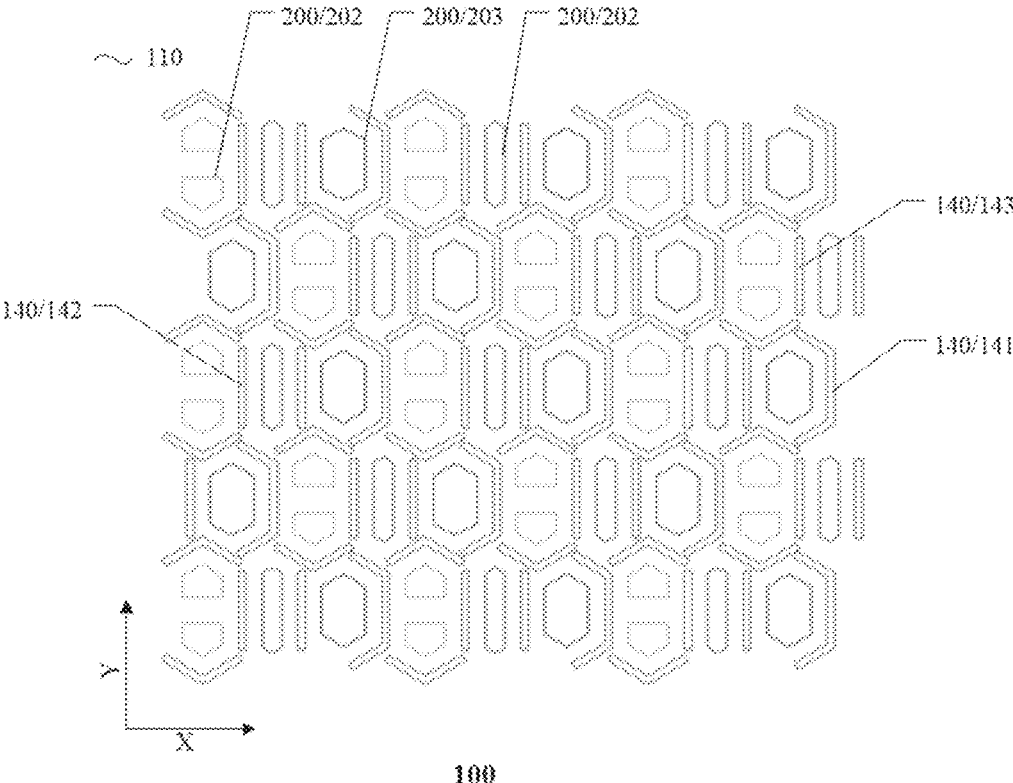
Figure 11:
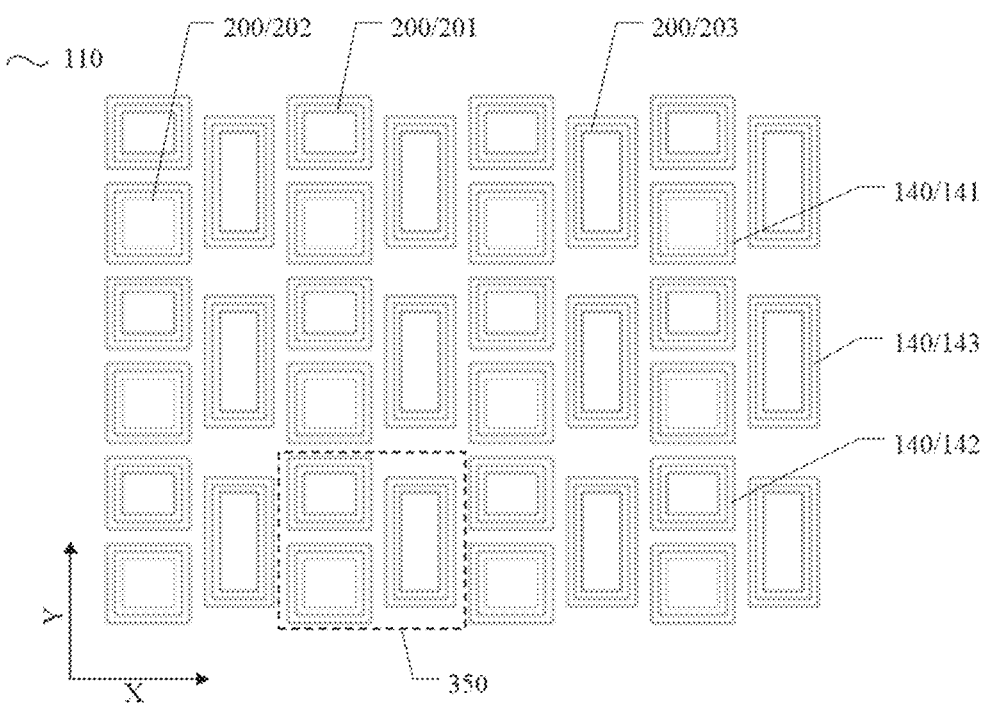
Figure 12:
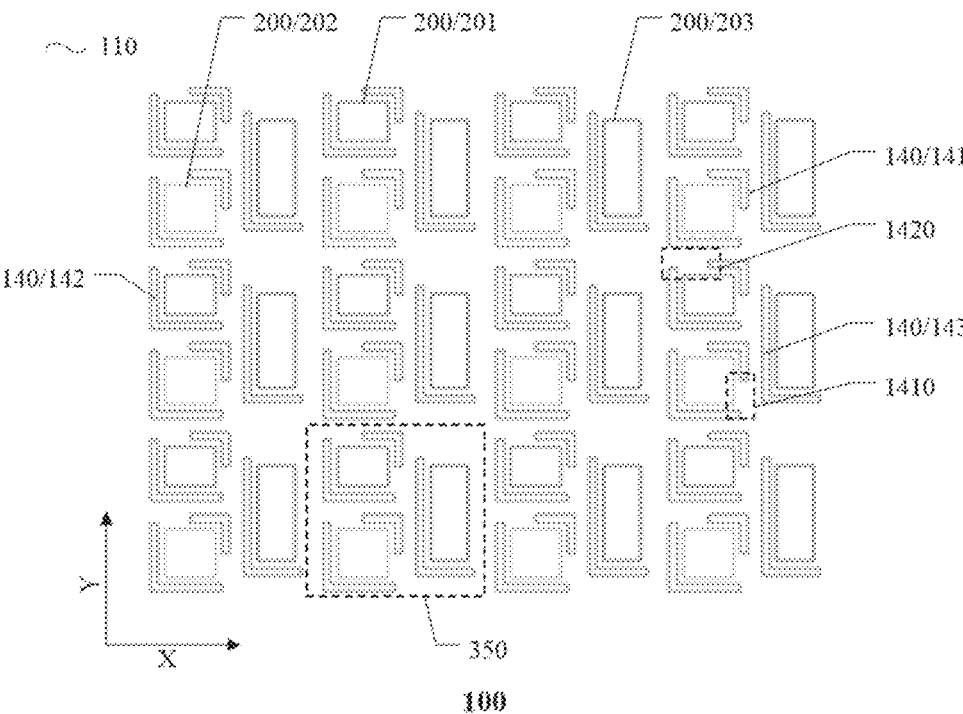
Figure 19:
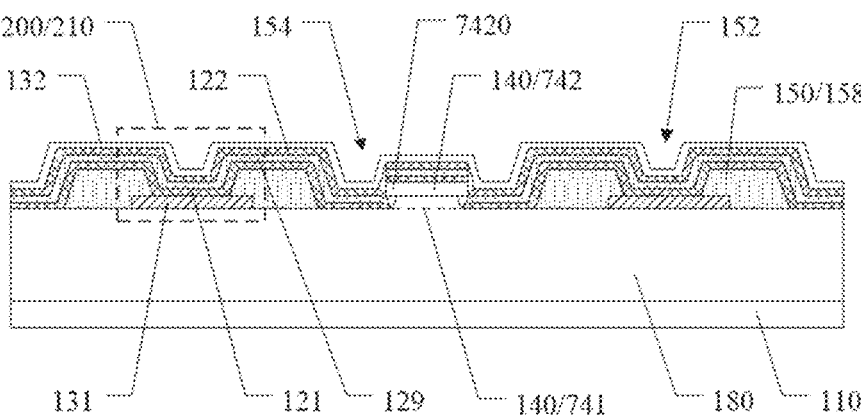
Figure 20:
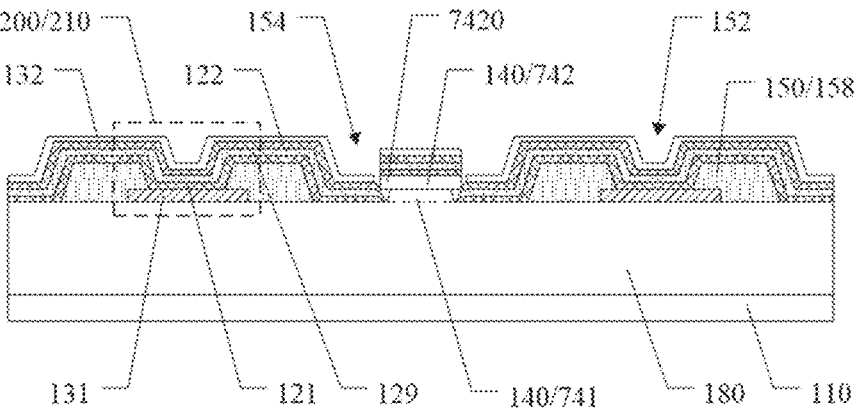
Figure 21A:
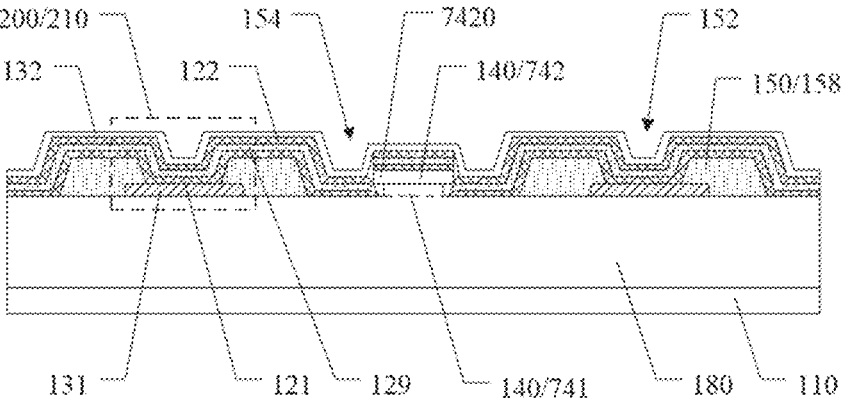
Figures 22D, 23, 24A, 24B:
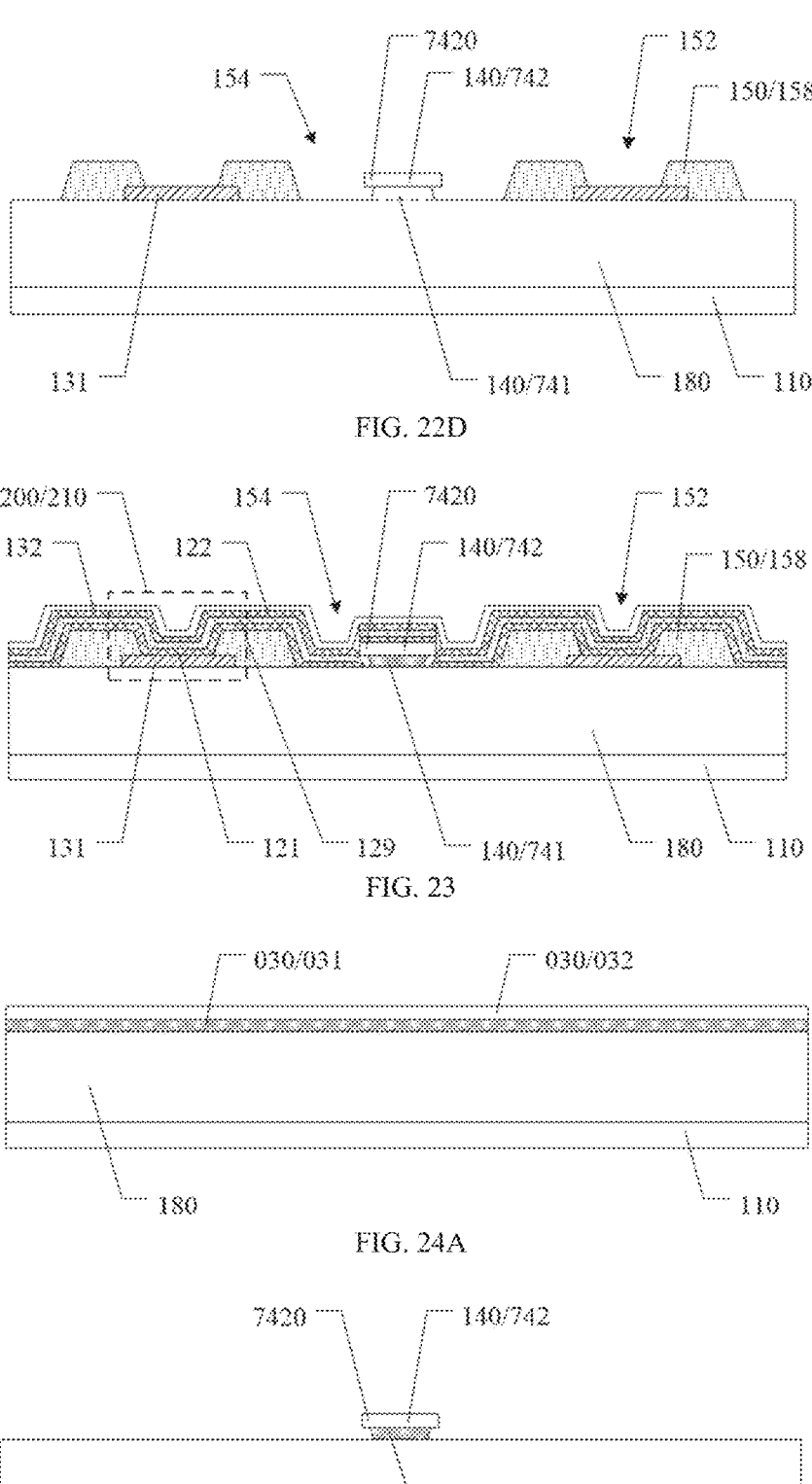

FIG. 6 is a schematic plan view of another display substrate provided by an embodiment of the present disclosure;

FIG. 7 is a schematic plan view of another display substrate provided by an embodiment of the present disclosure;

FIG. 8 is a schematic plan view of another display substrate provided by an embodiment of the present disclosure;

FIG. 9 is a schematic plan view of another display substrate provided by an embodiment of the present disclosure;

FIG. 10 is a schematic plan view of another display substrate provided by an embodiment of the present disclosure;

FIG. 11 is a schematic plan view of another display substrate provided by an embodiment of the present disclosure;

FIG. 12 is a schematic plan view of another display substrate provided by an embodiment of the present disclosure;

FIG. 13 is a schematic partial cross-sectional view of a display substrate provided by an embodiment of the present disclosure;

FIG. 14 is a schematic view of a display device provided by an embodiment of the present disclosure;

FIG. 15 is a schematic plan view of another display substrate provided by an embodiment of the present disclosure;

FIG. 16 is a schematic cross-sectional view of a display substrate along a line EF in FIG. 15 according to an embodiment of the present disclosure;

FIG. 17A is a schematic partial cross-sectional view of another display substrate provided by an embodiment of the present disclosure;

FIG. 17B is a cross-sectional electron microscope view of a display substrate provided by an embodiment of the present disclosure;

FIG. 18 is a schematic view of another display device provided by an embodiment of the present disclosure;

FIG. 19 is a schematic partial cross-sectional view of a display substrate provided by an embodiment of the present disclosure;

FIG. 20 is a schematic partial cross-sectional view of a display substrate provided according to another example of an embodiment of the present disclosure;

FIG. 21A is a schematic view illustrating a partial cross-sectional structure of a display substrate provided according to another example of an embodiment of the present disclosure;

FIG. 21B is a schematic view illustrating a partial cross-sectional structure of a display substrate provided according to another example of an embodiment of the present disclosure;

FIG. 22A to FIG. 22D are schematic views illustrating a manufacturing method flow of a display substrate before forming the display substrate shown in FIG. 19;

FIG. 23 is a schematic view illustrating a partial cross-sectional structure of a display substrate provided according to another example of an embodiment of the present disclosure;

FIG. 24A to FIG. 24D are schematic views illustrating a manufacturing method flow of a display substrate before forming the display substrate shown in FIG. 23;

6

Figures 24C, 24D, 25, 26:
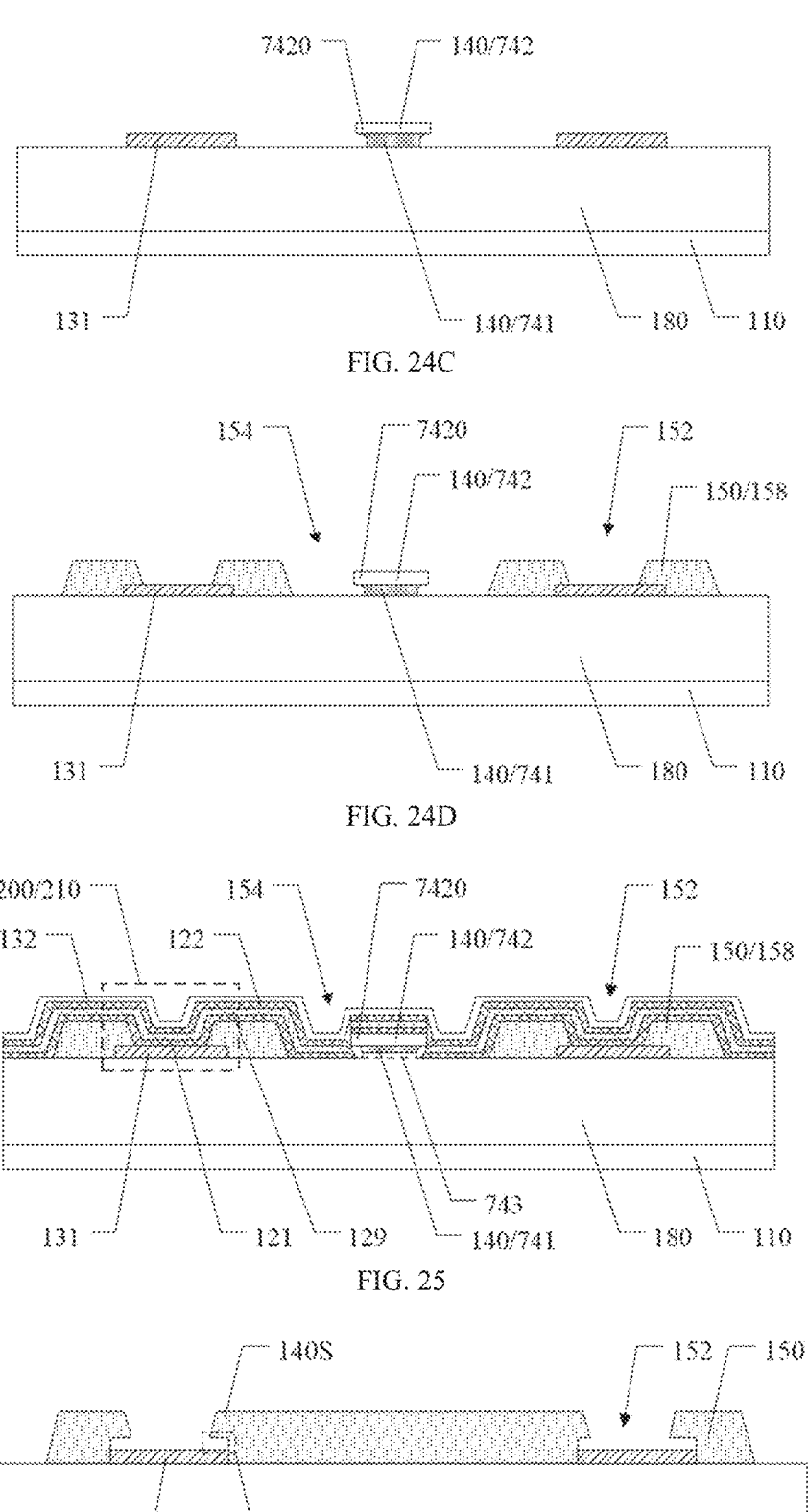
Figure 27:
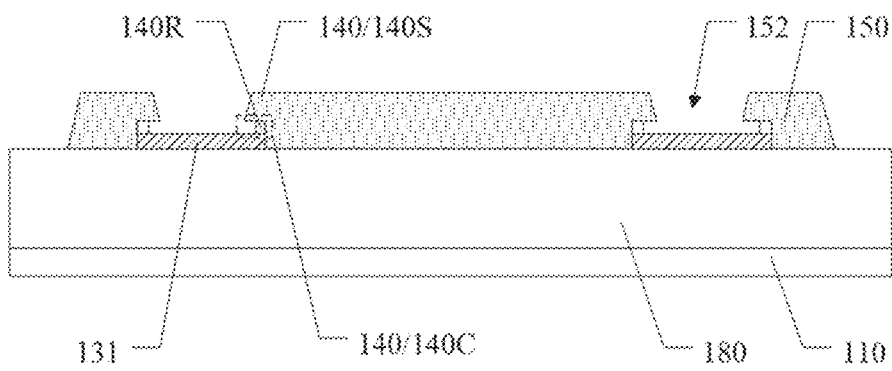
Figure 28:
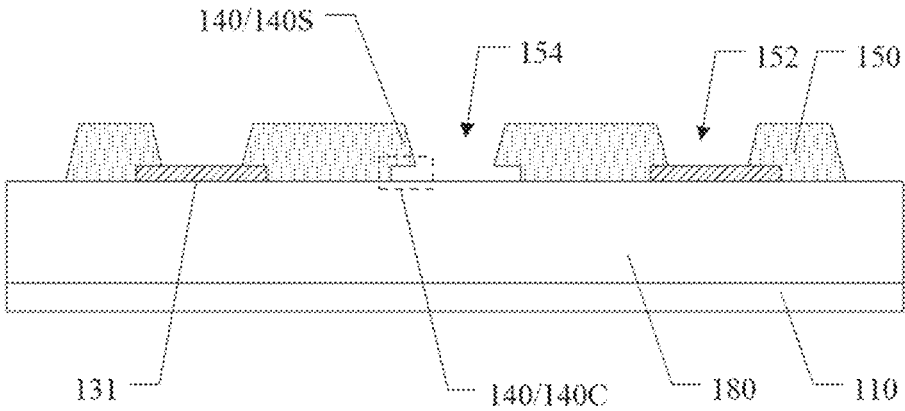
Figure 29:
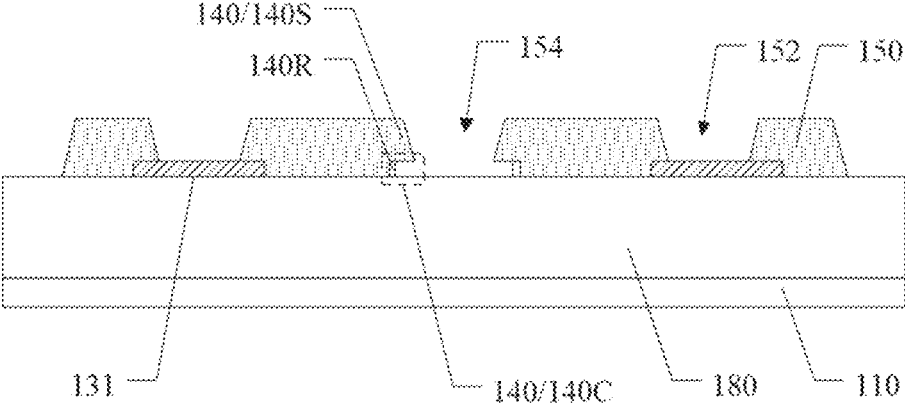
Figure 31B:
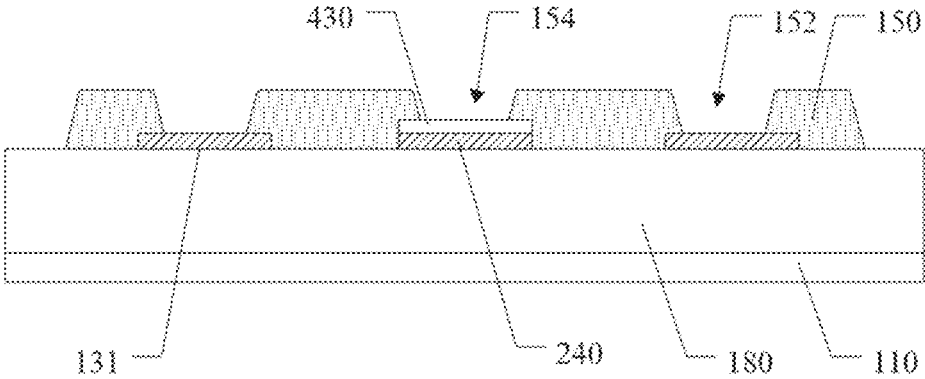
Figure 31C:
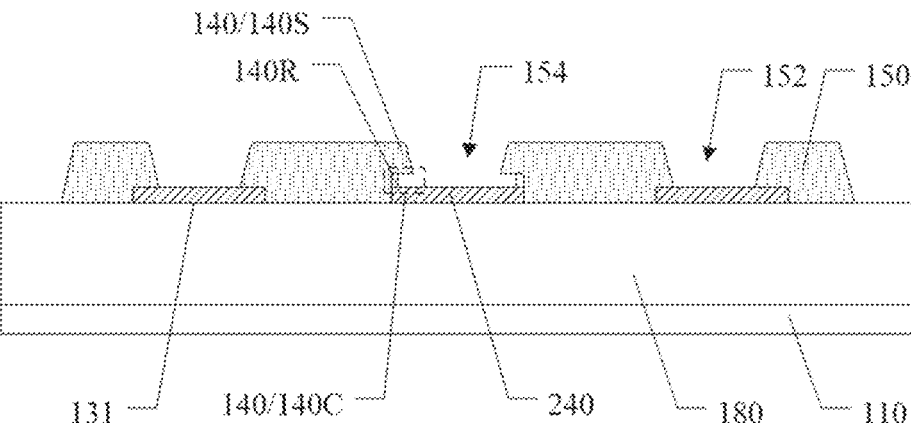

FIG. 25 is a schematic view illustrating a partial cross-sectional structure of a display substrate provided according to another example of an embodiment of the present disclosure;

FIG. 26 is a schematic structural view of another display substrate provided by an embodiment of the present disclosure;

FIG. 27 is a schematic structural view of another display substrate provided by an embodiment of the present disclosure;

FIG. 28 is a schematic structural view of another display substrate provided by an embodiment of the present disclosure;

FIG. 29 is a schematic structural view of another display substrate provided by an embodiment of the present disclosure;

FIG. 30A to FIG. 30C are schematic views illustrating steps of another method for manufacturing a display substrate provided by an embodiment of the present disclosure; and FIG. 31A to FIG. 31C are schematic views illustrating steps of another method for manufacturing a display substrate provided by an embodiment of the present disclosure.

DETAILED DESCRIPTION

In order to make the purpose, technical scheme and advantages of the embodiment of the present disclosure more clear, the technical scheme of the embodiments of the present disclosure will be clearly and completely described below in combination with the accompanying drawings of the embodiments of the present disclosure. Obviously, the described embodiments are part of the embodiments of the present disclosure, not all of the embodiments. Based on the described embodiments of the disclosure, all other embodiments obtained by those skilled in the art without creative labor fall within the scope of protection of the disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, quantity or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The terms "connect", "connected to each other", etc., are not intended to define a physical connection or mechanical connection, but may include an electrical connection, directly or indirectly.

The features "parallel", "perpendicular" and "same" used in the embodiments of the present disclosure all include features such as "parallel", "perpendicular" and "same" in the strict sense, and the cases having certain errors, such as "approximately parallel", "approximately perpendicular", "substantially the same" or the like, taking into account measurements and errors associated with the measurement of a particular quantity (e.g., limitations of the measurement system), and indicate being within an acceptable range of deviation for a particular value as determined by one of ordinary skill in the art. For example, "approximately" may indicate being within one or more standard deviations, or within 10% or 5% of the stated value. In the case that the quantity of a component is not specifically indicated below in the embodiments of the present disclosure, it means that the component may be one or more, or may be understood as at least one. "At least one" means one or more, and "plurality" means at least two. The "same layer" in the embodiments of the present disclosure refers to the relationship between a plurality of film layers formed of the same material through the same step (e.g., one-step patterning process). The "same layer" herein does not always mean that the plurality of film layers have the same thickness or that the plurality of film layers have the same height in cross-sectional view.

With the continuous development of display technology, people's pursuit of display quality is becoming higher and higher. In order to further reduce power consumption and achieve high brightness, a single-layer of light emitting layer in a light emitting element of an OLED can be replaced by two light emitting layers, and a charge generation layer (CGL) is added between the double-layer light emitting layers to achieve a tandem light emitting (Tandem EL) design. Since a display device designed with Tandem EL design has two light emitting layers, luminous brightness thereof can be approximately equivalent to twice that of a single light emitting layer. Therefore, the display device adopting the Tandem EL design has the advantages of long life, low power consumption, and high brightness.

However, the inventors of the present application have noticed that, for high-resolution products, since the charge generation layer has relatively strong conductivity, and the light emitting functional layers (which refer to film layers including two light emitting layers and a charge generation layer) of adjacent sub-pixels are connected, the charge generation layer is easy to cause crosstalk between adjacent sub-pixels, which seriously affects the display quality.

In this regard, the embodiments of the present disclosure provide a display substrate and a display device. The display substrate includes a base substrate, a plurality of sub-pixels and an isolation structure; the plurality of sub-pixels are located on the base substrate, each sub-pixel includes a light emitting element, and the light emitting element includes a light emitting functional layer, and a first electrode and a second electrode located on two sides of the light emitting functional layer, the first electrode is located between the light emitting functional layer and the base substrate, and the light emitting functional layer includes a charge generation layer; the isolation structure is located on the base substrate, the isolation structure is located between adjacent sub-pixels, and the charge generation layer in the light emitting functional layer is disconnected at the position where the isolation structure is located. Therefore, in the display substrate, through disposing the isolation structure between adjacent sub-pixels, and disconnecting the charge generation layer in the light emitting functional layer at the position where the isolation structure is located, crosstalk between adjacent sub-pixels due to the charge generation layer with high conductivity can be avoided.

A display substrate and a method of manufacturing the same, and a display device provided by the embodiments of the present disclosure will be described in detail below with reference to the accompanying drawings.

Figure 1:
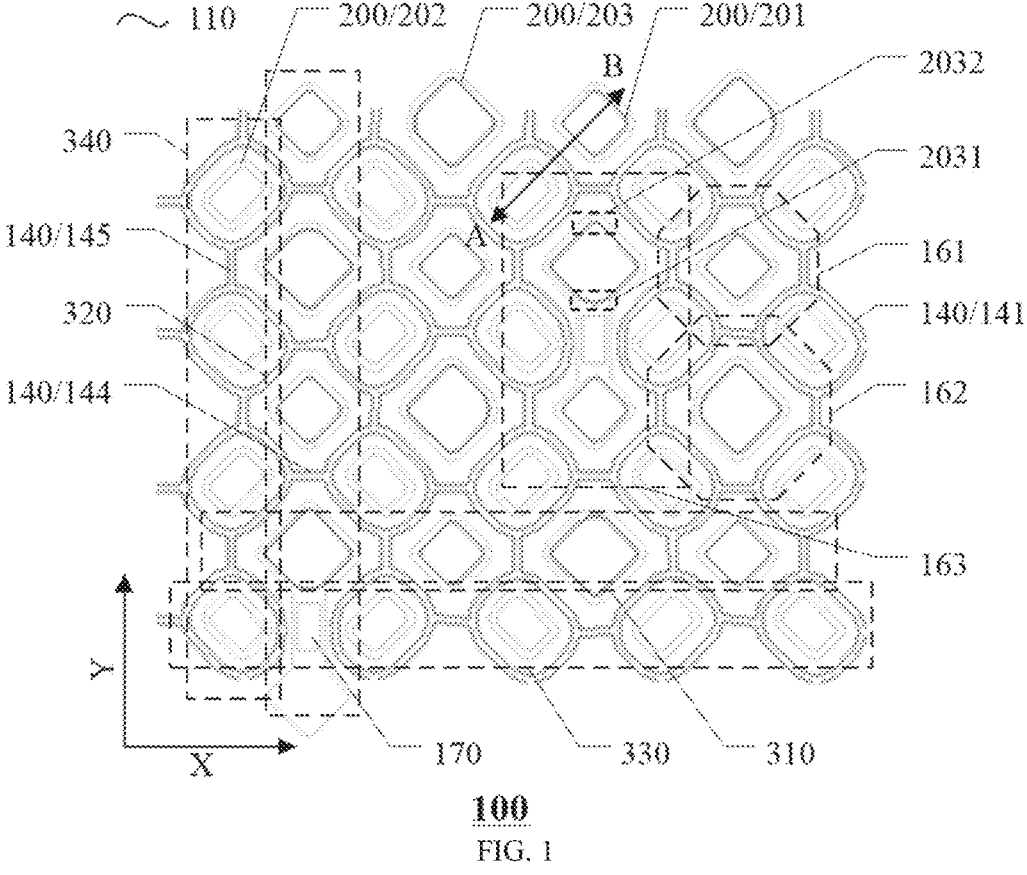
FIG. 1 is a schematic plan view of a display substrate provided by an embodiment of the present disclosure.
Figure 2:
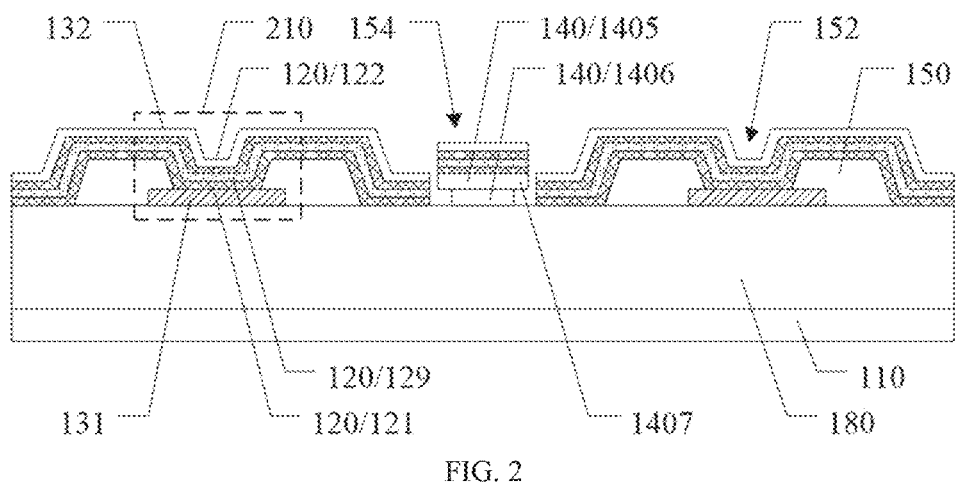
FIG. 2 is a schematic cross-sectional view of a display substrate along an AB direction in FIG. 1 according to an embodiment of the present disclosure.

An embodiment of the disclosure provides a display substrate. FIG. 1 is a schematic plan view of a display substrate provided by an embodiment of the present disclosure; FIG. 2 is a schematic cross-sectional view along the direction AB in FIG. 1 illustrating a display substrate provided by an embodiment of the present disclosure.

As illustrated in FIG. 1 and FIG. 2, the display substrate 100 includes a base substrate 110 and a plurality of sub-pixels 200; the plurality of sub-pixels 200 are located on the base substrate 110, and each sub-pixel 200 includes a light emitting element 210; each light emitting element 210 includes a light emitting functional layer 120, and a first electrode 131 and a second electrode 132 located on two sides of the light emitting functional layer 120, the first electrode 131 is located between the light emitting functional layer 120 and the base substrate 110; the second electrode 132 is at least partially located on a side of the light emitting functional layer 120 away from the first electrode 131; that is to say, the first electrode 131 and the second electrode 132 are located on two sides of the light emitting functional layer 120 in a direction perpendicular to the light emitting functional layer 120. The light emitting functional layer 120 includes a plurality of sub-functional layers, and the plurality of sub-functional layers include a conductive sub-layer 129 with relatively high conductivity. It should be noted that, the above-mentioned light emitting functional layer does not only include a film layer that directly emit light, but also includes functional film layer(s) used to assist light emission, such as a hole transport layer, an electron transport layer, or the like.

For example, the conductive sub-layer 129 may be a charge generation layer. For example, the first electrode 131 may be an anode, and the second electrode 132 may be a cathode. For example, the cathode may be formed of a material with high conductivity and low work function; for example, the cathode may be made of a metal material. For example, the anode may be formed of a transparent conductive material with high work function.

As illustrated in FIG. 1 and FIG. 2, the display substrate 100 further includes an isolation structure 140, and the isolation structure 140 is located on the base substrate 110 and between adjacent sub-pixels 200; the charge generation layer 129 in the light emitting functional layer 120 is disconnected at the location where the isolation structure 140 is located. It should be noted that the charge generation layer in the light emitting functional layer has a discontinuous structure or a non-integrated structure at the disconnection position. In the display substrate provided by the embodiments of the present disclosure, through disposing the isolation structure between adjacent sub-pixels, and disconnecting the charge generation layer in the light emitting functional layer at the location of the isolation structure, crosstalk between adjacent sub-pixels due to the charge generation layer with high conductivity is avoided. On the other hand, since the display substrate can avoid crosstalk between adjacent sub-pixels through the isolation structure, the display substrate can increase pixel density while adopting a tandem EL design. Therefore, the display substrate can have the advantages of long life, low power consumption, high brightness, and high resolution.

In some examples, "adjacent sub-pixels" means two sub-pixels without other sub-pixels disposed therebetween.

In some examples, as illustrated in FIG. 1 and FIG. 2, a connection line connecting brightness centers of two adjacent sub-pixels 200 passes through the isolation structure 140. Since the dimension of the charge generation layer in the extension direction of the connection line is small, the resistance of the charge generation layer in the extension direction of the connection line is also small, and charges are easily transferred from one of the two adjacent sub-pixels to the other one of the two adjacent sub-pixels through the charge generation layer along the extension direction of the connection line. Therefore, the display substrate makes the connection line pass through the isolation structure, so that the isolation structure can effectively block the shortest transmission path of charges, thereby effectively avoiding crosstalk between adjacent sub-pixels. It should be noted that, the brightness center of each sub-pixel may be a geometric center of an effective light emitting region of the sub-pixel. Of course, the embodiments of the present disclosure include this but are not limited thereto, and the brightness center of each sub-pixel may also be the position where the maximum luminous brightness of the sub-pixel is located.

In some examples, as illustrated in FIG. 1 and FIG. 2, the display substrate 100 further includes a pixel definition layer 150 located on the base substrate 110; the pixel definition layer 150 is partially located on a side of the first electrode 131 away from the base substrate 110; the pixel definition layer 150 includes a plurality of pixel openings 152 and a pixel spacing opening 154; the plurality of pixel openings 152 are in one-to-one correspondence with the plurality of sub-pixels 200 to define the effective light emitting regions of the plurality of sub-pixels 200; the pixel opening 152 is configured to expose the first electrode 131 so that the first electrode 131 is in contact with the subsequently formed light emitting functional layer 120. The pixel spacing opening 154 is located between adjacent first electrodes 131, and at least part of the isolation structure 140 is located in the pixel spacing opening 154. As such, in the display substrate, the isolation structure can be avoided from being formed on the pixel definition layer, thereby avoiding increasing the thickness of the display substrate. Of course, the embodiments of the present disclosure include this but are not limited thereto, and the above-mentioned pixel definition layer may be not provided with the pixel spacing opening, and the isolation structure may be directly disposed on the pixel definition layer, or the pixel definition layer may be used to form the isolation structure.

For example, the material of the pixel definition layer may include an organic material such as polyimide, acrylic or polyethylene terephthalate.

In some examples, as illustrated in FIG. 2, the isolation structure 140 may be an isolation pillar; in this case, the isolation structure 140 includes a first isolation part 1405 and a second isolation part 1406 that are stacked, and the first isolation part 1405 is located on a side of the second isolation part 1406 close to the base substrate 110; the second isolation part 1406 has a protrusion part 1407 extending beyond the first isolation part 1405 in the arrangement direction of two adjacent sub-pixels 200, and the conductive sub-layer 129 of the light emitting functional layer 120 is disconnected at the protrusion part 1407. As such, the isolation structure can realize the disconnection of the conductive sub-layer of the light emitting functional layer. It should be noted that, the isolation structure provided by the embodiments of the present disclosure is not limited to the form of the above-mentioned isolation pillar, and the isolation structure can also adopt other structures that can realize the disconnection of the conductive sub-layer of the light emitting functional layer; in addition, the above-mentioned arrangement direction may be an extension direction of a connection line connecting brightness centers of two adjacent sub-pixels.

In some examples, as illustrated in FIG. 2, a plurality of sub-pixels 200 share the second electrode 132, and the second electrode 132 is disconnected at the position where the isolation structure 140 is located. However, the embodiments of the present disclosure include this but are not limited thereto, and the second electrode may not be disconnected at the position where the isolation structure is located.

In some examples, as illustrated in FIG. 2, the light emitting functional layer 120 includes a first light emitting layer 121 and a second light emitting layer 122 located on two sides of the conductive sub-layer 129 in a direction perpendicular to the base substrate 110, the conductive sub-layer 129 is a charge generation layer. As such, the display substrate can achieve a tandem EL design, and therefore has the advantages of long life, low power consumption, and high brightness.

In some examples, as illustrated in FIG. 2, the first light emitting layer 121 and the second light emitting layer 122 in the light emitting functional layer 120 are also disconnected at the position where the isolation structure 140 is located. However, the embodiments of the present disclosure include this but are not limited thereto. The first light emitting layer and the second light emitting layer in the light emitting functional layer may be not disconnected at the position where the isolation structure is located, but only the conductive sub-layer is disconnected at the position where the isolation structure is located.

In some examples, the conductivity of the conductive sub-layer 129 is greater than the conductivity of the first light emitting layer 121 and the conductivity of the second light emitting layer 122, and is less than the conductivity of the second electrode 132.

For example, as illustrated in FIG. 2, the first light emitting layer 121 is located on a side of the conductive sub-layer 129 close to the base substrate 110; the second light emitting layer 122 is located on a side of the conductive sub-layer 129 away from the base substrate 110.

It should be noted that, the light emitting functional layer may further include other sub-functional layers other than the conductive sub-layer, the first light emitting layer, and the second light emitting layer, such as a hole injection layer, a hole transport layer, an electron injection layer, and an electron transport layer.

For example, the materials of the first light emitting layer and the second light emitting layer may be selected from pyrene derivatives, anthracene derivatives, fluorene derivatives, perylene derivatives, styrylamine derivatives, metal complexes, and the like.

For example, the material of the hole injection layer may include an oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide.

For example, the material of the hole injection layer may also include an organic material, such as: hexacyanohexaazatriphenylene, 2,3,5,6-tetrafluoro-7,7,8,8-tetracyanoquinodimethane (F4TCNQ), 1, 2, 3-tris[(cyano)(4-cyano-2, 3,5,6-tetrafluorophenyl) methylene]cyclopropane.

For example, the material of the hole transport layer may include aromatic amines and dimethylfluorene or carbazole materials with hole transport properties, such as: 4,4'-bis[N-(1-naphthyl)-N-phenylamino]biphenyl (NPB), N,N'-bis(3-methylphenyl)-N, N'-diphenyl-[1, 1'-biphenyl]-4, 4'-diamine (TPD), 4-phenyl-4'-(9-phenylfluoren-9-yl) triphenylamine (BAFLP), 4,4'-bis[N-(9,9-dimethylfluorene-2-yl)-N-phenylamino]biphenyl (DFLDPBi), 4,4'-bis (9-carbazolyl) biphenyl (CBP), 9-phenyl-3-[4-(10-phenyl-9-anthryl)phenyl]-9H-carbazole (PCzPA).

For example, the material of the electron transport layer may include an aromatic heterocyclic compound, such as: a benzimidazole derivative, an imidazole derivative, a pyrimidine derivative, a zine derivative, a quinoline derivative, an isoquinoline derivative, a phenanthroline derivative, or the like.

For example, the material of the electron injection layer may be alkali metal, metal or a compound thereof, such as lithium fluoride (LiF), ytterbium (Yb), magnesium (Mg), calcium (Ca).

In some examples, the first electrode 131 may be made of a metal material, such as any one or more of magnesium (Mg), silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may be a single-layer structure, or a multi-layer composite structure, such as Ti/Al/Ti, etc., or, a stacked structure formed of metal(s) and transparent conductive material(s), such as reflective materials such as ITO/Ag/ITO, Mo/AlNd/ITO, etc.

In some examples, the second electrode 132 may use any one or more of magnesium (Mg), silver (Ag), aluminum (Al), or an alloy made of any one or more of the above metals, or use a transparent conductive material, such as indium tin oxide (ITO), or a multi-layer composite structure of metal and transparent conductive materials.

In some examples, the charge generation layer 129 may be configured to generate carriers, transport carriers, and inject carriers. For example, the material of the charge generation layer 129 may include n-type doped organic layer/inorganic metal oxide, such as $Alq_3:Mg/WO_3$, Bphen: $Li/MoO_3$, $BCP:Li/V_2O_5$ and $BCP:Cs/V_2O_5$; or, n-type doped organic layer/organic layer, such as Alq3:Li/HAT-CN; or, n-type doped organic layer/p-type doped organic layer, such as $BPhen:Cs/NPB:F4-TCNQ$, $Alq_3:Li/NPB:FeCl_3$, $TPBi:Li/NPB:FeCl_3$ and $Alq_3:Mg/m-MTDATA:F4-TCNQ$; or, non-doped type, such as $F_{16}CuPc/CuPc$ and $Al/WO_3/Au$.

In some examples, the material of the base substrate 110 may be made of one or more materials of glass, polyimide, polycarbonate, polyacrylate, polyetherimide, and polyethersulfone, the embodiments include these materials but are not limited thereto.

In some examples, the base substrate may be a rigid substrate or a flexible substrate; in the case that the base substrate is a flexible substrate, the base substrate may include a first flexible material layer, a first inorganic material layer, a semiconductor layer, a second flexible material layer and a second inorganic material layer that are sequentially stacked. The materials of the first flexible material layer and the second flexible material layer use materials such as polyimide (PI), polyethylene terephthalate (PET) or surface-treated polymer soft film. The materials of the first inorganic material layer and the second inorganic material layer use silicon nitride (SiNx) or silicon oxide (SiOx), etc., which are used to improve the water and oxygen resistance of the base substrate. The first inorganic material layer, the second inorganic material layer may be also referred to as barrier layers. The material of the semiconductor layer use amorphous silicon (a-si).

For example, taking the base substrate being a laminate structure PI1/Barrier1/a-si/PI2/Barrier2 as an example, the forming process of the base substrate includes: firstly, a layer of polyimide is coated on a glass carrier, and cured to form a film serving as the first flexible (PI1) layer; then, a layer of barrier film is deposited on the first flexible layer to form the first barrier (Barrier1) layer covering the first flexible layer; thereafter, a layer of amorphous silicon (a-si) film is deposited on the first barrier layer to form an amorphous silicon (a-si) layer covering the first barrier layer; thereafter, a layer of polyimide is coated on the amorphous silicon layer, and cured to formed a film serving as the second flexible (PI2) layer; thereafter, a layer of barrier film is deposited on the second flexible layer to form a second barrier (Barrier2) layer covering the second flexible layer, thereby finally completing the formation of the base substrate.

In some examples, as illustrated in FIG. 1, the plurality of sub-pixels 200 include a plurality of first color sub-pixels 201, a plurality of second color sub-pixels 202, and a plurality of third color sub-pixels 203; the isolation structure 140 includes a plurality of first ring-shaped isolation parts 141, the first ring-shaped isolation part 141 is disposed to surround at least one second color sub-pixel 202. As such, the charge generation layer 129 in the light emitting functional layer 120 can be disconnected at the first ring-shaped isolation part 141, and the first ring-shaped isolation part 141 can separate the second color sub-pixel 202 from other sub-pixels, thereby avoiding crosstalk between the second color sub-pixel and adjacent sub-pixels. It should be noted that, although the first ring-shaped isolation part shown in FIG. 2 is arranged around only one second color sub-pixel, the embodiments of the present disclosure include but are not limited thereto, the first ring-shaped isolation part may also surround two or more second color sub-pixels.

For example, as illustrated in FIG. 1, the first ring-shaped isolation part 141 is arranged around one second color sub-pixel 202. As such, the charge generation layer 129 in the light emitting functional layer 120 can be disconnected at the first ring-shaped isolation parts 141, and each second color sub-pixel 202 can be separated from other sub-pixels by the first ring-shaped isolation part 141.

For example, as illustrated in FIG. 1, in the display substrate 100, a number of the second color sub-pixels 202 is greater than a number of the first color sub-pixels 201; or, the number of the second color sub-pixels 202 is greater than a number of the third color sub-pixels 203; or, the number of the second color sub-pixels 202 is greater than the number of the first color sub-pixels 201 and the number of the third color sub-pixels 203. Therefore, through disposing the first ring-shaped isolation parts 141 outside the second color sub-pixels 202, most of the adjacent sub-pixels on the display substrate can be separated, thereby effectively avoiding crosstalk between adjacent sub-pixels.

For example, as illustrated in FIG. 1, in the display substrate 100, the number of the second color sub-pixels 202 is approximately twice the number of the first color sub-pixels 201 or twice the number of the third color sub-pixels 203.

In some examples, as illustrated in FIG. 1, the isolation structure 140 further includes a plurality of first strip-shaped isolation parts 144 and a plurality of second strip-shaped isolation parts 145; the first strip-shaped isolation parts 144 extend along a first direction, and the second strip-shaped isolation parts 145 extend along a second direction; the first strip-shaped isolation part 144 connects two first ring-shaped isolation parts 141 that are adjacent in the first direction to each other, and the second strip-shaped isolation part 145 connects two first ring-shaped isolation parts 141 that are adjacent in the second direction to each other. A plurality of first strip-shaped isolation parts 144 and a plurality of second strip-shaped isolation parts 145 connect the plurality of first ring-shaped isolation parts 141 to form a plurality of first grid structures 161 and a plurality of second grid structures 162 in the regions outside the plurality of first ring-shaped isolation parts 141. The first grid structure 161 is disposed to surround one first color sub-pixel 201, and the second grid structure 162 is disposed to surround one third color sub-pixel 203. As such, the first strip-shaped isolation part can separate the first color sub-pixel and the third color sub-pixel that are adjacent in the second direction, so that the charge generation layer in the light emitting functional layer is disconnected at the position where the first strip-shaped isolation part is located, thereby effectively avoiding crosstalk between the first color sub-pixel and the third color sub-pixel that are adjacent in the second direction; the second strip-shaped isolation part can separate the first color sub-pixel and the third color sub-pixel that are adjacent in the first direction, so that the charge generation layer in the light emitting functional layer is disconnected at the position where the second strip-shaped isolation part is located, thereby effectively avoiding cross-talk between the first color sub-pixel and the third color sub-pixel that are adjacent in the first direction.

For example, the first direction intersects with the second direction, for example, the first direction and the second direction are perpendicular to each other.

In some examples, as illustrated in FIG. 1, the display substrate 100 further includes spacers 170; a plurality of first strip-shaped isolation parts 144 and a plurality of second strip-shaped isolation parts 145 connects a plurality first ring-shaped isolation parts 141 to each other and further form a plurality of third grid structures 163, and the third grid structure 163 is disposed to surround one first color sub-pixel 201 and one third color sub-pixel 203 that are adjacent to each other; the spacer 170 is located within the third grid structure 163, and between the first color sub-pixel 201 and the third color sub-pixel 203. As such, in the case that the space within the first grid structure and the second grid structure is not enough to place the spacer, the above-mentioned third grid structure can provide enough space for the spacer; in addition, because the spacer has a certain height and is located between the first color sub-pixel and the third color sub-pixel in the third grid structure, the spacer can also prevent crosstalk between the first color sub-pixel and the third color sub-pixel in the third grid structure. It should be noted that, the spacers are used to support an evaporation mask for forming the above-mentioned light emitting layer.

In some examples, as illustrated in FIG. 1, a plurality of first color sub-pixels 201 and a plurality of third color sub-pixels 203 are alternately arranged along the first direction and the second direction to form a plurality of first pixel rows 310 and a plurality of first pixel columns 320, a plurality of second color sub-pixels 202 are arranged in an array along the first direction and the second direction to form a plurality of second pixel rows 330 and a plurality of second pixel columns 340, the plurality of first pixel rows 310 and the plurality of second pixel rows 330 are alternately arranged along the second direction and staggered from each other in the first direction, and the plurality of first pixel columns 320 and the plurality of second pixel columns 340 are alternately arranged along the first direction and staggered from each other in the second direction. The isolation structure 140 is located between the adjacent first color sub-pixel 201 and third color sub-pixel 203, and/or, the isolation structure 140 is located between the adjacent second color sub-pixel 202 and third color sub-pixel 203, and/or, the isolation structure 140 is located between the adjacent first color sub-pixel 201 and second color sub-pixel 202.

In some examples, the luminous efficiency of the third color sub-pixel is smaller than the luminous efficiency of the second color sub-pixel.

For example, the first color sub-pixel 201 is configured to emit red light, the second color sub-pixel 202 is configured to emit green light, and the third color sub-pixel 203 is configured to emit blue light. Of course, the embodiments of the present disclosure include this but are not limited thereto.

In some examples, as illustrated in FIG. 1, a shape of an orthographic projection of an effective light emitting region of the first color sub-pixel 201 on the base substrate 110 includes a rounded rectangle; a shape of an orthographic projection of an effective light emitting region of the second color sub-pixel 202 on the base substrate 110 includes a rounded rectangle; a shape of an orthographic projection of an effective light emitting region of the third color sub-pixel 203 on the base substrate 110 includes a rounded rectangle. It should be noted that, the above-mentioned effective light emitting region may approximately be a region defined by the pixel opening corresponding to the sub-pixel.

In some examples, as illustrated in FIG. 1, the shape of the orthographic projection of the effective light emitting region of the third color sub-pixel 203 on the base substrate 110 includes a plurality of rounded corner parts, and the plurality of rounded corner parts includes a first rounded corner part 2031. The arc radius of the first rounded corner part 2031 is greater than the arc radiuses of other rounded corner parts. In this case, since the arc radius of the first rounded corner part 2031 is relatively large, the space occupied by the first rounded corner part 2031 is small, and the spacer 170 can be arranged near the first rounded corner part 2031, thereby fully utilizing the area on the display substrate to increase the pixel density. In this case, the first rounded corner part 2031 is the rounded corner part with the smallest distance from the first color sub-pixel 201 among the plurality of rounded corner parts of the third color sub-pixel 203.

In some examples, as illustrated in FIG. 1, an ortho-graphic projection of the spacer 170 on the base substrate 110 is located on the connection line connecting the mid-point of the first rounded corner part 2031 and the brightness center of the first color sub-pixel 201.

In some examples, as illustrated in FIG. 1, the shape of the orthographic projection of the effective light emitting region of the third color sub-pixel 203 on the base substrate 110 includes a plurality of rounded corner parts, and the plurality of rounded corner parts include a first rounded corner part 2031 and a second rounded corner part 2032, the arc radius of the first rounded corner part 2031 is greater than the arc radius of the second rounded corner part 2032; and the shape of the orthographic projection of the effective light emitting region of the third color sub-pixel 203 on the base substrate 110 is axisymmetric with respect to the connection line connecting the first rounded corner part 2031 and the second rounded corner part 2032.

Figure 3:
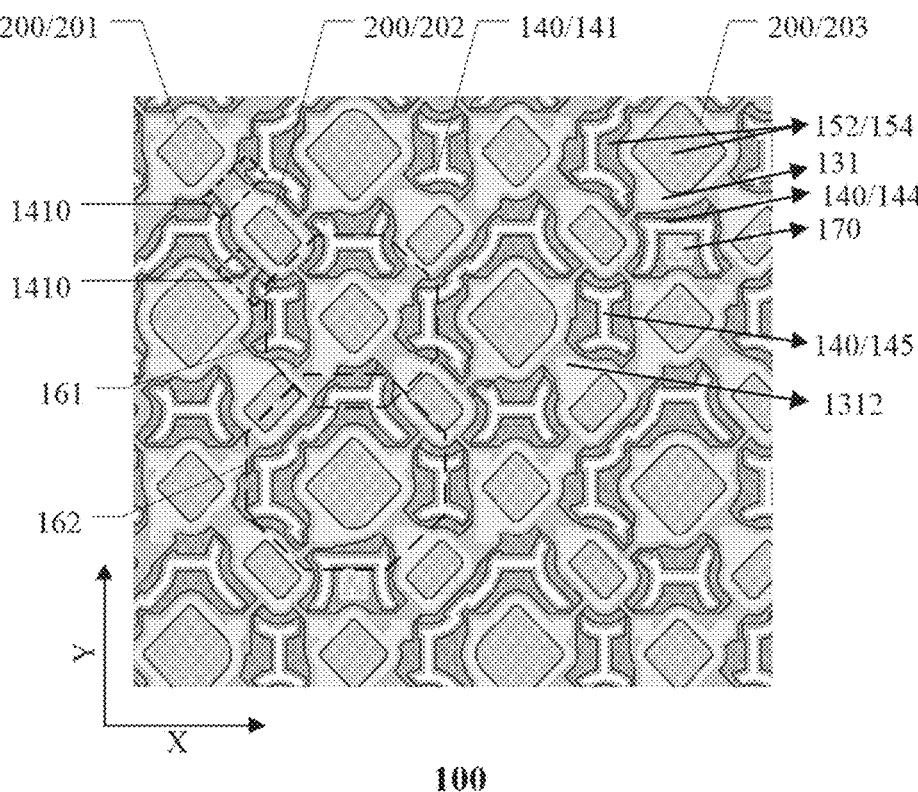
FIG. 3 is a schematic plan view of another display substrate provided by an embodiment of the present disclosure.

FIG. 3 is a schematic plan view of another display substrate provided by an embodiment of the present disclo-sure. As illustrated in FIG. 3, the first ring-shaped isolation part 141 includes at least one opening 1410. In the case where the first ring-shaped isolation part is disposed outside the second color sub-pixel, not only the charge generation layer in the light emitting functional layer breaks at the first ring-shaped isolation part, but also the second electrode on the light emitting functional layer may break at the position where the first ring-shaped isolation part is located, which may cause that the cathode signal cannot be transmitted to the second color sub-pixel. Therefore, through providing at least one opening on the first ring-shaped isolation part, the display substrate can prevent the first ring-shaped isolation part from completely isolating the second color sub-pixels, thereby avoiding the phenomenon that the cathode signal cannot be transmitted.

In some examples, as illustrated in FIG. 3, the second color sub-pixel 202 is surrounded by two first color sub-pixels 201 and two third color sub-pixels 203; in this case, the first ring-shaped isolation part 141 includes four openings 1410, which are respectively located between the second color sub-pixel 202 and the adjacent four sub-pixels 200. Therefore, through providing the above-mentioned openings, the second electrode or the cathode between the second color sub-pixel and the surrounding four sub-pixels would not be disconnected, thereby facilitating the transmission of the cathode signal. It should be noted that, although the first ring-shaped isolation part is disposed with the above-mentioned opening, due to the relatively small size of the opening, the resistance of the conductive sub-layer (such as the charge generation layer) at the position of the opening can be greatly increased, thereby effectively hindering the passage of electric current, and further effectively avoid crosstalk between adjacent sub-pixels. Moreover, since the conductivity of the second electrode is greater than that of the conductive sub-layer, and a plurality of sub-pixels share the second electrode, there exists a plurality of conductive channels, therefore, even if the size of the opening is relatively small, the transmission of cathode signal would not be hindered.

In some examples, as illustrated in FIG. 3, the first electrode 131 of the second color sub-pixel 202 includes an electrode connection part 1312, and an orthographic projection of the electrode connection part 1312 on the base substrate 110 is at least partially overlapped with an orthographic projection of the opening 1410 of the first ring-shaped isolation part 141 on the base substrate 110. As such, the display substrate can utilize the position where the opening of the first ring-shaped isolation part is located to dispose the electrode connection part, so that the layout of the sub-pixels can be more compact, and the pixel density can be increased. It should be noted that, the brightness center of each sub-pixel may be the geometric center of the effective light emitting region of the sub-pixel. Of course, the embodiments of the present disclosure include this but are not limited thereto, and the brightness center of each sub-pixel may also be the position where the maximum luminous brightness of the sub-pixel is located.

In some examples, as illustrated in FIG. 3, the first electrode 131 of the first color sub-pixel 201 also includes an electrode connection part 1312, and the first electrode 131 of the third color sub-pixel 203 also includes an electrode connection part 1312; orthographic projections of the electrode connection parts 1312 of the first color sub-pixel 201 and the third color sub-pixel 203 on the base substrate 110 are also at least partially overlapped with the orthographic projections of the openings 1410 of the first ring-shaped isolation parts 141 on the base substrate 110. As such, the display substrate can further use the position where the openings of the first ring-shaped isolation part is located to dispose the electrode connection parts of the first color sub-pixel and the third color sub-pixel, so that the layout of the sub-pixels can be more compact, and the pixel density can be improved.

In some examples, as illustrated in FIG. 3, the isolation structure 140 further includes a plurality of first strip-shaped isolation parts 144 and a plurality of second strip-shaped isolation parts 145; the first strip-shaped isolation part 144 extends along the first direction, and the second strip-shaped isolation part 145 extends along the second direction; the first strip-shaped isolation part 144 connects two first ring-shaped isolation parts 141 that are adjacent in the first direction to each other, and the second strip-shaped isolation part 145 connects two first ring-shaped isolation parts 141 that are adjacent in the second direction to each other. A plurality of first strip-shaped isolation parts 144 and a plurality of second strip-shaped isolation parts 145 connect a plurality of first ring-shaped isolation parts 141 to each other, so as to form a plurality of first grid structures 161 and a plurality of second grid structures 162 in the regions outside the plurality of first ring-shaped isolation parts 141. The first grid structure 161 is disposed to surround one first color sub-pixel 201, and the second grid structure 162 is disposed to surround one third color sub-pixel 203. As such, the first strip-shaped isolation part can separate the first color sub-pixel and the third color sub-pixel that are adjacent in the second direction, so that the charge generation layer in the light emitting functional layer is disconnected at the position where the first strip-shaped isolation part is located, thereby effectively avoiding crosstalk between the first color sub-pixel and the third color sub-pixel that are adjacent in the second direction; the second strip-shaped isolation part can separate the first color sub-pixel and the third color sub-pixel that are adjacent in the first direction, so that the charge generation layer in the light emitting functional layer is disconnected at the position where the second strip-shaped isolation part is located, thereby effectively avoiding crosstalk between the first color sub-pixel and the third color sub-pixel that are adjacent in the first direction.

For example, the first direction intersects with the second direction, for example, the first direction and the second direction are perpendicular to each other.

In some examples, as illustrated in FIG. 3, the openings 1410 of the first ring-shaped isolation parts 141 also serve as the openings of the first grid structures 161 and the openings of the second grid structures 162. As such, the second electrode of the first color sub-pixel 201 located in the first grid structure 161 and the second electrode of the third color sub-pixel 203 located in the second grid structure 162 would not be completely disconnected, thereby facilitating the transmission of the cathode signal.

In some examples, as illustrated in FIG. 3, the display substrate 100 further includes a spacer 170; the spacer 170 is located within the first grid structure 161, and between the first color sub-pixel 201 and the third color sub-pixel 203. In the case where the space in the first grid structure is enough to place the spacer, the spacer can be directly placed in the first grid structure. It should be noted that, the embodiments of the present disclosure include this but are not limited thereto, and the spacer may also be located within the second grid structure; in addition, the above-mentioned "within the grid structure" refers to being within the space surrounded by the grid structure, instead of being inside the grid structure itself.

Figure 4:
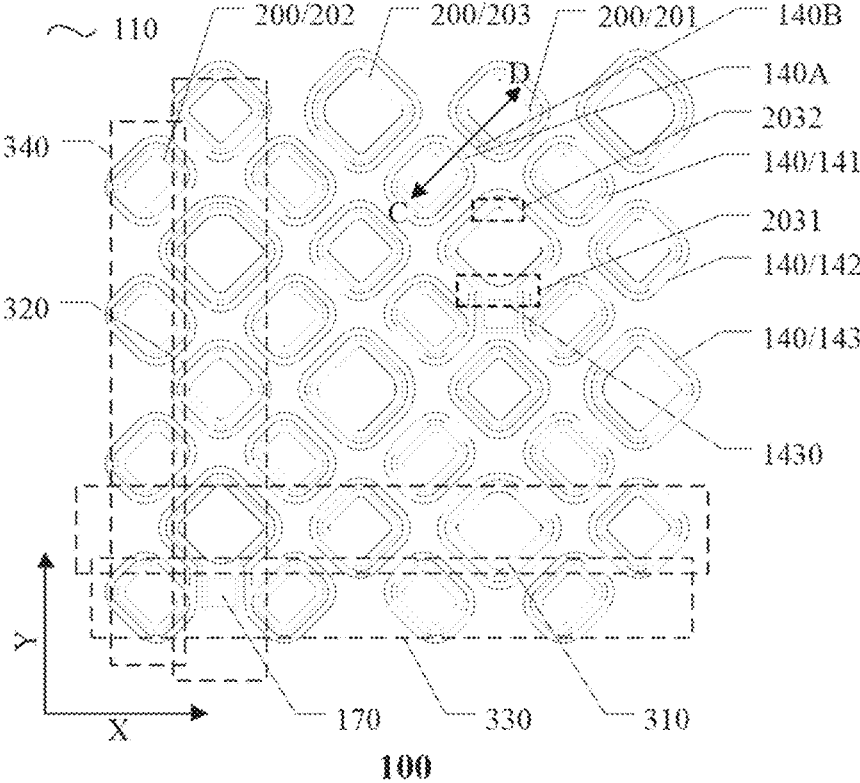
FIG. 4 is a schematic plan view of another display substrate provided by an embodiment of the present disclosure.

FIG. 4 is a schematic plan view of another display substrate provided by an embodiment of the present disclosure. As illustrated in FIG. 4, a plurality of sub-pixels 200 includes a plurality of first color sub-pixels 201, a plurality of second color sub-pixels 202 and a plurality of third color sub-pixels 203; the isolation structure 140 includes a plurality of first ring-shaped isolation parts 141, a plurality of second ring-shaped isolation parts 142 and a plurality of third ring-shaped isolation parts 143; the first ring-shaped isolation part 141 is disposed to surround one of the plurality of second color sub-pixels 202; the second ring-shaped isolation part 142 is disposed to surround one of the plurality of first color sub-pixels 201; each third ring-shaped isolation part 143 is disposed to surround one of the plurality of third color sub-pixels 203.

In the display substrate shown in FIG. 4, the charge generation layer 129 in the light emitting functional layer 120 may be disconnected at the first ring-shaped isolation part 141, the second ring-shaped isolation part 142 and the third ring-shaped isolation part 143. The first ring-shaped isolation part 141 can separate the second color sub-pixel 202 from other sub-pixels, thereby avoiding crosstalk between the second color sub-pixel and adjacent sub-pixels; the second ring-shaped isolation part 142 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the second color sub-pixel and adjacent sub-pixels.

Figure 5:
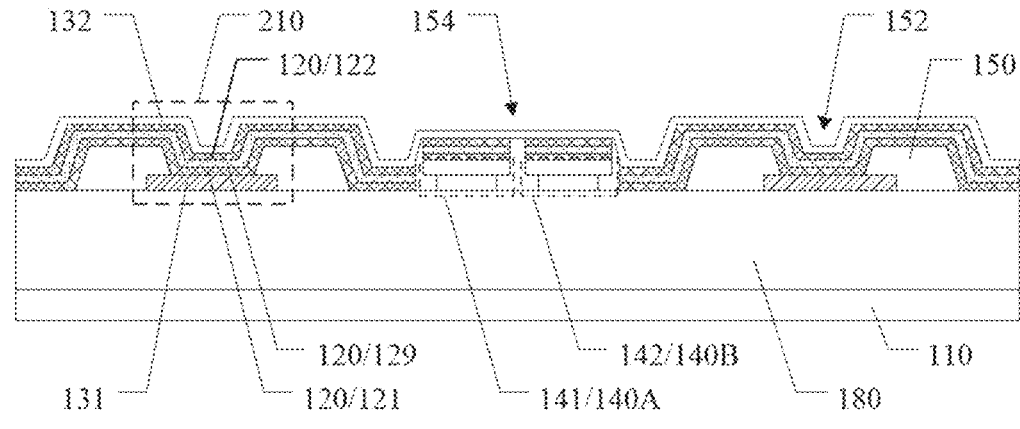
FIG. 5 is a schematic cross-sectional view of a display substrate along a CD direction in FIG. 4 according to an embodiment of the present disclosure.

FIG. 5 is a schematic cross-sectional view along the CD direction in FIG. 4, illustrating a display substrate according to an embodiment of the present disclosure. As illustrated in FIG. 5, the isolation structure 140 between the first color sub-pixel 201 and the second color sub-pixel 202 includes a portion of the first ring-shaped isolation part 141 and a portion of the second ring-shaped isolation part 142; in this case, a portion of the first ring-shaped isolation part 141 may be used as a first sub-isolation structure 140A of the isolation structure 140, and a portion of the second ring-shaped isolation part 142 may be used as a second sub-isolation structure 140B of the isolation structure 140. The first sub-isolation structure 140A and the second sub-isolation structure 140B are sequentially disposed in the arrangement direction of the adjacent sub-pixels 200. In the case that the charge generation layer in the light emitting functional layer is not disconnected or not completely disconnected at the position where the first sub-isolation structure is located, the charge generation layer in the light emitting functional layer can be disconnected at the position where the second sub-isolation structure is located. Therefore, through sequentially disposing the first sub-isolation structure and the second sub-isolation structure in the arrangement direction of the adjacent sub-pixels, the display substrate can better disconnect the charge generation layer in the light emitting functional layer at the position where the isolation structure is located, thereby further avoiding crosstalk between adjacent sub-pixels due to the charge generation layer with high conductivity. Of course, the embodiments of the present disclosure include this but are not limited thereto. In the case that the spacing distance between adjacent sub-pixels is relatively small, only one sub-isolation structure may be provided.

In some examples, as illustrated in FIG. 4, both the first ring-shaped isolation part 141 and the second ring-shaped isolation part 142 are complete ring-shaped structures without openings; while the third ring-shaped isolation part 143 includes an opening 1430, and two ends at the opening 1430 of the third ring-shaped isolation part 143 are respectively connected to two first ring-shaped isolation parts 141 adjacent thereto in the first direction or the second direction. Therefore, in the case where the pixel density of the display substrate is relatively high, and the isolation structure includes the above-mentioned first ring-shaped isolation parts, second ring-shaped isolation parts and third ring-shaped isolation parts, the spacing between adjacent ring-shaped isolation parts may be not enough to dispose a spacer; in this case, through disposing an opening in the third ring-shaped isolation part, the display substrate can be provided with a spacer at the position of the opening; moreover, due to the two ends at the opening of the third ring-shaped isolation part are respectively connected to two first ring-shaped isolation parts adjacent thereto in the first direction or the second direction, the display substrate can better avoid crosstalk between adjacent sub-pixels.

It should be noted that, although the third ring-shaped isolation part of the display substrate shown in FIG. 4 is provided with an opening, the embodiments of the present disclosure include this but are not limited thereto, and the third ring-shaped isolation part may also be a complete ring-shaped structure. In addition, in the case that the first ring-shaped isolation part, the second ring-shaped isolation part or the third ring-shaped isolation part is a complete ring-shaped structure, the conductive sub-layer in the light emitting functional layer can be disconnected at the position where the ring-shaped isolation structure is located through controlling the height, depth or other parameters of the ring-shaped isolation structure, while the second electrode is not disconnected at the position where the ring-shaped isolation structure is located.

In some examples, as illustrated in FIG. 4, a shape of an orthographic projection of an effective light emitting region of the first color sub-pixel 201 on the base substrate 110 includes a rounded rectangle; a shape of an orthographic projection of an effective light emitting region of the second color sub-pixel 202 on the base substrate 110 includes a rounded rectangle; a shape of an orthographic projection of an effective light emitting region of the third color sub-pixel 203 on the base substrate 110 includes a rounded rectangle.

In some examples, as illustrated in FIG. 4, the shape of the orthographic projection of the effective light emitting region of the third color sub-pixel 203 on the base substrate 110 includes a plurality of rounded corner parts, and the plurality of rounded corner parts includes a first rounded corner part 2031. The arc radius of the first rounded corner part 2031 is greater than the arc radiuses of other rounded corner parts. In this case, since the arc radius of the first rounded corner part 2031 is relatively large, the space occupied by the first rounded corner part 2031 is small, the opening 1430 of the third ring-shaped isolation part 143 can be disposed adjacent to the first rounded corner part 2031, and the spacer 170 can also be correspondingly disposed adjacent to the first rounded corner part 2031, thereby fully utilizing the area on the display substrate to increase the pixel density. In this case, the first rounded corner part 2031 is the rounded corner part with the smallest distance from the first color sub-pixel 201 among the plurality of rounded corner parts of the third color sub-pixel 203.

In some examples, as illustrated in FIG. 4, an orthographic projection of the spacer 170 on the base substrate 110 is located on the connection line connecting the midpoint of the first rounded corner part 2031 and the brightness center of the first color sub-pixel 201.

In some examples, as illustrated in FIG. 4, the shape of the orthographic projection of the effective light emitting region of the third color sub-pixel 203 on the base substrate 110 includes a plurality of rounded corner parts, and the plurality of rounded corner parts include a first rounded corner part 2031 and a second rounded corner part 2032, the arc radius of the first rounded corner part 2031 is greater than the arc radius of the second rounded corner part 2032; and the shape of the orthographic projection of the effective light emitting region of the third color sub-pixel 203 on the base substrate 110 is axisymmetric with respect to the connection line connecting the first rounded corner part 2031 and the second rounded corner part 2032.

In some examples, as illustrated in FIG. 4, the shape of the orthographic projection of the effective light emitting region of the first color sub-pixel 201 on the base substrate 110 also includes a plurality of rounded corner parts, and the arc radiuses of these rounded corner parts are equal.

In some examples, as illustrated in FIG. 4, the shape of the orthographic projection of the effective light emitting region of the second color sub-pixel 202 on the base substrate 110 also includes a plurality of rounded corner parts, and the arc radiuses of these rounded corner parts are equal.

In some examples, as illustrated in FIG. 4, an area of the orthographic projection of the effective light emitting region of the third color sub-pixel 203 on the base substrate 110 is larger than an area of the orthographic projection of the effective light emitting region of the first color sub-pixel 201 on the base substrate 110; the area of the orthographic projection of the effective light emitting region of the first color sub-pixel 201 on the base substrate 110 is larger than an area of the orthographic projection of the effective light emitting region of the second color sub-pixel 202 on the base substrate 110. Of course, the embodiments of the present disclosure include this but are not limited thereto, and the area of the effective light emitting region of each sub-pixel can be set according to actual needs.

In some examples, as illustrated in FIG. 4, a plurality of first color sub-pixels 201 and a plurality of third color sub-pixels 203 are alternately arranged along the first direction and the second direction to form a plurality of first pixel rows 310 and a plurality of first pixel columns 320, a plurality of second color sub-pixels 202 are arranged in an array along the first direction and the second direction to form a plurality of second pixel rows 330 and a plurality of second pixel columns 340, the plurality of first pixel rows 310 and the plurality of second pixel rows 330 are alternately arranged along the second direction and staggered from each other in the first direction, and the plurality of first pixel columns 320 and the plurality of second pixel columns 340 are alternately arranged along the first direction and staggered from each other in the second direction. The isolation structure 140 is located between the adjacent first color sub-pixel 201 and third color sub-pixel 203, and/or, the isolation structure 140 is located between the adjacent second color sub-pixel 202 and third color sub-pixel 203, and/or, the isolation structure 140 is located between the adjacent first color sub-pixel 201 and second color sub-pixel 202.

In some examples, the luminous efficiency of the third color sub-pixel is smaller than the luminous efficiency of the second color sub-pixel.

For example, the first color sub-pixel 201 is configured to emit red light, the second color sub-pixel 202 is configured to emit green light, and the third color sub-pixel 203 is configured to emit blue light. Of course, the embodiments of the present disclosure include this but are not limited thereto.

FIG. 6 is a schematic plan view of another display substrate provided by an embodiment of the present disclosure. As illustrated in FIG. 6, a plurality of sub-pixels 200 includes a plurality of first color sub-pixels 201, a plurality of second color sub-pixels 202, and a plurality of third color sub-pixels 203; a plurality of first color sub-pixels 201 and a plurality of second color sub-pixels 203 are alternately arranged along the first direction and the second direction to form a plurality of first pixel rows 310 and a plurality of first pixel columns 320, and a plurality of second color sub-pixels 202 are arranged in an array along the first direction and the second direction to form a plurality of second pixel rows 330 and a plurality of second pixel columns 340; the plurality of first pixel rows 310 and the plurality of second pixel rows 330 are alternately arranged along the second direction and staggered with each other in the first direction, the plurality of first pixel columns 320 and the plurality of second pixel columns 340 are alternately arranged along the first direction and staggered with each other in the second direction. The isolation structure 140 includes a plurality of first ring-shaped isolation parts 141, a plurality of second ring-shaped isolation parts 142 and a plurality of third ring-shaped isolation parts 143; each first ring-shaped isolation part 141 is disposed to surround one of the plurality of second color sub-pixels 202; each second ring-shaped isolation part 142 is disposed to surround one first color sub-pixel 201; each third ring-shaped isolation part 143 is disposed to surround one third color sub-pixel 203.

In the display substrate shown in FIG. 6, the charge generation layer 129 in the light emitting functional layer 120 can be disconnected at the first ring-shaped isolation part 141, the second ring-shaped isolation part 142 and the third ring-shaped isolation part 143, the first ring-shaped isolation part 141 can separate the second color sub-pixel 202 from other sub-pixels, thereby avoiding crosstalk between the second color sub-pixel and adjacent sub-pixels; the second ring-shaped isolation part 142 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the third color sub-pixel and adjacent sub-pixels.

In some examples, as illustrated in FIG. 6, the first ring-shaped isolation part 141 includes at least one opening 1410, the second ring-shaped isolation part 142 includes at least one opening 1420, and the third ring-shaped isolation part 143 includes at least one opening 1430. In the case that the second electrode on the light emitting functional layer may break at the position where the first ring-shaped isolation part, the second ring-shaped isolation part and the third ring-shaped isolation part are located, through disposing at least one opening in the first ring-shaped isolation part, disposing at least one opening in the second ring-shaped isolation part, disposing at least one opening in the third ring-shaped isolation part, the display substrate can avoid the first ring-shaped isolation part, the second ring-shaped isolation part and the third ring-shaped isolation part from completely isolating the sub-pixels, thereby avoiding the phenomenon that the cathode signal cannot be transmitted.

In some examples, as illustrated in FIG. 6, the openings of any two adjacent ring-shaped isolation parts among the first ring-shaped isolation parts 141, the second ring-shaped isolation parts 142 and the third ring-shaped isolation parts 143 are staggered, so as to ensure that the isolation structure at least exists between two adjacent sub-pixels, thereby effectively avoiding crosstalk between adjacent sub-pixels.

In some examples, as illustrated in FIG. 6, between adjacently arranged first color sub-pixel 201 and second color sub-pixel 202, the shortest path for transmitting charges from the first color sub-pixel 201 to the second color sub-pixel 202 is the position where the connection line connecting centers of the effective light emitting region of the first color sub-pixel 201 and the effective light emitting region of the second color sub-pixel 202. In order to effectively avoid crosstalk between the first color sub-pixel 201 and the second color sub-pixel 202, it is necessary to dispose the isolation structure on the connection line connecting centers of the effective light emitting region of the first color sub-pixel 201 and the effective light emitting region of the second color sub-pixel 202. Therefore, the opening 1410 of the first ring-shaped isolation part 141 outside the second color sub-pixel 202 and the opening 1420 of the second ring-shaped isolation part 142 outside the first color sub-pixel 201 cannot be both located on the connection line connecting centers of the effective light emitting region of the first color sub-pixel 201 and the effective light emitting region of the second color sub-pixel 202. It should be noted that, in the case that the charges cannot transmit from the first color sub-pixel 201 to the second color sub-pixel 202 along the shortest path, and at least needs to bypass the first ring-shaped isolation part 141 or the second ring-shaped isolation part 142, due to the transmission path of the charges is relatively long, and the resistance of the charge generation layer in the light emitting functional layer is large, crosstalk between adjacent sub-pixels can also be effectively avoided.

For example, as illustrated in FIG. 6, between the adjacently arranged first color sub-pixel 201 and second color sub-pixel 202, the opening 1420 of the second ring-shaped isolation part 142 is disposed to be spaced apart from the connection line connecting centers of the effective light emitting region of the first color sub-pixel 201 and the effective light emitting region of the second color sub-pixel 202. That is to say, the opening 1420 of the second ring-shaped isolation part 142 is not disposed on the connection line connecting centers of the effective light emitting region of the first color sub-pixel 201 and the effective light emitting region of the second color sub-pixel 202.

In some examples, as illustrated in FIG. 6, similarly, between adjacently arranged third color sub-pixel 203 and second color sub-pixel 202, in order to effectively avoid crosstalk between the third color sub-pixel 203 and second color sub-pixel 202, it is necessary to dispose the isolation structure on the connection line connecting centers of the effective light emitting region of the third color sub-pixel 203 and the effective light emitting region of the second color sub-pixel 202. Therefore, the opening 1410 of the first ring-shaped isolation part 141 outside the second color sub-pixel 202 and the opening 1430 of the third ring-shaped isolation part 143 outside the third color sub-pixel 203 cannot be both located on the connection line connecting centers of the effective light emitting region of the third color sub-pixel 203 and the effective light emitting region of the second color sub-pixel 202.

For example, as illustrated in FIG. 6, between the adjacently arranged third color sub-pixel 203 and second color sub-pixel 202, the opening 1420 of the second ring-shaped isolation part 142 is disposed to be spaced apart from the connection line connecting centers of the effective light emitting region of the third color sub-pixel 203 and the effective light emitting region of the second color sub-pixel 202. That is to say, the opening 1420 of the second ring-shaped isolation part 142 is not disposed on the connection line connecting centers of the effective light emitting region of the third color sub-pixel 203 and the effective light emitting region of the second color sub-pixel 202.

In some examples, as illustrated in FIG. 6, in the first ring-shaped isolation part 141 and the second ring-shaped isolation part 142 adjacently arranged in a third direction Z, one of the at least one opening 1410 of the first ring-shaped isolation part 141 closest to the second ring-shaped isolation part 142 is staggered with one of the at least one opening 1420 of the second ring-shaped isolation part 142 closest to the first ring-shaped isolation part 141 in the third direction.

It should be noted that, the third direction intersects with the first direction and the second direction respectively, and is located on the same plane as the first direction and the second direction; for example, the third direction may be the extension direction of the connection line connecting centers of the effective light emitting region of the first color sub-pixel and the effective light emitting region of the second color sub-pixel.

In some examples, as illustrated in FIG. 6, in the first ring-shaped isolation part 141 and the third ring-shaped isolation part 143 adjacently arranged in a third direction Z, one of the at least one opening 1410 of the first ring-shaped isolation part 141 closest to the third ring-shaped isolation part 143 is also staggered with one of the at least one opening 1430 of the third ring-shaped isolation part 143 closest to the first ring-shaped isolation part 141 in the third direction.

In some examples, as illustrated in FIG. 6, a shape of an orthographic projection of the effective light emitting region of the second color sub-pixel 202 on the base substrate 110 includes a rounded rectangle, which includes four rounded corners; in this case, the first ring-shaped isolation part 141 includes four openings 1410, and the four openings 1410 are respectively disposed corresponding to the four rounded corners of the effective light emitting region of the second color sub-pixel 202. A shape of an orthographic projection of the effective light emitting region of the first color sub-pixel 201 on the base substrate includes a rounded rectangle with four sides; in this case, the second ring-shaped isolation part 142 includes four openings 1420, and the four openings 1420 are respectively disposed corresponding to the four sides of the effective light emitting region of the first color sub-pixel 201. A shape of an orthographic projection of the effective light emitting region of the third color sub-pixel 203 on the base substrate includes a rounded rectangle with four sides; in this case, the third ring-shaped isolation part 143 includes four openings 1430, and the four openings 1430 are respectively disposed corresponding to the four sides of the effective light emitting region of the third color sub-pixel 203. With such a configuration, the display substrate can ensure that the openings of the ring-shaped isolation parts outside two adjacent sub-pixels are staggered, thereby ensuring that the isolation structure at least exists between two adjacent sub-pixels.

In some examples, as illustrated in FIG. 6, the display substrate 100 further includes spacers 170; in this case, the ring-shaped isolation parts adjacent to the spacer 170 is different from the ring-shaped isolation parts at other positions. The spacer 170 is surrounded by one first color sub-pixel 201, two second color sub-pixels 202 and one third color sub-pixel 203; the first color sub-pixel 201 and the third color sub-pixel 203 are respectively disposed on two sides of the spacer 170 in the second direction Y; two second color sub-pixels 202 are respectively disposed on two sides of the spacer 170 in the first direction X.

In some examples, as illustrated in FIG. 6, the second ring-shaped isolation part 142 outside the first color sub-pixel 201 includes a spacer opening 1425 at the position close to the spacer 170, and the third ring-shaped isolation part 143 outside the third color sub-pixel 203 includes a spacer opening 1435 at the position close to the spacer 170. Therefore, the display substrate can provide enough space for placing the spacer. Moreover, since the spacer itself also has a certain isolating effect, the above-mentioned spacer openings would not cause crosstalk between the first color sub-pixel and the third color sub-pixel.

In some examples, as illustrated in FIG. 6, since the second ring-shaped isolation part 142 is provided with the above-mentioned spacer opening 1425, the third ring-shaped isolation part 143 is provided with the above-mentioned spacer opening 1435; both the two first ring-shaped isolation parts 141 located on two sides of the spacer 170 are not provided with openings at the positions adjacent to the spacer 170, thereby effectively avoiding crosstalk between adjacent sub-pixels.

In some examples, as illustrated in FIG. 6, the dimension of the spacer 170 in the second direction Y is greater than the dimension of the spacer 170 in the first direction X.

For example, as illustrated in FIG. 6, the shape of the orthographic projection of the effective light emitting region of the third color sub-pixel 203 on the base substrate 110 includes a plurality of rounded corner parts, and the plurality of rounded corner parts includes a first rounded corner part 2031. The arc radius of the first rounded corner part 2031 is greater than the arc radiuses of other rounded corner parts. In this case, since the arc radius of the first rounded corner part 2031 is relatively large, thus the space occupied by the first rounded corner part 2031 is small, and the spacer opening 1435 can be arranged near the first rounded corner part 2031, thereby fully utilizing the area on the display substrate to increase the pixel density. In this case, the first rounded corner part 2031 is the rounded corner part with the smallest distance from the first color sub-pixel 201 among the plurality of rounded corner parts of the third color sub-pixel 203.

In some examples, as illustrated in FIG. 6, the shape of the orthographic projection of the effective light emitting region of the third color sub-pixel 203 on the base substrate 110 includes a plurality of rounded corner parts, and the plurality of rounded corner parts include a first rounded corner part 2031 and a second rounded corner part 2032, the arc radius of the first rounded corner part 2031 is greater than the arc radius of the second rounded corner part 2032; and the shape of the orthographic projection of the effective light emitting region of the third color sub-pixel 203 on the base substrate 110 is axisymmetric with respect to the connection line connecting the first rounded corner part 2031 and the second rounded corner part 2032.

FIG. 7 is a schematic plan view of another display substrate provided by an embodiment of the present disclosure. As illustrated in FIG. 7, the display substrate shown in FIG. 7 and the display substrate shown in FIG. 6 adopt the same pixel arrangement. In this case, the isolation structure 140 includes a plurality of first ring-shaped isolation parts 141, a plurality of second ring-shaped isolation parts 142 and a plurality of third ring-shaped isolation parts 143; each first ring-shaped isolation part 141 is disposed to surround one second color sub-pixel 202; each second ring-shaped isolation part 142 is disposed to surround one first color sub-pixel 201; each third ring-shaped isolation part 143 is disposed to surround one third color sub-pixel 203, thereby effectively avoiding crosstalk between the second color sub-pixels and adjacent sub-pixels.

In some examples, as illustrated in FIG. 7, the first ring-shaped isolation part 141 includes at least one opening 1410, the second ring-shaped isolation part 142 includes at least one opening 1420, and the third ring-shaped isolation part 143 includes at least one opening 1430. Moreover, the openings of any two adjacent ring-shaped isolation parts among the first ring-shaped isolation parts 141, the second ring-shaped isolation parts 142 and the third ring-shaped isolation parts 143 are staggered, so as to ensure that the isolation structure at least exists between two adjacent sub-pixels, thereby effectively avoiding crosstalk between adjacent sub-pixels.

In some examples, as illustrated in FIG. 7, between the adjacently arranged first color sub-pixel 201 and second color sub-pixel 202, the opening 1410 of the first ring-shaped isolation part 141 is disposed to be spaced apart from the connection line connecting centers of the effective light emitting region of the first color sub-pixel 201 and the effective light emitting region of the second color sub-pixel 202. That is to say, the opening 1410 of the first ring-shaped isolation part 141 is not disposed on the connection line connecting centers of the effective light emitting region of the first color sub-pixel 201 and the effective light emitting region of the second color sub-pixel 202.

In some examples, as illustrated in FIG. 7, between the adjacently arranged third color sub-pixel 203 and second color sub-pixel 202, the opening 1430 of the third ring-shaped isolation part 143 is disposed to be spaced apart from the connection line connecting centers of the effective light emitting region of the third color sub-pixel 203 and the effective light emitting region of the second color sub-pixel 202. That is to say, the opening 1430 of the third ring-shaped isolation part 143 is not disposed on the connection line connecting centers of the effective light emitting region of the third color sub-pixel 203 and the effective light emitting region of the second color sub-pixel 202.

In some examples, as illustrated in FIG. 7, a shape of an orthographic projection of the effective light emitting region of the second color sub-pixel 202 on the base substrate 110 includes a rounded rectangle, which includes four sides; in this case, the first ring-shaped isolation part 141 includes four openings 1410, and the four openings 1410 are respectively disposed corresponding to the four sides of the effective light emitting region of the second color sub-pixel 202. A shape of an orthographic projection of the effective light emitting region of the first color sub-pixel 201 on the base substrate includes a rounded rectangle with four rounded corners; in this case, the second ring-shaped isolation part 142 includes four openings 1420, and the four openings 1420 are respectively disposed corresponding to the four rounded corners of the effective light emitting region of the first color sub-pixel 201. A shape of an orthographic projection of the effective light emitting region of the third color sub-pixel 203 on the base substrate includes a rounded rectangle with four rounded corners; in this case, the third ring-shaped isolation part 143 includes four openings 1430, and the four openings 1430 are respectively disposed corresponding to the four rounded corners of the effective light emitting region of the third color sub-pixel 203. With such a configuration, the display substrate can ensure that the openings of the ring-shaped isolation parts outside two adjacent sub-pixels are staggered, thereby ensuring that the isolation structure at least exists between two adjacent sub-pixels.

In some examples, as illustrated in FIG. 7, the display substrate 100 further includes spacers 170; in this case, the ring-shaped isolation parts adjacent to the spacer 170 is different from the ring-shaped isolation parts at other positions. The spacer 170 is surrounded by one first color sub-pixel 201, two second color sub-pixels 202 and one third color sub-pixel 203; the first color sub-pixel 201 and the third color sub-pixel 203 are respectively disposed on two sides of the spacer 170 in the second direction Y; two second color sub-pixels 202 are respectively disposed on two sides of the spacer 170 in the first direction X.

In some examples, as illustrated in FIG. 7, the second ring-shaped isolation part 142 outside the first color sub-pixel 201 includes a spacer opening 1425 at the position close to the spacer 170, and the position where the spacer opening 1425 is located is not provided with an isolation structure; the spacer opening 1425 extends from a gap between the first color sub-pixel 201 and one second color sub-pixel 202, through a gap between the first color sub-pixel 201 and the spacer 170, to a gap between the first color sub-pixel 201 and another one second color sub-pixel 202. That is to say, the second ring-shaped isolation part 142 outside the first color sub-pixel 201 adjacent to the spacer only includes two strip-shaped isolation parts. The third ring-shaped isolation part 143 outside the third color sub-pixel 203 includes a spacer opening 1435 at the position close to the spacer 170, and the position where the spacer opening 1435 is located is not provided with an isolation structure; the spacer opening 1435 extends from a gap between the third color sub-pixel 203 and one second color sub-pixel 202, through a gap between the third color sub-pixel 203 and the spacer 170, to a gap between the third color sub-pixel 203 and another one second color sub-pixel 202. That is to say, the third ring-shaped isolation part 143 outside the third color sub-pixel 203 adjacent to the spacer only includes two strip-shaped isolation parts. Therefore, the display substrate can provide enough space for placing the spacer. Moreover, since the spacer itself also has a certain isolating effect, the above-mentioned spacer opening would not cause crosstalk between the first color sub-pixel and the third color sub-pixel.

In some examples, as illustrated in FIG. 7, since the second ring-shaped isolation part 142 is provided with the above-mentioned spacer opening 1425, the third ring-shaped isolation part 143 is provided with the above-mentioned spacer opening 1435; both the two first ring-shaped isolation parts 141 located on two sides of the spacer 170 are not provided with openings at the positions adjacent to the spacer 170, thereby effectively avoiding crosstalk between adjacent sub-pixels.

In some examples, as illustrated in FIG. 7, the dimension of the spacer 170 in the second direction Y is greater than the dimension of the spacer 170 in the first direction X.

FIG. 8 is a schematic plan view of another display substrate provided by an embodiment of the present disclosure. As illustrated in FIG. 8, a plurality of sub-pixels 200 includes a plurality of first color sub-pixels 201, a plurality of second color sub-pixels 202, and a plurality of third color sub-pixels 203; the isolation structure 140 includes a third strip-shaped isolation part 147 and a fourth strip-shaped isolation part 148; the third strip-shaped isolation part 147 is located between adjacent first color sub-pixel 201 and second color sub-pixel 202; the fourth strip-shaped isolation part 148 is located between adjacent third color sub-pixel 203 and second color sub-pixel 202.

In some examples, as illustrated in FIG. 8, the extension direction of the third strip-shaped isolation part 147 is perpendicular to the connection line connecting centers of the effective light emitting regions of the adjacent first color sub-pixel 201 and second color sub-pixel 202; the extension direction of the fourth strip-shaped isolation part 148 is perpendicular to the connection line connecting centers of the effective light emitting regions of the adjacent third color sub-pixel 203 and second color sub-pixel 202.

In some examples, as illustrated in FIG. 8, an ortho-graphic projection of the effective light emitting region of the first color sub-pixel 201 on the base substrate 110 is a rounded rectangle, and a dimension (i.e., length) of the third strip-shaped isolation part 147 in the extension direction thereof is 0.8 to 1 times the side length of the effective light emitting region of the first color sub-pixel 201.

In some examples, as illustrated in FIG. 8, an ortho-graphic projection of the effective light emitting region of the third color sub-pixel 203 on the base substrate 110 is a rounded rectangle, and a dimension (i.e., length) of the fourth strip-shaped isolation part 148 in the extension direction thereof is 0.8 to 1 times the side length of the effective light emitting region of the third color sub-pixel 203.

In some examples, as illustrated in FIG. 8, the display substrate 100 further includes spacers 170; in this case, the isolation parts adjacent to the spacer 170 is different from the isolation parts at other positions. The spacer 170 is surrounded by one first color sub-pixel 201, two second color sub-pixels 202 and one third color sub-pixel 203; the first color sub-pixel 201 and the third color sub-pixel 203 are respectively disposed on two sides of the spacer 170 in the second direction Y; two second color sub-pixels 202 are respectively disposed on two sides of the spacer 170 in the first direction X.

In some examples, as illustrated in FIG. 8, the isolation structure 140 includes arc-shaped isolation parts 149, and the arc-shaped isolation part 149 is located between the second color sub-pixel 202 and the spacer 170; further, the arc-shaped isolation part 149 extends from a gap between the second color sub-pixel 202 and the third color sub-pixel 203 to a gap between the second color sub-pixel 202 and the first color sub-pixel 201; that is to say, one end of the arc-shaped isolation part 149 is located between the second color sub-pixel 202 and the third color sub-pixel 203, so as to function as a fourth strip-shaped isolation part 148; while the other one end of the arc-shaped isolation part 149 is located between the second color sub-pixel 202 and the first color sub-pixel 201, so as to function as a third strip-shaped isolation part 147; the middle part of the arc-shaped isolation part 149 is located between the second color sub-pixel 202 and the spacer 170.

FIG. 9 is a schematic plan view of another display substrate provided by an embodiment of the present disclosure. As illustrated in FIG. 9, a plurality of sub-pixels 200 includes a plurality of first color sub-pixels 201, a plurality of second color sub-pixels 202 and a plurality of third color sub-pixels 203; the isolation structure 140 includes a plurality of first ring-shaped isolation parts 141, a plurality of second ring-shaped isolation parts 142 and a plurality of third ring-shaped isolation parts 143; each first ring-shaped isolation part 141 is disposed to surround two adjacent second color sub-pixels 202; each second ring-shaped isolation part 142 is disposed to surround one first color sub-pixel 201; each third ring-shaped isolation part 143 is disposed to surround one third color sub-pixel 203. As such, the charge generation layer 129 in the light emitting functional layer 120 can be disconnected at the first ring-shaped isolation part 141, the second ring-shaped isolation part 142, and the third ring-shaped isolation part 143, and the first ring-shaped isolation part 141 can separate two adjacent second color sub-pixels 202 from other sub-pixels, so as to avoid crosstalk between the second color sub-pixels and adjacent sub-pixels; the first ring-shaped isolation part 141 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the third color sub-pixel and adjacent sub-pixels.

In some examples, as illustrated in FIG. 9, there are two ring-shaped isolation parts existing between any two adjacent sub-pixels 200, thereby further avoiding crosstalk between adjacent sub-pixels.

In some examples, as illustrated in FIG. 9, a plurality of sub-pixels 200 are divided into a plurality of sub-pixel groups 350, and each sub-pixel group 350 includes one first color sub-pixel 201, two second color sub-pixels 202, and one third color sub-pixel 203. In each sub-pixel group 350, the first color sub-pixel 201 and the third color sub-pixel 203 are arranged along the first direction, and the two second color sub-pixels 202 are disposed adjacent to each other in the second direction, and are located between the first color sub-pixel 201 and the third color sub-pixel 203. It should be noted that, the above-mentioned concept of pixel group is only used to describe the pixel arrangement structure of a plurality of sub-pixels, and does not limit that one pixel group is used for displaying one pixel dot or driven by the same gate line.

For example, as illustrated in FIG. 9, the four sub-pixels in the dotted box 360 may be driven by the same gate line. Of course, the embodiments of the present disclosure include this but are not limited thereto, and the driving of the sub-pixels may be set according to actual needs.

FIG. 10 is a schematic plan view of another display substrate provided by an embodiment of the present disclosure. As illustrated in FIG. 10, the plurality of sub-pixels 200 includes a plurality of first color sub-pixels 201, a plurality of second color sub-pixels 202 and a plurality of third color sub-pixels 203. The isolation structure 140 includes a plurality of first ring-shaped isolation parts 141, a plurality of second ring-shaped isolation parts 142 and a plurality of third ring-shaped isolation parts 143; each first ring-shaped isolation part 141 surrounds two adjacent second color sub-pixels 202; each second ring-shaped isolation part 142 surround one first color sub-pixel 201; each third ring-shaped isolation part 143 surround one third color sub-pixel 203. As such, the charge generation layer 129 in the light emitting functional layer 120 can be disconnected at the first ring-shaped isolation part 141, the second ring-shaped isolation part 142, and the third ring-shaped isolation part 143, and the first ring-shaped isolation part 141 can separate two adjacent second color sub-pixels 202 from other sub-pixels, so as to avoid crosstalk between the second color sub-pixels and adjacent sub-pixels; the first ring-shaped isolation part 141 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the third color sub-pixel and adjacent sub-pixels.

In some examples, as illustrated in FIG. 10, any two adjacent ring-shaped isolation parts among the plurality of first ring-shaped isolation parts 141, the plurality of second ring-shaped isolation parts 142 and the plurality of third ring-shaped isolation parts 143 share one isolation edge part. As such, only one isolation structure is provided between two adjacent sub-pixels, through which the width of the gap between two adjacent sub-pixels can be reduced to increase the pixel density.

FIG. 11 is a schematic plan view of another display substrate provided by an embodiment of the present disclosure. As illustrated in FIG. 11, a plurality of sub-pixels 200 include a plurality of first color sub-pixels 201, a plurality of second color sub-pixels 202, and a plurality of third color sub-pixels 203; the isolation structure 140 includes a plurality of first ring-shaped isolation parts 141 and a plurality of second ring-shaped isolation parts 142, each first ring-shaped isolation part 141 surrounds one second color sub-pixel 202, and each second ring-shaped isolation part 142 is disposed to surround one first color sub-pixel 201.

In some examples, as illustrated in FIG. 11, the isolation structure 140 includes a plurality of first ring-shaped isolation parts 141, a plurality of second ring-shaped isolation parts 142 and a plurality of third ring-shaped isolation parts 143; each first ring-shaped isolation part 141 is disposed to surround one second color sub-pixel 202; each second ring-shaped isolation part 142 is disposed to surround one first color sub-pixel 201; each third ring-shaped isolation part 143 is disposed to surround one third color sub-pixel 203. As such, the charge generation layer 129 in the light emitting functional layer 120 can be disconnected at the first ring-shaped isolation part 141, the second ring-shaped isolation part 142, and the third ring-shaped isolation part 143, and the first ring-shaped isolation part 141 can separate the second color sub-pixel 202 from other sub-pixels, so as to avoid crosstalk between the second color sub-pixel and adjacent sub-pixels; the first ring-shaped isolation part 141 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the third color sub-pixel and adjacent sub-pixels.

In some examples, as illustrated in FIG. 11, there are two ring-shaped isolation parts existing between any two adjacent sub-pixels 200, thereby further avoiding crosstalk between adjacent sub-pixels.

In some examples, as illustrated in FIG. 11, a plurality of sub-pixels 200 are divided into a plurality of sub-pixel groups 350, and each sub-pixel group 350 includes one first color sub-pixel 201, one second color sub-pixel 202, and one third color sub-pixel 203; in each sub-pixel group 350, the first color sub-pixel 201 or the second color sub-pixel 202 and the third color sub-pixel 203 are arranged along the first direction, the first color sub-pixel 201 and the second color sub-pixel 202 are arranged along the second direction.

FIG. 12 is a schematic plan view of another display substrate provided by an embodiment of the present disclosure. As illustrated in FIG. 12, the plurality of sub-pixels 200 includes a plurality of first color sub-pixels 201, a plurality of second color sub-pixels 202 and a plurality of third color sub-pixels 203; the isolation structure 140 includes a plurality of first ring-shaped isolation parts 141 and a plurality of second ring-shaped isolation parts 142; the plurality of first ring-shaped isolation parts 141 are disposed in one-to-one correspondence with the plurality of second color sub-pixels 202, and each first ring-shaped isolation part 141 is disposed to surround one second color sub-pixel 202; the plurality of second ring-shaped isolation parts 142 are disposed in one-to-one correspondence with the plurality of first color sub-pixels 201, and each second ring-shaped isolation part 142 is disposed to surround one first color sub-pixel 201. As such, the charge generation layer 129 in the light emitting functional layer 120 can be disconnected at the first ring-shaped isolation part 141, the second ring-shaped isolation part 142, and the third ring-shaped isolation part 143, and the first ring-shaped isolation part 141 can separate the second color sub-pixel 202 from other sub-pixels, so as to avoid crosstalk between the second color sub-pixel and adjacent sub-pixels; the second ring-shaped isolation part 142 can separate the first color sub-pixel 201 from other sub-pixels, thereby avoiding crosstalk between the first color sub-pixel and adjacent sub-pixels; the third ring-shaped isolation part 143 can separate the third color sub-pixel 203 from other sub-pixels, thereby avoiding crosstalk between the third color sub-pixel and adjacent sub-pixels.

In some examples, as illustrated in FIG. 12, a plurality of sub-pixels 200 are divided into a plurality of sub-pixel groups 350, and each sub-pixel group 350 includes one first color sub-pixel 201, one second color sub-pixel 202, and one third color sub-pixel 203; in each sub-pixel group 350, the first color sub-pixel 201 or the second color sub-pixel 202 and the third color sub-pixel 203 are arranged along the first direction, the first color sub-pixel 201 and the second color sub-pixel 202 are arranged along the second direction.

In some examples, as illustrated in FIG. 12, the first ring-shaped isolation part 141 includes at least one opening 1410, and the second ring-shaped isolation part 142 includes at least one opening 1420; in this case, the isolation structure 140 further includes a plurality of L-shaped isolation parts 143, the plurality of L-shaped isolation parts 143 are disposed in one-to-one correspondence with the plurality of third color sub-pixels 203, and each L-shaped isolation part 143 is disposed to surround one third color sub-pixel 203. In each pixel group 350, the L-shaped isolation part 143 directly faces the opening 1410 in the first ring-shaped isolation part 141 close to the third color sub-pixel 203 and the opening 1420 in the second ring-shaped isolation part 142 close to the third color sub-pixel 203; that is to say, an orthographic projection of the L-shaped isolation part 146 on a reference line extending along the second direction Y is respectively overlapped with an orthographic projection of the opening 1410 in the first ring-shaped isolation part 141 close to the third color sub-pixel 203 on the reference line and an orthographic projection of the opening 1420 in the second ring-shaped isolation part 142 close to the third color sub-pixel 203 on the reference line.

FIG. 13 is a schematic partial cross-sectional view of a display substrate provided by an embodiment of the present disclosure. As illustrated in FIG. 13, the isolation structure 140 includes a recess 1401 and a shielding part 1402; the shielding part 1402 is located on the edge of the recess 1401 and protrudes toward the internal of the recess 1401, so as to form a protrusion part 1403 covering a portion of the opening of the recess 1401, the conductive sub-layer 129 of the light emitting functional layer 120 is disconnected at the protrusion part 1403 of the shielding part 1402.

For example, as illustrated in FIG. 13, the shielding part 1402 protrudes into the recess 1401 relative to the edge of the recess 1401 to form the protrusion part 1403; in this case, the protrusion part 1403 of the shielding part 1402 is suspended, and the protrusion part 1403 overlays the edge portion of the opening of the recess 1401.

In some examples, as illustrated in FIG. 13, two edges of the recess 1401 in the arrangement direction of two adjacent sub-pixels 200 are respectively provided with shielding parts 1402.

In some examples, as illustrated in FIG. 13, the second electrode 132 is disconnected at the position where the isolation structure 140 is located.

In some examples, as illustrated in FIG. 13, the display substrate 100 further includes a planarization layer 180; the recess 1401 is disposed in the planarization layer 180; a portion of the shielding part 1402 other than the protrusion part 1403 may be located between the planarization layer 180 and the pixel definition layer 150.

For example, the ratio of the size of the protrusion part 1403 of the shielding part 1402 protruding into the recess 1401 to the size of the shielding part 1402 may be 0.1 to 0.5. For example, the ratio of the size of the protrusion part 1403 of the shielding part 1402 protruding into the recess 1401 to the size of the shielding part 1402 may be 0.2 to 0.4. For example, the size of the protrusion part 1403 of the shielding part 1402 protruding into the recess 1401 is not less than 0.1 micron. For example, the size of the protrusion part 1403 of the shielding part 1402 protruding into the recess 1401 is not less than 0.2 micron.

For example, the distance between two shielding parts 1402 between adjacent sub-pixels may be 2 to 15 microns. For example, the distance between two shielding parts 1402 between adjacent sub-pixels may be 5 to 10 microns. For example, the distance between two shielding parts 1402 between adjacent sub-pixels may be 3 to 7 microns. For example, the distance between two shielding parts 1402 between adjacent sub-pixels may be 4 to 12 microns.

For example, as illustrated in FIG. 13, a portion of the shielding part 1402 other than the protrusion part 1403 is attached to the surface of the planarization layer 180 away from the base substrate 110.

For example, the material of the shielding part 1402 may be the same as the material of the first electrode 131, the shielding part 1402 and the first electrode 131 may be located in the same film layer. As such, the shielding part 1402 may be simultaneously formed in the process of patterning the first electrode 131, thereby saving pattering process. Of course, the embodiments of the present disclosure include this but are not limited thereto, and the shielding part can also be made of other materials, such as an inorganic material.

For example, the material of the planarization layer 180 may be an organic material, such as resin, acrylic or polyethylene terephthalate, polyimide, polyamide, polycarbonate, epoxy resin, or combinations thereof.

In some examples, other film layers may be further provided between the planarization layer 180 and the base substrate 110, and the other film layers may include film layers or structures such as a gate insulating layer, an interlayer insulating layer, the respective film layers in a pixel circuit (for example, including structures such as thin film transistors, storage capacitors, etc.), data lines, gate lines, power signal lines, reset power signal lines, reset control signal lines, light emitting control signal lines.

At least one embodiment of the present disclosure further provides a display device. FIG. 14 is a schematic view of a display device provided by an embodiment of the present disclosure. As illustrated in FIG. 14, the display device 500 further includes a display substrate 100. In the display substrate, an isolation structure is disposed between adjacent sub-pixels, and the charge generation layer in the light emitting functional layer is disconnected at the position where the isolation structure is located, thereby avoiding crosstalk between adjacent sub-pixels due to the charge generation layer with high conductivity. Therefore, the display device including the display substrate can also avoid crosstalk between adjacent sub-pixels, thus having a higher product yield and higher display quality.

On the other hand, the display substrate can increase the pixel density while adopting tandem EL design. Therefore, the display device including the display substrate has the advantages of long life, low power consumption, high brightness, high resolution and the like.

For example, the display device may be a display device such as an organic light emitting diode display device, or any product or component with a display function, such as a TV, a digital camera, a mobile phone, a watch, a tablet computer, a notebook computer, a navigator, etc. that include the display device, but the embodiments are not limited thereto.

In order to better ensure the continuity of the second electrode while effectively isolating the charge generation layers of adjacent sub-pixels, an embodiment of the present disclosure also proposes another display substrate. FIG. 15 is a schematic plan view of another display substrate provided by an embodiment of the present disclosure; FIG. 16 is a schematic cross-sectional view along line EF in FIG. 15 illustrating a display substrate provided by an embodiment of the present disclosure.

As illustrated in FIG. 15 and FIG. 16, the display substrate 100 includes a base substrate 110 and a plurality of sub-pixels 200 located on the base substrate 110; the plurality of sub-pixels 200 are arranged in an array on the base substrate 110, and each sub-pixel 200 includes a light emitting element 210 and a pixel driving circuit 250 for driving the light emitting element 210 to emit light. Each light emitting element 210 includes a light emitting functional layer, a first electrode, and a second electrode; the light emitting functional layer may include a plurality of sub-functional layers, and the plurality of sub-functional layers may include a charge generation layer with relatively high conductivity. It should be noted that, the cross-sectional structure of the light emitting element can be referred to the relevant description with respect to FIG. 2, which are not repeated here.

For example, the pixel driving circuit 250 may be electrically connected to the first electrode 131 of a correspondingly disposed light emitting element 210, so as to drive the light emitting element 210 to emit light. The first electrode 131 may be an anode, and the second electrode 132 may be a cathode; a plurality of sub-pixels 200 may share one second electrode 132, that is, a plurality of sub-pixels 200 may share one cathode.

For example, the cathode may be formed of a material with high conductivity and low work function, for example, the cathode may be made of a metal material. For example, the anode may be formed of a transparent conductive material having a high work function.

As illustrated in FIG. 15 and FIG. 16, the display substrate 100 further includes an isolation structure 140, the isolation structure 140 is located on the base substrate 110 and between adjacent sub-pixels 200; as such, the charge generation layer in the light emitting functional layer is disconnected at the position where the isolation structure 140 is located. A plurality of sub-pixels 200 includes a plurality of first color sub-pixels 201, a plurality of second color sub-pixels 202, and a plurality of third color sub-pixels 203, and the isolation structure 140 includes a plurality of ring-shaped isolation parts 1400, each ring-shaped isolation part 1400 surround one of one first color sub-pixel 201, one second color sub-pixel 202, and one third color sub-pixel 203; that is to say, each ring-shaped isolation part 1400 surrounds one first color sub-pixel 201, or one second color sub-pixel 202, or one third color sub-pixel 203. In addition, the above-mentioned ring-shaped isolation part may be a closed ring shape or a non-closed ring shape, such as a ring including at least one opening.

In the display substrate provided by the embodiments of the present disclosure, the isolation structure is provided between adjacent sub-pixels, and the charge generation layer in the light emitting functional layer is disconnected at the location of the isolation structure, so as to avoid crosstalk between adjacent sub-pixels due to the charge generation layer with high conductivity. Moreover, since the isolation structure includes a plurality of ring-shaped isolation parts, and each ring-shaped isolation part surrounds one first color sub-pixel, or one second color sub-pixel, or one third color sub-pixel, the isolation structure can realize the isolation of most adjacent sub-pixels through simple ring-shaped isolation parts, thereby avoiding crosstalk between adjacent sub-pixels. On the other hand, since the display substrate can avoid crosstalk between adjacent sub-pixels through the isolation structure, the display substrate can increase pixel density while adopting a tandem EL design. Therefore, the display substrate can have the advantages of long life, low power consumption, high brightness, and high resolution.

In some examples, as illustrated in FIG. 15 and FIG. 16, in the display substrate 100, a number of the second color sub-pixels 202 is greater than a number of the first color sub-pixels 201; or, the number of the second color sub-pixels 202 is greater than a number of the third color sub-pixels 203; or, the number of the second color sub-pixels 202 is greater than the number of the first color sub-pixels 201 and the number of the third color sub-pixels 203. Therefore, through disposing first ring-shaped isolation parts 141A outside the first color sub-pixels 201 with a smaller number and disposing second ring-shaped isolation parts 142B outside the third color sub-pixels 203 with a smaller number, most of adjacent sub-pixels on the display substrate can be separated, thereby effectively avoiding crosstalk between adjacent sub-pixels.

In some examples, as illustrated in FIG. 15 and FIG. 16, in the display substrate 100, the number of the second color sub-pixels 202 is approximately twice the number of the first color sub-pixels 201 or twice the number of the third color sub-pixels 203.

In some examples, as illustrated in FIG. 15 and FIG. 16, the isolation structure 140 also does not need to be provided with the strip-shaped isolation parts as illustrated in FIG. 1, and can separate the first color sub-pixel and the third color sub-pixel that are adjacent, and can separate the first color sub-pixel and the third color sub-pixel that are adjacent.

In some examples, the light emitting functional layer includes a first light emitting layer and a second light emitting layer located on two sides of the conductive sub-layer in a direction perpendicular to the base substrate, and the conductive sub-layer is a charge generation layer. As such, the display substrate can implement a tandem EL design, and thus have the advantages of long life, low power consumption, and high brightness. It should be noted that, the cross-sectional structure of the light emitting functional layer can be referred to the related description with respect to FIG. 2, which are not repeated here.

In some examples, the conductivity of the conductive sub-layer is greater than the conductivity of the first light emitting layer and the second light emitting layer, and less than the conductivity of the second electrode.

In some examples, as illustrated in FIG. 15 and FIG. 16, a plurality of ring-shaped isolation parts 1400 includes a plurality of first ring-shaped pixel isolation parts 141A and a plurality of second ring-shaped pixel isolation parts 142A, the plurality of first ring-shaped pixel isolation parts 141A and the plurality of first color sub-pixels 201 are correspondingly disposed, and the plurality of second ring-shaped pixel isolation parts 142A and the plurality of third color sub-pixels 203 are correspondingly disposed; each first ring-shaped pixel isolation part 141A surrounds one first color sub-pixel 201, and each second ring-shaped pixel isolation part 142A surrounds one third color sub-pixel 203. As such, the plurality of first ring-shaped pixel isolation parts 141A can separate the plurality of first color sub-pixels 201 from other adjacent sub-pixels, and the plurality of second ring-shaped pixel isolation parts 142 can separate the plurality of third color sub-pixels 203 from other adjacent sub-pixels, so that the display substrate can effectively avoid crosstalk between adjacent sub-pixels.

In some examples, as illustrated in FIG. 15 and FIG. 16, the isolation structure 140 between adjacent first color sub-pixel 201 and second color sub-pixel 202 only includes the first ring-shaped pixel isolation part 141A, and the isolation structure 140 between adjacent third color sub-pixel 203 and second color sub-pixel 202 only includes the second ring-shaped pixel isolation part 142A. In this case, it is unnecessary to dispose ring-shaped isolation structures around the second color sub-pixels, and the second electrode can be continuously disposed around the second color sub-pixels. Therefore, the display substrate can effectively isolate the charge generation layer of adjacent sub-pixels through the above-mentioned isolation structure, as well as maximizing the continuity of the second electrode, thereby facilitating the transmission of cathode signal.

In some examples, as illustrated in FIG. 15 and FIG. 16, the first ring-shaped pixel isolation part 141A includes an opening 1410A, and the opening 1410A is located on an extension line of a diagonal of the effective light emitting region of the first color sub-pixel 201. The first electrode 131 of the first color sub-pixel 201 includes a first body part 1311A and a first connection part 1311B, and the first connection part 1311B is connected to the first body part 1311A, and configured to be connected to the pixel driving circuit 250; the first connection part 1311B is located at the position where the opening 1410A of the first ring-shaped pixel isolation part 141A is located.

In this case, the opening of the first ring-shaped pixel isolation part can be used to dispose the first connection part, and the first connection part is used for connecting with a corresponding pixel driving circuit. In the case where the pixel density of the display substrate is high and the sub-pixels are closely arranged, the space between the facing edges of the effective light emitting regions of adjacent sub-pixels is small, while the space between the facing corners of the effective light emitting regions of adjacent sub-pixels is relatively large, through disposing the opening of the first ring-shaped pixel isolation part on the extension line of the diagonal of the effective light emitting region of the first color sub-pixel, the display substrate can make full use of the space between the facing corners of the effective light emitting regions of adjacent sub-pixels. On the other hand, the display substrate can increase the pixel arrangement density while avoiding crosstalk between adjacent sub-pixels through the above configuration.

In some examples, as illustrated in FIG. 15 and FIG. 16, the first connection part 1311B is located on the extension line of the diagonal of the first body part 1311A, that is, the first connection part 1311B extends from a corner part of the first body part 1311A and protrudes outward.

In some examples, as illustrated in FIG. 15 and FIG. 16, a shape of an orthographic projection of the first body part 1311A on the base substrate 110 includes a rounded rectangle, and the first connection part 1311B extends from a rounded corner of the first body part 1311A and protrudes outward along the extension direction of the diagonal of the rounded rectangle.

In some examples, as illustrated in FIG. 15 and FIG. 16, the second ring-shaped pixel isolation part 142A includes an opening 1420A, and the opening 1420A is located on an extension line of a diagonal of the effective light emitting region of the third color sub-pixel 203. The first electrode 131 of the third color sub-pixel 203 includes a second body part 1312A and a second connection part 1312B, and the second connection part 1312B is connected to the second body part 1312A, and configured to be connected to the pixel driving circuit 250; the second connection part 1312B is located at the position where the opening 1420A of the second ring-shaped pixel isolation part 142A is located.

In this case, the opening of the second ring-shaped pixel isolation part can be used to dispose the second connection part, and the second connection part is used for connecting with a corresponding pixel driving circuit. In the case where the pixel density of the display substrate is high and the sub-pixels are closely arranged, the space between the facing edges of the effective light emitting regions of adjacent sub-pixels is small, while the space between the facing corners of the effective light emitting regions of adjacent sub-pixels is relatively large, through disposing the opening of the second ring-shaped pixel isolation part on the extension line of the diagonal of the effective light emitting region of the third color sub-pixel, the display substrate can make full use of the space between the facing corners of the effective light emitting regions of adjacent sub-pixels. On the other hand, the display substrate can increase the pixel arrangement density while avoiding crosstalk between adjacent sub-pixels through the above configuration.

In some examples, as illustrated in FIG. 15 and FIG. 16, the second connection part 1312B is located on the extension line of the diagonal of the second body part 1312A, that is, the second connection part 1312B extends from a corner part of the second body part 1312A and protrudes outward.

In some examples, as illustrated in FIG. 15 and FIG. 16, a shape of an orthographic projection of the second body part 1312A on the base substrate 110 includes a rounded rectangle, and the second connection part 1312B extends from a rounded corner of the second body part 1312B and protrudes outward along the extension direction of the diagonal of the rounded rectangle.

In some examples, as illustrated in FIG. 15 and FIG. 16, the direction along which the first connection part 1311B protrudes from the first body part 1311A is the same as the direction along which the second connection part 1312B protrudes from the second body part 1312A.

In some examples, as illustrated in FIG. 15 and FIG. 16, the first electrode 131 of the second color sub-pixel 202 includes a third body part 1313A and a third connection part 1313B, and the third connection part 1313B is connected to the third body part 1313A, and configured to be connected to the pixel driving circuit 250.

In some examples, as illustrated in FIG. 15 and FIG. 16, the third connection part 1313B is located on the extension line of the diagonal of the third body part 1313A, that is, the third connection part 1313B extends from a corner part of the third body part 1313A and protrudes outward.

In some examples, as illustrated in FIG. 15, first openings 1410A are arranged in an array, forming a first opening row and a first opening column along the first direction X and the second direction Y; the first opening row extends along the first direction, the first opening column extends along the second direction; second openings 1420A are arranged in an array, forming a second opening row and a second opening column along the first direction X and the second direction Y; the second opening row extends along the first direction X, the second opening column extends along the second direction Y; the first opening row and the second opening row are approximately parallel, and the first opening column and the second opening column are approximately parallel.

In some examples, as illustrated in FIG. 15, the first opening row is located between the first color sub-pixels 201 and the third color sub-pixels 203, and the second opening row is located between the first color sub-pixels 201 and the third color sub-pixels 203.

In some examples, as illustrated in FIG. 15 and FIG. 16, the display substrate 100 further includes a pixel definition layer 150 on the base substrate 110; a portion of the pixel definition layer 150 is located on a side the first electrodes 131 away from the base substrate 110; the pixel definition layer 150 includes a plurality of pixel openings 152 and pixel spacing openings 154; the plurality of pixel openings 152 are in one-to-one correspondence with the plurality of sub-pixels 200 to define the effective light emitting regions of the plurality of sub-pixels 200; the pixel opening 152 is configured to expose the first electrode 131, so that the first electrode 131 is in contact with the subsequently formed light emitting functional layer 120. The pixel spacing opening 154 is located between adjacent first electrodes 131, and at least a portion of the isolation structure 140 is located between the pixel definition layer 150 and the base substrate 110, that is, at least a portion of the isolation structure 140 is covered by the pixel definition layer 150.

In the arrangement direction of adjacent sub-pixels, since at least a portion of the isolation structure is located between the pixel definition layer and the base substrate, the charge generation layer in the light emitting functional layer is only disconnected once at the position where the isolation structure is located outside the pixel definition layer; Likewise, the second electrode is only disconnected once at the position where the isolation structure is located outside the pixel definition layer, and not disconnected twice at two sides of the isolation structure in the arrangement direction of adjacent sub-pixels. Therefore, the continuity of the second electrode can be better maintained, so that the cathode signal can be better transmitted. In addition, the second electrode is only disconnected once at the position where the isolation structure is located outside the pixel definition layer, and the possibility of forming a pointed end structure at the second electrode can also be reduced or even avoided, thereby avoiding the point discharge phenomenon. It should be noted that, the above-mentioned arrangement direction of adjacent sub-pixels may be the extension direction of the connection line connecting the brightness centers of the effective light emitting regions of the adjacent sub-pixels.

In some examples, as illustrated in FIG. 15 and FIG. 16, in the arrangement direction of adjacent sub-pixels, an edge of the isolation structure 140 at a side in the arrangement direction is located between the pixel definition layer 150 and the base substrate 110, while an edge of the isolation structure 140 at another side is located in the pixel spacing opening 154. In this case, the second electrode is only disconnected once at the edge of the isolation structure located in the pixel spacing opening, and not disconnected twice at both sides of the isolation structure in the arrangement direction of adjacent sub-pixels. Therefore, the continuity of the second electrode can be better maintained, so that the cathode signal can be better transmitted.

In some examples, as illustrated in FIG. 15 and FIG. 16, in the arrangement direction of adjacent sub-pixels, one side of the isolation structure 140 in the arrangement direction includes an isolation surface 1490, an included angle between the isolation surface 1490 and the plane where the base substrate 110 is located ranges from 80 to 100 degrees. As such, the isolation surface can effectively disconnect the charge generation layer. Of course, the isolation structure provided by the embodiments of the present disclosure may also adopt other structures, as long as the charge generation layer can be disconnected.

In some examples, as illustrated in FIG. 15 and FIG. 16, the dimension of the isolation structure 140 in the direction perpendicular to the base substrate 110 ranges from 500 Å to 1500 Å. Of course, the embodiments of the present disclosure include this but are not limited thereto, and the size of the isolation structure in a direction perpendicular to the base substrate may be set according to actual conditions.

For example, the material of the pixel definition layer may include an organic material such as polyimide, acrylic or polyethylene terephthalate.

In some examples, as illustrated in FIG. 15, a plurality of first color sub-pixels 201 and a plurality of third color sub-pixels 203 are alternately arranged along the first direction and the second direction to form a plurality of first pixel rows 310 and a plurality of first pixel columns 320, a plurality of second color sub-pixels 202 are arranged in an array along the first direction and the second direction to form a plurality of second pixel rows 330 and a plurality of second pixel columns 340, the plurality of first pixel rows 310 and the plurality of second pixel rows 330 are alternately arranged along the second direction and staggered from each other in the first direction, and the plurality of first pixel columns 320 and the plurality of second pixel columns 340 are alternately arranged along the first direction and are staggered from each other in the second direction. The isolation structure 140 is located between the adjacent first color sub-pixel 201 and third color sub-pixel 203, and/or, the isolation structure 140 is located between the adjacent second color sub-pixel 202 and third color sub-pixel 203, and/or, the isolation structure 140 is located between the adjacent first color sub-pixels 201 and second color sub-pixel 202.

In some examples, the luminous efficiency of the third color sub-pixel is smaller than the luminous efficiency of the second color sub-pixel.

For example, the first color sub-pixel 201 is configured to emit red light, the second color sub-pixel 202 is configured to emit green light, and the third color sub-pixel 203 is configured to emit blue light. Of course, the embodiments of the present disclosure include this but are not limited thereto.

In some examples, as illustrated in FIG. 15, an area of the orthographic projection of the effective light emitting region of the third color sub-pixel 203 on the base substrate 110 is larger than an area of the orthographic projection of the effective light emitting region of the first color sub-pixel 201 on the base substrate 110; the area of the orthographic projection of the effective light emitting region of the first color sub-pixel 201 on the base substrate 110 is larger than an area of the orthographic projection of the effective light emitting region of the second color sub-pixel 202 on the base substrate 110. Of course, the embodiments of the present disclosure include this but are not limited thereto, and the area of the effective light emitting region of each sub-pixel can be set according to actual needs.

In some examples, as illustrated in FIG. 15 and FIG. 16, the display substrate 100 further includes a planarization layer 180, a plurality of data lines 191 and a plurality of power supply lines 192; the planarization layer 180 is located on a side of the first electrode 131 close to the base substrate 110, that is, the first electrode 131 is disposed on a side of the planarization layer 180 away from the base substrate 110; the plurality of data lines 191 are located between the planarization layer 180 and the base substrate 110, and the plurality of data lines 191 extend along the first direction and are arranged along the second direction, the first direction and the second direction intersect with each other; the plurality of power supply lines 192 are located between the planarization layer 180 and the base substrate 110, and the plurality of power supply lines 192 extend along the first direction and are arranged along the second direction; the isolation structure 140 is overlapped with at least one of the data lines 191 and the power supply lines 192 in a direction perpendicular to the base substrate 110.

In some examples, as illustrated in FIG. 15, the plurality of data lines 191 and the plurality of power supply lines 192 are arranged alternately.

FIG. 17A is a schematic partial cross-sectional view of another display substrate provided by an embodiment of the present disclosure. As illustrated in FIG. 17A, the display substrate 100 further includes a planarization layer 180 and a protection structure 270; the planarization layer 180 is located between the base substrate 110 and the first electrode 131; and the protection structure 270 is located between the planarization layer 180 and the first electrode 131.

In the manufacturing process of the display substrate, the isolation structure is formed after the planarization layer is formed, and an etching process is required to form the isolation structure; although the etching process is selective, the etching process still has an adverse effect on the flatness of the planarization layer, resulting in that the flatness of the first electrode formed on the planarization layer is poor, thereby affecting the display effect. However, in the display substrate shown in FIG. 17, through forming the protection structure between the planarization layer and the first electrode, the planarization layer under the first electrode can be protected and avoided from being etched during the etching process of the isolation structure, thereby ensuring the flatness of the planarization layer under the first electrode, and further ensuring the flatness of the first electrode and improving the display quality.

In some examples, as illustrated in FIG. 17A, the protection structure 270 and the isolation structure 140 are disposed in the same layer. Therefore, while forming the protection structure 270, the protection structure 270 can protect the planarization layer below the first electrode to avoid etching the planarization layer. In addition, it is not necessary to add an additional film layer or additional mask process for forming the protection structure, thereby reducing the cost.

In some examples, the protection structure and the isolation structure are formed using the same material through the same patterning process.

In some examples, as illustrated in FIG. 17A, an orthographic projection of the first electrode 131 on the base substrate 110 falls within an orthographic projection of the protection structure 270 on the base substrate 110. As such, the protection structure 270 can fully protect the planarization layer under the first electrode, thereby ensuring the flatness of the entire first electrode.

FIG. 17B is a cross-sectional electron microscope view of a display substrate provided by an embodiment of the present disclosure. As illustrated in FIG. 17B, in the arrangement direction of adjacent sub-pixels 200, an edge of the isolation structure 140 at a side in the arrangement direction is located between the pixel definition layer 150 and the base substrate 110, while an edge of the isolation structure 140 at another side in the arrangement direction is located in the pixel spacing opening. In this case, the edge of the isolation structure at one side can have the isolation function, while the edge at another side is covered by the pixel definition layer. The second electrode is also only disconnected once at the edge of the isolation structure in the pixel spacing opening, and not disconnected twice at two sides of the isolation structure in the arrangement direction of adjacent sub-pixels. Therefore, the continuity of the second electrode can be better maintained, so that the cathode signal can be better transmitted. At least one embodiment of the present disclosure further provides a display device. FIG. 18 is a schematic view of a display device provided by an embodiment of the present disclosure. As illustrated in FIG. 18, the display device 500 further includes a display substrate 100. In the display substrate, an isolation structure is disposed between adjacent sub-pixels, and the charge generation layer in the light emitting functional layer is disconnected at the position where the isolation structure is located, so as to prevent the charge generation layer with high conductivity from causing crosstalk between adjacent sub-pixels. Therefore, the display device including the display substrate can also avoid crosstalk between adjacent sub-pixels, thus having a higher product yield and higher display quality.

On the other hand, because the display substrate can increase the pixel density while adopting a tandem EL design. Therefore, the display device including the display substrate has the advantages of long life, low power consumption, high brightness, high resolution and the like.

For example, the display device may be a display device such as an organic light emitting diode display device, or any product or component with a display function, such as a TV, a digital camera, a mobile phone, a watch, a tablet computer, a notebook computer, a navigator, etc. that include the display device, but the embodiments are not limited thereto.

An embodiment of the present disclosure further provides a method for manufacturing a display substrate, which is used for manufacturing the above-mentioned display substrate. The manufacturing method includes: forming a plurality of first electrodes on the base substrate; forming an isolation structure on the base substrate; forming a light emitting functional layer on a side of the isolation structure and the plurality of first electrodes away from the base substrate, and the light emitting functional layer includes a conductive sub-layer; and forming a second electrode on a side of the light emitting functional layer away from the base substrate, the second electrode, the light emitting functional layer and the plurality of first electrodes form light emitting elements of a plurality of sub-pixels, and the isolation structure is located between adjacent sub-pixels, the conductive sub-layer in the light emitting functional layer is disconnected at the position where the isolation structure is located, and the plurality of sub-pixels include a plurality of first color sub-pixels, a plurality of second color sub-pixels, and a plurality of third color sub-pixels. The isolation structure includes a plurality of ring-shaped isolation parts, and each ring-shaped isolation part surrounds one of one first color sub-pixel, one second color sub-pixel and one third color sub-pixel.

An embodiment of the disclosure provides a display substrate. FIG. 19 is a schematic partial cross-sectional view of a display substrate provided by an embodiment of the present disclosure. As illustrated in FIG. 19, the display substrate 100 includes a base substrate 110 and a plurality of sub-pixels 200; the plurality of sub-pixels 200 are located on the base substrate 110, and each sub-pixel 200 includes a light emitting element 210; each light emitting element 210 includes a light emitting functional layer 120 and a first electrode 131 and a second electrode 132 located on two sides of the light emitting functional layer 120, the first electrode 131 is located between the light emitting functional layer 120 and the base substrate 110; the second electrode 132 is at least partially located on a side of the light emitting functional layer 120 away from the first electrode 131; that is to say, the first electrode 131 and the second electrode 132 are located on two sides of the light emitting functional layer 120 in a direction perpendicular to the light emitting functional layer 120. The light emitting functional layer 120 includes a plurality of sub-functional layers, and the plurality of sub-functional layers include a conductive sub-layer 129 with relatively high conductivity. It should be noted that, the above-mentioned light emitting functional layer does not only include a film layer that directly emit light, but also includes functional film layer(s) used to assist light emission, such as a hole transport layer, an electron transport layer, or the like.

For example, the conductive sub-layer 129 may be a charge generation layer. For example, the first electrode 131 may be an anode, and the second electrode 132 may be a cathode. For example, the cathode may be formed of a material with high conductivity and low work function; for example, the cathode may be made of a metal material. For example, the anode may be formed of a transparent conductive material with high work function.

As illustrated in FIG. 19, the display substrate 100 further includes an isolation structure 140, and the isolation structure 140 is located on the base substrate 110 and between adjacent sub-pixels 200; the charge generation layer 129 in the light emitting functional layer 120 is disconnected at the location where the isolation structure 140 is located. It should be noted that the above-mentioned "adjacent sub-pixels" means two sub-pixels without other sub-pixels disposed therebetween.

In the display substrate provided by the embodiments of the present disclosure, through disposing the isolation structure between adjacent sub-pixels, and disconnecting the charge generation layer in the light emitting functional layer at the location of the isolation structure, crosstalk between adjacent sub-pixels due to the charge generation layer with high conductivity is avoided. On the other hand, since the display substrate can avoid crosstalk between adjacent sub-pixels through the isolation structure, the display substrate can increase pixel density while adopting a tandem EL design. Therefore, the display substrate can have the advantages of long life, low power consumption, high brightness, and high resolution.

In some examples, as illustrated in FIG. 19, each isolation structure 140 includes a first sub-isolation structure 741 and a second sub-isolation structure 742 that are stacked; the first sub-isolation structure 741 is located between the second sub-isolation structure 742 and the base substrate 110, the material of the second sub-isolation structure 742 includes an inorganic non-metallic material.

In some examples, as illustrated in FIG. 19, along the arrangement direction of the adjacent sub-pixels 200, in the isolation structure 140 between the adjacent sub-pixels 200, the edge of the second sub-isolation structure 742 extends beyond the edge of the first sub-isolation structure 741 to form an isolation protrusion part 7420. At least one of the plurality of sub-functional layers included in the light emitting functional layer 120 is disconnected at the isolation protrusion part 7420. In the embodiments of the present disclosure, through disposing an isolation structure between adjacent sub-pixels in the display substrate, at least one layer of the light emitting functional layer can be disconnected at the isolation protrusion part of the second sub-isolation structure, which contributes to reducing the probability of crosstalk between adjacent sub pixels.

For example, as illustrated in FIG. 19, the plurality of sub-pixels 200 may include two adjacent sub-pixels 200. For example, at least one edge of the second sub-isolation structure 742 protrudes from the corresponding edge of the first sub-isolation structure 741 to form at least one isolation protrusion part 7420.

For example, as illustrated in FIG. 19, edges of the second sub-isolation structure 742 on two sides both protrude from the corresponding edges of the first sub-isolation structure 741 to form two isolation protrusion parts 7420.

FIG. 19 schematically illustrates that one isolation structure 140 is disposed between two adjacent sub-pixels 200, and the isolation structure 140 includes two isolation protrusion parts 7420, but the disclosure is not limited thereto, two or more isolation structures may also be disposed between two adjacent sub-pixels, and each isolation structure includes at least one isolation protrusion part, through setting the number of isolation structure(s) and the number of isolation protrusion part(s), at least one sub-functional layer of the light emitting functional layer can be disconnected by the isolation structure.

For example, as illustrated in FIG. 19, an orthographic projection of a surface of the first sub-isolation structure 741 facing the second sub-isolation structure 742 on the base substrate 110 is completely within an orthographic projection of a surface of the second sub-isolation structure 742 facing the base substrate 110 on the base substrate 110. For example, the size of the second sub-isolation structure 742 in the arrangement direction of the adjacent sub-pixels is greater than the size of the surface of the first sub-isolation structure 741 facing the second sub-isolation structure 742 in the arrangement direction of the adjacent sub-pixels.

For example, as illustrated in FIG. 19, in a direction perpendicular to the base substrate 110, the thickness of the first sub-isolation structure 741 is greater than the thickness of the second sub-isolation structure 742.

For example, as illustrated in FIG. 19, the light emitting functional layer 120 may include a first light emitting layer 121, a charge generation layer (CGL) 129 and a second light emitting layer 122 that are stacked. The charge generation layer 129 is located between the first light emitting layer 121 and the second light emitting layer 122. The charge generation layer has strong conductivity, which can make the light emitting functional layer have the advantages of long life, low power consumption and high brightness. For example, compared with the light emitting functional layer without the charge generation layer, the luminous brightness of the sub-pixel can be increased by nearly double through disposing the charge generation layer in the light emitting functional layer.

For example, in each sub-pixel 200, the light emitting functional layer 120 may further include a hole injection layer (HIL), a hole transport layer (HTL), an electron transport layer (ETL) and an electron injection layer (EIL).

For example, the hole injection layer, the hole transport layer, the electron transport layer, the electron injection layer, and the charge generation layer are all film layers shared by the plurality of sub-pixels, and may be referred to as common layers. For example, at least one sub-functional layer in the light emitting functional layer disconnected at the isolation protrusion part may be at least one of the above-mentioned common layers. Through disconnecting at least one sub-functional layer in the common layers at the isolation protrusion part between adjacent sub-pixels, it is advantageous for reducing the probability of crosstalk between adjacent sub-pixels.

For example, in the same one sub-pixel 200, the first light emitting layer 121 and the second light emitting layer 122 may be light emitting layers that emit light of the same color. For example, the first light emitting layers 121 (or the second light emitting layers 122) in the sub-pixels 200 emitting light of different colors emit light of different colors. Of course, the embodiments of the present disclosure are not limited thereto. For example, in the same one sub-pixel 200, the first light emitting layer 121 and the second light emitting layer 122 may be light emitting layers that emit light of different colors, through disposing light emitting layers that emit lights of different colors in a same one sub-pixel 200, the lights emitted by multi-layers of light emitting layers in the sub-pixel 200 can be mixed into a white light, and the color of the light emitted by each sub-pixel can be adjusted by setting a color filter layer.

For example, in adjacent sub-pixels 200, the light emitting layers located on the same side of the charge generation layer 129 may be spaced apart from each other, or may be overlapped or connected at the gap between two sub-pixels 200, which is not limited by the embodiments of the present disclosure.

For example, the material of the charge generation layer 129 may be the same as that of the electron transport layer. For example, the material of the electron transport layer may include an aromatic heterocyclic compound, such as an imidazole derivative such as a benzimidazole derivative, an imidazopyridine derivative, a benzimidazole phenanthridine derivative; an zine derivative such as a pyrimidine derivative, a triazine derivatives, etc.; a compound containing nitrogen-containing six-membered ring structure (also include a compound with a phosphine oxide-based substituent on a heterocycle), such as a quinoline derivative, an isoquinoline derivative, a phenanthroline derivative, etc.

For example, the material of the charge generation layer 129 may be a material containing a phosphoxy group, or a material containing triazine.

For example, in the case that the isolation structure 140 is not disposed between the two adjacent sub-pixels 200, the common layers such as the charge generation layer 129 in the light emitting functional layer 120 of the two adjacent sub-pixels 200 may be connected or be an entire film layer, such as the charge generation layer 129 with relatively high conductivity, in terms of a display device with high resolution, the high conductivity of the charge generation layer 129 may easily cause crosstalk between adjacent sub-pixels 200.

In the display substrate provided by the embodiments of the present disclosure, through disposing the isolation structure with the isolation protrusion part between two adjacent sub-pixels, at least one layer of the light emitting functional layer formed at the isolation protrusion part can be disconnected. In this case, at least one film layer (such as the charge generation layer) in the light emitting functional layer of the two adjacent sub-pixels is disposed at interval, which can increase the resistance of the light emitting functional layer between adjacent sub-pixels, thereby reducing the probability of crosstalk between adjacent sub pixels, and the normal display of sub-pixels would not be affected at the same time.

For example, as illustrated in FIG. 19, the material of the second sub-isolation structure 742 may include any one or more of silicon nitride, silicon oxide, or silicon oxynitride.

For example, as illustrated in FIG. 19, the second electrode 132 in the plurality of sub-pixels 200 may be a common electrode shared by the plurality of sub-pixels 200. In the case where the isolation structure 140 is not disposed between two adjacent sub-pixels, the second electrode 132 is an entire film layer.

For example, as illustrated in FIG. 19, the size of the isolation protrusion part 7420 may be in the range of 0.1 microns to 5 microns. For example, the size of the isolation protrusion 7420 may be in the range of 0.2 microns to 2 microns.

For example, as illustrated in FIG. 19, in the direction perpendicular to the base substrate 110, the ratio of the thickness of the isolation structure 140 to the thickness of the light emitting functional layer 120 is 0.8 to 1.2. For example, the ratio of the thickness of the isolation structure 140 to the thickness of the light emitting functional layer 120 is 0.9 to 1.1. For example, in a direction perpendicular to the base substrate 110, the thickness of the second sub-isolation structure 742 may be 100 angstroms to 10000 angstroms. For example, the thickness of the second sub-isolation structure 742 may be 200 angstroms to 1500 angstroms. For example, in a direction perpendicular to the base substrate 110, the thickness of the first sub-isolation structure 741 may be 100 angstroms to 10000 angstroms. For example, the thickness of the first sub-isolation structure 741 may be 200 angstroms to 2000 angstroms. In an example of the embodiments of the present disclosure, the thickness of the isolation structure can be set, for example, the ratio of the thickness of the isolation structure to the thickness of the light emitting functional layer may be set to be 0.8 to 1.2, so that the light emitting functional layer 120 is disconnected at the isolation protrusion part 7420 of the isolation structure 140, while the second electrode 132 remains continuous without being interrupted, so as to prevent crosstalk between adjacent sub-pixels, and at the same time, the second electrode is not interrupted, and the display uniformity is ensured.

For example, the thickness of the isolation structure 140 may be 300 angstroms to 5000 angstroms, the above-mentioned thickness (300 angstroms to 5000 angstroms) of the isolation structure 140 can certainly make the light emitting functional layer 120 be disconnected at the edge of the isolation structure, and whether the second electrode 132 is disconnected can be further determined depending on the thickness of the isolation structure 140.

In the embodiments of the present disclosure, through setting the thickness of the isolation structure and the size of the isolation protrusion part, at least one film layer of the light emitting functional layer can be disconnected at the isolation protrusion part.

FIG. 20 is a schematic view illustrating a partial cross-sectional structure of a display substrate provided according to another example of an embodiment of the present disclosure. The difference between the display substrate in the example shown in FIG. 20 and the display substrate in the example shown in FIG. 19 lies in that, the thicknesses of the isolation structures are different. The thickness of the isolation structure 140 in the display substrate shown in FIG. 20 is greater than the thickness of the isolation structure 140 in the display substrate shown in FIG. 19. For example, as illustrated in FIG. 20, both the light emitting functional layer and the second electrode are disconnected at the isolation protrusion part of the isolation structure, for example, through setting the thickness of the isolation structure 140 to be relatively large (for example, the ratio of the thickness of the isolation structure to the thickness of the light emitting functional layer is greater than 1.5).

For example, FIG. 19 schematically illustrates that all the film layers included in the light emitting functional layer 120 are disconnected at the isolation protrusion part 7420 of the isolation structure 140, and the second electrode 132 is not disconnected at the isolation protrusion part 7420 of the isolation structure 140. However, the disclosure is not limited thereto, in other examples, the thickness of the isolation structure may be set so that part of the film layers in the light emitting functional layer at the side close to the base substrate is disconnected at the isolation protrusion part, and part of the film layers in the light emitting functional layer at the side away from the base substrate is not disconnected at the isolation protrusion part, and the second electrode is not disconnected at the isolation protrusion part.

For example, as illustrated in FIG. 19, the material of the first sub-isolation structure 741 includes an organic material.

For example, as illustrated in FIG. 19, the display substrate further includes an organic layer 180 located between the second sub-isolation structure 742 and the base substrate 110. The organic layer 180 may serve as a planarization layer.

For example, as illustrated in FIG. 19, the first sub-isolation structure 741 and the organic layer 180 may be an integrated structure. For example, the first sub-isolation structure 741 may be a portion of the organic layer 180. For example, the first sub-isolation structure 741 may be a portion of the organic layer 180 that protrudes toward a side away from the base substrate 110.

For example, as illustrated in FIG. 19, the organic layer 180 includes a planarization (PLN) layer. For example, the material of the first sub-isolation structure 741 includes a material such as photoresist, polyimide (PI) resin, acrylic resin, silicon compound or polyacrylic resin.

For example, as illustrated in FIG. 19, a first cross-section of the first sub-isolation structure 741 taken along a plane along the arrangement direction of the adjacent sub-pixels 200 and perpendicular to the base substrate 110 includes a rectangle. For example, a first cross-section of the first sub-isolation structure 741 taken along a plane along the arrangement direction of the adjacent sub-pixels 200 and perpendicular to the base substrate 110 includes a trapezoid, and an included angle between a lateral side of the trapezoid and a base of the trapezoid close to the base substrate 110 is not greater than 90 degrees.

For example, as illustrated in FIG. 19, the cross section of the first sub-isolation structure 741 may be trapezoid, an upper base of the trapezoid is located on a side of a lower base of the trapezoid away from the base substrate 110, and an included angle between the lateral side of the trapezoid and the lower base is not greater than 90 degrees.

For example, as illustrated in FIG. 19, a length of the upper base of the trapezoidal cross-section of the first sub-isolation structure 741 is less than a length of the side of the cross-section of the second sub-isolation structure 742 close to the base substrate 110, so that the edge of the second sub-isolation structure 742 and the edge of the upper base of the first sub-isolation structure 741 form an undercut structure, that is, the edge of the second sub-isolation structure 742 includes the isolation protrusion part 7420.

FIG. 19 schematically illustrates that the lateral side of the first sub-isolation structure 741 is a straight side, but the disclosure is not limited thereto. In the actual process, the side of the formed first sub-isolation structure 741 may also be a curved side, for example, the curved side bends toward a side away from a center of the first sub-isolation structure 741 where it is located, or the curved side bends toward a side close to the center of the first sub-isolation structure 741 where it is located. In this case, the included angle between the curved side and the lower base of the first sub-isolation structure 741 may refer to the included angle between the tangent line at the midpoint of the curved side and the lower base, or the included angle between the lower base and the tangent line at the intersection point of the curved side and the lower base.

For example, as illustrated in FIG. 19, a second cross-section of the second sub-isolation structure 742 taken along a plane along the arrangement direction of the adjacent sub-pixels 200 and perpendicular to the base substrate 110 includes a rectangle or a trapezoid. For example, FIG. 19 schematically illustrates that the shape of the second cross-section of the second sub-isolation structure 742 is a rectangle. An included angle between a shorter side of the second cross-section of the second sub-isolation structure

742 and a longer side thereof close to the base substrate 110 is set to be a right angle or approximately right angle (for example, an approximately right angle may represent that the difference between the included angle of two sides and 90 degrees is not greater than 10 degrees), which can facilitate the disconnection of the light emitting functional layer 120 at the edge of the second sub-isolation structure 742.

For example, the shape of the second cross-section of the second sub-isolation structure 742 taken along a plane along the arrangement direction of the adjacent sub-pixels and perpendicular to the base substrate 110 may be a trapezoid, and an included angle between the lateral side of the trapezoid and the base of the trapezoid away from the base substrate 110 is not less than 70 degrees. In the embodiment of the present disclosure, through setting the included angle between the lateral side of the trapezoid of the second sub-isolation structure 742 and the base of the trapezoid away from the base substrate, the light emitting functional layer 120 can be disconnected at the edge of the second sub-isolation structure 742.

For example, the shape of second cross-section of the second sub-isolation structure 742 may be a trapezoid, and a length of a base of the trapezoid away from the base substrate 110 is smaller than a length of a base of the trapezoid close to the base substrate 110.

FIG. 21A is a schematic view illustrating a partial cross-sectional structure of a display substrate provided according to another example of an embodiment of the present disclosure. The difference between the display substrate shown in FIG. 21A and the display substrate shown in FIG. 19 lies in that the shape of first cross-section of the first sub-isolation structure 741 taken along a plane along the arrangement direction of the adjacent sub-pixels 200 and perpendicular to the base substrate 110 is different. For example, as illustrated in FIG. 21A, the shape of the first cross-section of the first sub-isolation structure 741 taken along a plane perpendicular to the base substrate 110 may be a rectangle, and the shape of the first cross-section of the second sub-isolation structure 742 taken along a plane perpendicular to the base substrate 110 is also a rectangle, which can facilitate the disconnection of the light emitting functional layer 120 at the edge of the isolation structure 140.

FIG. 21B is a schematic view illustrating a partial cross-sectional structure of a display substrate provided according to another example of an embodiment of the present disclosure. The difference between the display substrate shown in FIG. 21B and the display substrate shown in FIG. 21A lies in that the shape of first cross-section of the first sub-isolation structure 741 taken along a plane along the arrangement direction of the adjacent sub-pixels 200 and perpendicular to the base substrate 110 is different. For example, as illustrated in FIG. 21A, the shape of the first cross-section of the first sub-isolation structure 741 taken along a plane perpendicular to the base substrate 110 may be a trapezoid, and a length of a base of the trapezoid away from the base substrate 110 is greater than a length of a base of the trapezoid close to the base substrate 110, which can facilitate the disconnection of the light emitting functional layer 120 at the edge of the isolation structure 140.

For example, as illustrated in FIG. 19 to FIG. 21B, the first electrode 131 is in contact with a surface of the organic layer 180 at a side away from the base substrate 110. For example, the first electrode 131 may be an anode, and the second electrode 132 may be a cathode. For example, the cathode may be formed of a material with high conductivity and low work function, for example, the cathode may be made of a metal material. For example, the anode may be formed of a transparent conductive material having a high work function.

For example, as illustrated in FIG. 19 to FIG. 21B, the display substrate further includes a pixel definition layer 150 located on a side of the organic layer 180 away from the base substrate 110. The pixel definition layer 150 includes a plurality of first openings 152, and the plurality of first openings 152 are disposed in one-to-one correspondence with the plurality of sub-pixels 200 to define light emitting regions of the plurality of sub-pixels 200, and the first openings 152 are configured to expose the first electrodes 131. For example, at least a portion of the first electrode 131 is located between the pixel definition layer 150 and the base substrate 110. For example, in the case that the light emitting functional layer 120 is formed in the first opening 152 of the pixel definition layer 150, the first electrode 131 and second electrode 132 located on two sides of the light emitting functional layer 120 can drive the light emitting functional layer 120 in the first opening 152 to emit light. For example, the above-mentioned light emitting region may refer to the region where the sub-pixel effectively emits light, and the shape of the light emitting region refers to a two-dimensional shape, for example, the shape of the light emitting region may be the same as the shape of the first opening 152 of the pixel definition layer 150.

For example, as illustrated in FIG. 19 to FIG. 21B, a portion of the pixel definition layer 150 other than the first opening 152 is a pixel definition part, and the material of the pixel definition part may include polyimide, acrylic or polyethylene terephthalate, or the like.

For example, as illustrated in FIG. 19 to FIG. 21B, the pixel definition layer 150 further includes a plurality of second openings 154 configured to expose the isolation structures 140. For example, a gap is provided between the isolation structure 140 and the pixel definition part of the pixel definition layer 150.

For example, as illustrated in FIG. 19 to FIG. 21B, the second sub-isolation structure 742 includes at least one isolation layer. For example, the second sub-isolation structure 742 may include a single-layer isolation layer, and the material of the single-layer film layer may be silicon oxide or silicon nitride. For example, the second sub-isolation structure 742 may include two layers of isolation layers, and the materials of the two isolation layers may be silicon oxide and silicon nitride respectively. The embodiment of the present disclosure is not limited thereto, the second sub-isolation structure may include three or more isolation layers, and the number of isolation layers included in the second sub-isolation structure may be set according to product requirements.

For example, as illustrated in FIG. 19 to FIG. 21B, along a direction perpendicular to the base substrate 110, the thickness of the isolation structure 140 is less than the thickness of the pixel definition part.

For example, as illustrated in FIG. 19 to FIG. 21B, along a direction parallel to the base substrate 110, the dimension of the isolation protrusion part 7420 is not less than 0.01 μm. For example, along a direction parallel to the base substrate 110, the dimension of the isolation protrusion part 7420 is not less than 0.1 μm. For example, along a direction parallel to the base substrate 110, the dimension of the isolation protrusion part 7420 may be 0.01 μm to 5 μm. For example, along a direction parallel to the base substrate 110, the dimension of the isolation protrusion part 7420 may be 0.05 μm to 4 μm. For example, along a direction parallel to the base substrate 110, the dimension of the isolation protrusion part 7420 may be 0.1 μm to 2 μm.

For example, as illustrated in FIG. 19 to FIG. 21B, the second cross-section of the second sub-isolation structure 742 taken along a plane along the arrangement direction of the adjacent sub-pixels 200 and perpendicular to the base substrate 110 includes a rectangle or a trapezoid. For example, the shape of the second cross-section of the second sub-isolation structure 742 is a rectangle. An included angle between a shorter side of the second cross-section of the second sub-isolation structure 742 and a longer side thereof close to the base substrate 110 is set to be a right angle or approximately right angle (for example, an approximately right angle may represent that the difference between the included angle of two sides and 90 degrees is not greater than 10 degrees), which can facilitate the disconnection of the light emitting functional layer 120 at the edge of the second sub-isolation structure 742.

For example, the second cross-section of the second sub-isolation structure 742 may be a trapezoid, and an included angle between the lateral side of the trapezoid and the base of the trapezoid at the side close to the base substrate 110 is not less than 70 degrees. For example, the second cross-section may be a trapezoid, and an included angle between the lateral side of the trapezoid and the base of the trapezoid at the side close to the base substrate 110 is not less than 90 degrees, so that the included angle between the lateral side of the second sub-isolation structure 742 and the base of the trapezoid at the side away from the base substrate 110 is an acute angle, which can facilitate the disconnection of the light emitting functional layer 120 at the edge of the second sub-isolation structure 742.

For example, the display substrate further includes a pixel circuit, and the first electrode 131 of the organic light emitting element 210 may be connected to one of the source electrode and drain electrode of the thin film transistor in the pixel circuit through a via hole penetrating through a film layer such as the organic layer 180. For example, the pixel circuit further includes a storage capacitor. For example, film layers or structures such as a gate insulating layer, an interlayer insulating layer, various film layers in the pixel circuit, data lines, gate lines, power signal lines, reset power signal lines, reset control signal lines, light emitting control signal lines, etc., may be further disposed between the organic layer 180 and the base substrate 110. For example, a film layer between the organic layer 180 and the base substrate 110 may include one layer of power signal lines, or may include two layers of power signal lines. For example, a surface of the organic layer 180 at a side facing the base substrate 110 may be in contact with the interlayer insulating layer.

For example, a spacer may be further disposed on a side of the pixel definition part of the pixel definition layer 150 away from the base substrate 110, and the spacer is configured to support an evaporation mask for forming the light emitting layer.

For example, an embodiment of the present disclosure provides a manufacturing method for forming the display substrate shown in FIG. 19, which includes: forming a plurality of sub-pixels 200 on the base substrate 110, wherein forming the sub-pixel 200 includes sequentially forming a first electrode 131, a light emitting functional layer 120, and a second electrode 132 stacked in a direction perpendicular to the base substrate 110; forming a first material layer on the base substrate 110; forming a second material layer on the first material layer, and the second material layer is an inorganic non-metallic material layer;

simultaneously patterning the first material layer and the second material layer to form an isolation structure 140. Forming the isolation structure 140 includes patterning the second material layer to form the second sub-isolation structure 742, and at the same time, a portion of the first material layer directly below the second sub-isolation structure 742 is etched to form the first sub-isolation structure 741; in the isolation structure 140 between adjacent sub-pixels 200, an edge of the second sub-isolation structure 742 protrudes from an edge of the first sub-isolation structure 741 in the arrangement direction of adjacent sub-pixels 200, so as to form an isolation protrusion part 7420; the light emitting functional layer 120 is formed after the isolation structure 140 is formed, and the light emitting functional layer 120 includes a plurality of film layers, at least one of the plurality of film layers is disconnected at the isolation protrusion part 7420.

For example, the second material layer is an organic material layer, and simultaneously patterning the first material layer and the second material layer to form the isolation structure 140 includes: while etching the second material layer by dry etching to form the second sub-isolation structure 742, a portion of the organic material layer directly below the second sub-isolation structure 742 is dry-etched to form the first sub-isolation structure 741.

For example, FIG. 22A to FIG. 22D are schematic views illustrating the method flow for manufacturing the display substrate before forming the display substrate shown in FIG. 19. As illustrated in FIG. 19 and FIG. 22A to FIG. 22D, the manufacturing method of the display substrate includes the following processes: a plurality of sub-pixels 200 is formed on the base substrate 110, wherein forming the sub-pixel 200 includes sequentially forming a first electrode 131, a light emitting functional layer 120 and a second electrode 132 stacked in a direction perpendicular to the base substrate 110; an organic material layer 020 (i.e., a first material layer) is formed on the base substrate 110; an inorganic non-metallic material 030 (i.e. a second material layer) is formed on the organic material layer 020; while the inorganic non-metallic material layer 030 is patterned to form the second sub-isolation structure 742, a portion of the organic material layer 020 located directly below the second sub-isolation structure 742 in the organic material layer 020 is etched to form the first sub-isolation structure 741. The isolation structure 140 includes the first sub-isolation structure 741 and the second sub-isolation structure 742, in the isolation structure 140 between adjacent sub-pixels 200, an edge of the second sub-isolation structure 742 protrudes from an edge of the first sub-isolation structure 741 in the arrangement direction of adjacent sub-pixels 200 to form an isolation protrusion part 7420; the light emitting functional layer 120 is formed after the isolation structure 140 is formed, the light emitting functional layer 120 includes a plurality of film layers, and at least one of the plurality of film layers is disconnected at the isolation protrusion part 7420.

For example, as illustrated in FIG. 19 and FIG. 22A, the manufacturing method of the display substrate may include the following processes. A base substrate 110 may be formed on a glass carrier. For example, the base substrate 110 may be a flexible base substrate. For example, forming the base substrate 110 may include sequentially forming a first flexible material layer, a first inorganic material layer, a semiconductor layer, a second flexible material layer and a second inorganic material layer stacked on a glass carrier. The materials of the first flexible material layer and the second flexible material layer may use materials such as, such as polyimide (PI), polyethylene terephthalate (PET), or surface-treated polymer soft films. The materials of the first inorganic material layer and the second inorganic material layer may use silicon nitride (SiNx) or silicon oxide (SiOx), or the like, which are used to improve the water and oxygen resistance of the base substrate. The first inorganic material layer, the second inorganic material layer may also be referred to as barrier layers.

For example, before forming the organic material layer 020, a driving structure layer of a pixel circuit may be formed on the base substrate 110. The driving structure layer includes a plurality of pixel circuits, and each pixel circuit includes a plurality of transistors and at least one storage capacitor. For example, the pixel circuit may adopt a 2T1C, 3T1C or 7T1C design. For example, forming the driving structure layer may include the following processes: a first insulating film and an active layer film are sequentially deposited on the base substrate 110, and the active layer film is patterned by a patterning process, so as to form a first insulating layer covering the entire base substrate 110, and an active layer pattern disposed on the first insulating layer, the active layer pattern at least includes an active layer. For example, a second insulating film and a first metal film are sequentially deposited, and the first metal film is patterned by a patterning process, so as to form a second insulating layer covering the active layer pattern, and a first gate metal layer pattern disposed on the second insulating layer, the first gate metal layer pattern at least includes a gate electrode and a first capacitor electrode. For example, a third insulating film and a second metal film are sequentially deposited, and the second metal film is patterned by a patterning process, so as to form a third insulating layer covering the first gate metal layer, and a second gate metal layer pattern disposed on the third insulating layer, the second gate metal layer pattern at least includes a second capacitor electrode, and the position of the second capacitor electrode corresponds to the position of the first capacitor electrode. Thereafter, a fourth insulating film is deposited, and the fourth insulating film is patterned by a patterning process to form a fourth insulating layer covering the second gate metal layer. At least two first via holes are disposed in the fourth insulating layer, the fourth insulating layer, the third insulating layer and the second insulating layer in the two first via holes are etched away to expose the surface of the active layer of the active layer pattern. Thereafter, a third metal film is deposited, and the third metal film is patterned by a patterning process to form a source/drain metal layer pattern on the fourth insulating layer. The source/drain metal layer pattern at least includes a source electrode and a drain electrode located in the display region. The source electrode and the drain electrode may be connected to the active layer in the active layer pattern through the first via holes, respectively.

For example, the above-mentioned first insulating layer, second insulating layer, third insulating layer and fourth insulating layer may use any one or more of silicon oxide (SiOx), silicon nitride (SiNx) and silicon oxynitride (SiON), and may each be a single layer, a multi-layer or a composite layer. The first insulating layer may be a buffer layer, which is used to improve the water and oxygen resistance of the base substrate 110; the second insulating layer and the third insulating layer may be gate insulating (GI) layers; the fourth insulating layer may be an interlayer dielectric (ILD) layer. The first metal film, the second metal film and the third metal film are made of metal materials, such as any one or more of silver (Ag), copper (Cu), aluminum (Al), titanium (Ti) and molybdenum (Mo), or alloy materials of the above metals, such as aluminum-neodymium alloy (AlNd) or molybdenum-niobium alloy (MoNb), may each be a single-layer structure, or a multi-layer composite structure, such as Ti/Al/Ti, etc. The active layer film is made of one or more materials of amorphous indium gallium zinc oxide (a-IGZO), zinc oxynitride (ZnON), indium zinc tin oxide (IZTO), amorphous silicon (a-Si), polysilicon (p-Si), hexathiophene and polythiophene, that is, the present disclosure is applicable to transistors manufactured based on oxide technology, silicon technology and organic technology.

For example, as illustrated in FIG. 22A and FIG. 22B, after the inorganic non-metallic material layer 030 is formed, the inorganic non-metallic material layer 030 is patterned. For example, patterning the inorganic non-metallic material layer 030 includes etching the inorganic non-metallic material layer 030 by dry etching to form the second sub-isolation structure 742, while a portion of the organic material layer 020 directly below the second sub-isolation structure 742 is dry-etched to form the first sub-isolation structure 741. For example, a mask may be used to cover the inorganic non-metallic material layer 030 at the position where the second sub-isolation structure 742 is to be formed, so that the inorganic non-metallic material layer 030 at other positions other than the position where the second sub-isolation structure 742 is to be formed is etched, during the process of dry etching the inorganic non-metallic material layer 030, the etching gas would etch the portion of the organic material layer 020 that is not covered by the mask, so that the organic material layer (i.e. the first sub-isolation structure 741) having a certain thickness is remained directly below the remained inorganic non-metallic material layer (i.e. the second sub partition structure 742) after etching, so that a protrusion part directly below the second sub-isolation structure 742 is formed at the side of the organic material layer 020 away from the base substrate 110, and the protrusion part is the first sub-isolation structure 741.

For example, as illustrated in FIG. 22A and FIG. 22B, in the process of dry etching the inorganic non-metallic material layer 030, the etched thickness of the organic material layer 020 may be 100 angstroms to 10000 angstroms, and the thickness of the formed first sub-isolation structure 741 may be 100 angstroms to 10000 angstroms. For example, in the process of dry etching the inorganic non-metallic material layer 030, the etched thickness of the organic material layer 020 may be 200 angstroms to 2000 angstroms, and the thickness of the formed first sub-isolation structure 741 may be 200 angstroms to 2000 angstroms.

For example, as illustrated in FIG. 19 and FIG. 22C, after the isolation structure 140 is formed, the first electrodes 131 of the sub-pixels are patterned on the planarization layer 180. For example, the first electrodes 131 are connected to drain electrodes of transistors through second via holes in the planarization layer 180.

For example, the first electrode 131 may be made of metal materials, such as any one or more of magnesium (Mg), silver (Ag), copper (Cu), aluminum (Al), titanium (Ti) and molybdenum (Mo), or alloy materials of the above metals, such as aluminum-neodymium alloy (AlNd) or molybdenum-niobium alloy (MoNb), and may be a single-layer structure, or a multi-layer composite structure, such as Ti/Al/Ti, etc., or a stacked structure formed by a metal and a transparent conductive material, such as reflective materials such as ITO/Ag/ITO, Mo/AlNd/ITO, etc.

For example, as illustrated in FIG. 19 and FIG. 22D, after the first electrode 131 is formed, the pixel definition layer 150 may be formed. For example, a pixel definition film is coated on the base substrate 110 formed with the aforementioned pattern, and the pixel definition layer 150 is formed through masking, exposure, and development processes. For example, the pixel definition layer 150 of the display region includes a plurality of pixel definition parts 158, and first openings 152 or second openings 154 are formed between adjacent pixel definition parts 401, and the pixel definition film in the first openings 152 and the second openings 154 is developed away, the first openings 152 exposes at least parts of the surfaces of the first electrodes 131 of the plurality of sub-pixels, and the second openings 154 expose the isolation structure 140.

For example, after the pixel definition layer 150 is formed, spacers may be formed on the pixel definition parts. For example, an organic material film is coated on the base substrate 110 with the aforementioned patterns, and spacers are formed through masking, exposure, and development processes. The spacers may act as a support layer configured to support the fine metal mask (FMM) during an evaporation process.

For example, as illustrated in FIG. 19, after the spacers are formed, the light emitting functional layer 120 and the second electrode 132 are sequentially formed. For example, the second electrode 132 may be a transparent cathode. The light emitting functional layer 120 may emit light at the side away from the base substrate 110 through the transparent cathode, so as to achieve top emission. For example, the second electrode 132 may use any one or more of magnesium (Mg), silver (Ag), aluminum (Al), or an alloy made of any one or more of the above metals, or use a transparent conductive material, such as indium tin oxide (ITO), or a multi-layer composite structure of metal and transparent conductive materials.

For example, forming the light emitting functional layer 120 may include the following processes: a hole injection layer and a hole transport layer are sequentially formed by evaporation using an open mask; first light emitting layers 131 that emits light of different colors (e.g., blue light emitting layers, green light emitting layers, and red light emitting layers) are sequentially formed by evaporation using FMM; an electron transport layer, a charge generation layer 133, and the hole transport layer are sequentially formed by evaporation using an open mask; second light emitting layers 132 that emit light of different colors (e.g., blue light emitting layers, green light emitting layers, and red light emitting layers) are sequentially formed by evaporation using FMM; an electron transport layer, a second electrode and an optical coupling layer are sequentially formed by evaporation using an open mask. For example, the hole injection layer, the hole transport layer, the electron transport layer, the charge generation layer, the second electrode, and the light coupling layer are all common layers of a plurality of sub-pixels.

For example, as illustrated in FIG. 19, the formed light emitting functional layer 120 would be disconnected at the isolation protrusion part 7420 of the isolation structure 140, so that a portion of the light emitting functional layer 120 located in the second opening 154 of the pixel definition layer 150 is located on the isolation structure 140, and another portion of the light emitting functional layer 120 located in the second opening 154 of the pixel definition layer 150 is located on the organic layer 180.

For example, after the second electrode 132 is formed, the manufacturing method of the display substrate further includes forming an encapsulation layer, and the encapsulation layer may include a first encapsulation layer, a second encapsulation layer and a third encapsulation layer that are stacked. The first encapsulation layer is made of an inorganic material and covers the second electrode 132 in the display region. The second encapsulation layer is made of an organic material. The third encapsulation layer is made of an inorganic material and covers the first encapsulation layer and the second encapsulation layer. However, the embodiment is not limited thereto. For example, the encapsulation layer may also adopt a five-layer structure of inorganic/organic/inorganic/organic/inorganic materials.

For example, compared with the display substrate without the isolation structure, the display substrate with the isolation structure provided by the embodiments of the present disclosure only needs to add one masking process, which has a relatively low impact on the process throughput.

FIG. 23 is a schematic view of a partial cross-sectional structure of a display substrate provided according to another example of an embodiment of the present disclosure. The difference between the display substrate in the example shown in FIG. 23 and the display substrate in the example shown in FIG. 19 lies in that, the material of the first sub-isolation structure 741 in the display substrate shown in FIG. 23 includes an inorganic non-metallic material. The sub-pixels 200, the base substrate 110, and the pixel definition layer 150 in the display substrate shown in FIG. 23 have the same features as the sub-pixels 200, the base substrate 110, and the pixel definition layer 150 in the display substrate in any one of the examples shown in FIG. 19 to FIG. 21B, which are not repeated here.

For example, as illustrated in FIG. 23, the material of the first sub-isolation structure 741 is different from that of the second sub-isolation structure 742. For example, the material of the second sub-isolation structure 742 may include any one or more of silicon nitride, silicon oxide, or silicon oxynitride, and the material of the first sub-isolation structure 741 may also include any one or more of silicon nitride, silicon oxide, or silicon oxynitride, and the material of the first sub-isolation structure 741 is different from the material of the second sub-isolation structure 742.

For example, as illustrated in FIG. 23, the plurality of sub-pixels 200 may include two adjacent sub-pixels 200 arranged along the direction in which adjacent sub-pixels are arranged. For example, at least one edge of the second sub-isolation structure 742 protrudes from a corresponding edge of the first sub-isolation structure 741 to form at least one isolation protrusion 7420. For example, as illustrated in FIG. 23, both edges on two sides of the second sub-isolation structure 742 protrude from corresponding edges of the first sub-isolation structure 741 to form two isolation protrusion parts 7420. For example, two isolation protrusion parts 7420 are arranged along the arrangement direction of adjacent sub-pixels.

For example, FIG. 23 schematically illustrates that one isolation structure 140 is provided between two adjacent sub-pixels 200, and the isolation structure 140 includes two isolation protrusion parts 7420, but the disclosure is not limited thereto. Two or more isolation structures may be disposed between adjacent two sub-pixels, and each isolation structure includes at least one isolation protrusion part. Through setting the number of the isolation structure(s) and the number of the isolation protrusion part(s), it is advantaged for the disconnection effect of at least one layer of the light emitting functional layer.

For example, as illustrated in FIG. 23, an orthographic projection of a surface of the first sub-isolation structure 741 facing the second sub-isolation structure 742 on the base substrate 110 is completely within an orthographic projection of a surface of the second sub-isolation structure 742 facing the base substrate 110 on the base substrate 110.

For example, as illustrated in FIG. 23, in a direction perpendicular to the base substrate 110, the thickness of the first sub-isolation structure 741 is greater than the thickness of the second sub-isolation structure 742.

For example, as illustrated in FIG. 23, in a direction perpendicular to the base substrate 110, the thickness of the isolation structure 140 is less than the thickness of the pixel definition part 401. For example, a gap is disposed between the isolation structure 140 and the pixel definition part 401.

For example, as illustrated in FIG. 23, the surface of the organic layer 180 at the side away from the base substrate 110 and exposed by the second opening 154 of the pixel definition layer 150 may be a flat surface, that is, the surface of the organic layer 180 at the side away from the base substrate 110 does not include a protrusion part. For example, as illustrated in FIG. 23, the first sub-isolation structure 741 is disposed on the surface of the organic layer 180 at the side away from the base substrate 110.

For example, as illustrated in FIG. 23, in a direction perpendicular to the base substrate 110, the thickness of the second sub-isolation structure 742 is not greater than the thickness of the light emitting functional layer 120. For example, the thickness of the second sub-isolation structure 742 may be 500 angstroms to 8000 angstroms.

For example, as illustrated in FIG. 23, along the direction perpendicular to the base substrate 110, the ratio of the thickness of the isolation structure 140 to the thickness of the light emitting functional layer 120 is 0.8 to 1.2. For example, the ratio of the thickness of the isolation structure 140 to the thickness of the light emitting functional layer 120 is 0.9 to 1.1. In an example of the embodiments of the present disclosure, the thickness of the isolation structure can be set, for example, the ratio of the thickness of the isolation structure to the thickness of the light emitting functional layer may be set to be 0.8 to 1.2, so that the light emitting functional layer 120 is disconnected at the isolation protrusion part 7420 of the isolation structure 140, while the second electrode 132 remains continuous without being interrupted, so as to prevent crosstalk between adjacent sub-pixels, and at the same time, the second electrode is not interrupted, and the display uniformity is ensured.

For example, FIG. 23 schematically illustrates that all the film layers included in the light emitting functional layer 120 are disconnected at the isolation protrusion part 7420 of the isolation structure 140, but the disclosure is not limited thereto. In another example, a portion of the film layers of the light emitting functional layer 120 is disconnected at the isolation protrusion part 7420 of the isolation structure 140, while another portion of the film layers is continuous at the isolation protrusion part 7420. The film layer disconnected at the isolation protrusion part 7420 may be regarded as a dislocated film layer, and dislocation of the film layer at the isolation protrusion part 7420 is beneficial to reduce lateral crosstalk of the film layer.

Of course, the example illustrated in FIG. 23 is not limited thereto, and the thickness of the isolation structure may also be set to be greater than the thickness of the light emitting functional layer, so that both the light emitting functional layer and the second electrode are disconnected at the edge of the isolation structure.

For example, as illustrated in FIG. 23, a first cross-section of the first sub-isolation structure 741 taken along a plane along the arrangement direction of the adjacent sub-pixels 200 and perpendicular to the base substrate 110 includes a rectangle or a trapezoid. For example, the first cross-section is a trapezoid, and a length of the base of the trapezoid at a side away from the base substrate 110 is greater than a length of the base of the trapezoid at a side close to the base substrate 110. For example, an included angle between the lateral side of the trapezoid and the base of the trapezoid at the side close to the base substrate 110 is not less than 70 degrees. For example, along a direction parallel to the base substrate 110, the dimension of the isolation protrusion part 7420 is not less than 0.01 microns. For example, along a direction parallel to the base substrate 110, the dimension of the isolation protrusion part 7420 is not less than 0.1 micros.

For example, as illustrated in FIG. 23, the dimension of the isolation protrusion part 7420 may be in a range of 0.01 microns to 5 microns. For example, the included angle between the lateral side of the trapezoid and the base of the trapezoid at the side close to the base substrate 110 is not less than 90 degrees. For example, the dimension of the isolation protrusion part 7420 may be in a range of 0.1 microns to 2 microns.

For example, the lateral side of the first sub-isolation structure 741 may be a straight side or a curved side. For example, the curved side bends toward a side close to the center of the first sub-isolation structure 741 where it is located. In this case, the included angle between the curved side of the first sub-isolation structure 741 and the base of the first sub-isolation structure 741 at the side close to the base substrate 100 may refer to the included angle between the tangent line at the midpoint of the curved side and the base, or the included angle between the base and the tangent line at the intersection point of the curved side and the base.

In the embodiments of the present disclosure, through setting the thickness of the isolation structure, the dimension of the isolation protrusion part, and the angle of lateral side of the first sub-isolation structure, at least one film layer of the light emitting functional layer can be disconnected at the isolation protrusion part.

For example, as illustrated in FIG. 23, a second cross-section of the second sub-isolation structure 742 taken along a plane along the arrangement direction of the adjacent sub-pixels 200 and perpendicular to the base substrate 110 includes a rectangle or a trapezoid. For example, the shape of the second cross-section of the second sub-isolation structure 742 is a rectangle. An included angle between a shorter side of the second cross-section of the second sub-isolation structure 742 and a longer side thereof close to the base substrate 110 is set to be a right angle or approximately right angle (for example, an approximately right angle may represent that the difference between the included angle of two sides and 90 degrees is not greater than 10 degrees), which can facilitate the disconnection of the light emitting functional layer 120 at the edge of the second sub-isolation structure 742.

For example, the second cross-section of the second sub-isolation structure 742 may be a trapezoid, and an included angle between the lateral side of the trapezoid and the base of the trapezoid at the side close to the base substrate 110 is not less than 70 degrees. For example, the second cross-section may be a trapezoid, and an included angle between the lateral side of the trapezoid and the base of the trapezoid at the side close to the base substrate 110 is not less than 90 degrees, so that the included angle between the lateral side of the second sub-isolation structure 742 and the base of the trapezoid at the side away from the base substrate 110 is an acute angle, which can facilitate the disconnection of the light emitting functional layer 120 at the edge of the second sub-isolation structure 742.

For example, FIG. 23 schematically illustrates that the first sub-isolation structure 741 includes one film layer, and the second sub-isolation structure 742 includes one film layer, but the disclosure is not limited thereto. At least one of the first sub-isolation structure 741 and the second sub-isolation structure 742 may include a multiple layers of film layers, and at least the edge of the second sub-isolation structure 742 protrudes from the edge of the first sub-isolation structure 741 to form an isolation protrusion part for disconnecting at least one layer of the light emitting functional layer.

In the case that the angle of lateral side of the isolation structure (for example, the included angle between the lateral side of the first cross-section and the base thereof at the side close to the base substrate, and/or, the included angle between the lateral side of the second cross-section and the base thereof at the side close to the base substrate) is relatively large, the thickness of the deposited light emitting functional layer is blanketly reduced, and at least one film layer of the light emitting functional layer located between adjacent sub-pixels is disconnected, so that the resistance of the film layer increases, and crosstalk between adjacent sub-pixels is further reduced.

For example, an embodiment of the present disclosure provides a manufacturing method for forming the display substrate shown in FIG. 23, which includes the following processes: a plurality of sub-pixels 200 are formed on the base substrate 110, wherein forming the sub-pixel 200 include sequentially forming a first electrode 131, a light emitting functional layer 120, and a second electrode 132 stacked in a direction perpendicular to the base substrate 110; a first material layer is formed on the base substrate 110; a second material layer is formed on the first material layer, and the second material layer is an inorganic non-metallic material layer; the first material layer and the second material layer are simultaneously patterned to form the isolation structure 140. Forming the isolation structure 140 includes patterning the second material layer to form the second sub-isolation structure 742, and at the same time, a portion of the first material layer directly below the second sub-isolation structure 742 is etched to form the first sub-isolation structure 741; in the isolation structure 140 between adjacent sub-pixels 200, the edge of the second sub-isolation structure 742 protrudes from the edge of the first sub-isolation structure 741 along the arrangement direction of adjacent sub-pixels to form an isolation protrusion part 7420; the light emitting functional layer 120 is formed after the isolation structure 140 is formed, the light emitting functional layer 120 includes a plurality of film layers, and at least one of plurality of films layers is disconnected at the isolation protrusion part 7420.

For example, the second material layer is an inorganic material layer, and simultaneously patterning the first material layer and the second material layer to form the isolation structure 140 includes the following processes: an etchant having an etching selectivity ratio for the first material layer and the second material layer is used to simultaneously etch the first material layer and the second material layer, wherein the etching rate of the etchant to the first material layer is greater than the etching rate of the etchant to the second material layer, so that the edge of the first sub-isolation structure 741 formed after the first material layer being etched is recessed inward with respect to the edge of the second sub-isolation structure 742 formed after the second material layer being etched, so as to form an undercut structure.

For example, FIG. 24A to FIG. 24D are schematic views illustrating the method flow for manufacturing the display substrate before forming the display substrate shown in FIG. 23. As illustrated in FIG. 23 and FIG. 24A to FIG. 24D, the manufacturing method of the display substrate includes the following processes: a plurality of sub-pixels 200 is formed on the base substrate 110, wherein forming the sub-pixel 200 includes sequentially forming a first electrode 131, a light emitting functional layer 120 and a second electrode 132 stacked in a direction perpendicular to the base substrate 110; an organic material layer 020 is formed on the base substrate 110; an inorganic non-metallic material 030 is formed on the organic material layer 020, and the inorganic non-metallic material layer 030 includes at least two film layers, such as a film layer 031 (i.e. a first material layer) and a film layer 032 (i.e. a second material layer); the inorganic non-metallic material layer 030 is patterned to form the isolation structure 140. The isolation structure 140 includes a first sub-isolation structure 741 and a second sub-isolation structure 742, and the first sub-isolation structure 741 is located between the second sub-isolation structure 742 and the base substrate 110; in the isolation structure 140 between adjacent sub-pixels 200, an edge of the second sub-isolation structure 742 protrudes from an edge of the first sub-isolation structure 741 in the arrangement direction of adjacent sub-pixels 200 to form an isolation protrusion part 7420; the light emitting functional layer 120 is formed after the isolation structure 140 is formed, the light emitting functional layer 120 includes a plurality of film layers, and at least one of the plurality of film layers is disconnected at the isolation protrusion part 7420.

For example, the manufacturing method for forming structures such as the base substrate 110, the sub-pixels 200, and the pixel definition layer 150 in the display substrate shown in FIG. 23 may be the same as the manufacturing method for forming structures such as the base substrate 110, the sub-pixels 200, and the pixel definition layer 150 in the display substrate shown in FIG. 22A to FIG. 22D, which is not repeated here.

For example, as illustrated in FIG. 24A and FIG. 24B, after the inorganic non-metallic material layer 030 is formed, the inorganic non-metallic material layer 030 is patterned. For example, the inorganic non-metallic material layer 030 may include two film layers, such as the first inorganic non-metallic material layer 031 and the second inorganic non-metallic material layer 032, and patterning the inorganic non-metallic material layer 030 includes etching the two film layers included in the inorganic non-metallic material layer 030 by wet etching, the etching rate of the etchant or etching gas to the first inorganic non-metallic material layer 031 is greater than the etching rate of the etchant or etching gas to the second inorganic non-metallic material layer 032, so that the edge of the first sub-isolation structure 741 formed by etching the first inorganic non-metallic material layer 031 is recessed inward with respect to the edge of the second sub-isolation structure 742 formed by etching the second inorganic non-metallic material layer 032, so as to form an undercut structure, that is, form an isolation protrusion part 7420.

For example, as illustrated in FIG. 24C, after the isolation structure 140 is formed, the first electrodes 131 of the organic light emitting elements 210 of the sub-pixels are patterned on the planarization layer 180. The method and materials for forming the first electrodes 131 in this example may be the same as the method and materials for forming the first electrodes 131 shown in FIG. 22C, which are not repeated here.

For example, as illustrated in FIG. 24D, after the first electrodes 131 are formed, the pixel definition layer 150 may be formed. The method and material for forming the pixel definition layer 150 in this example may be the same as the method and material for forming the pixel definition layer 150 shown in FIG. 22D, which are not repeated here. For example, the steps after forming the pixel definition layer in this example may be the same as the steps after forming the pixel definition layer in the display substrate shown in FIG. 19, which are not repeated here.

For example, FIG. 25 is a schematic view of a partial cross-sectional structure of a display substrate provided according to another example of an embodiment of the present disclosure. The difference between the display substrate in the example illustrated in FIG. and the display substrate in the example illustrated in FIG. 23 lies in that: the isolation structure 140 further includes a third sub-isolation structure 743. The sub-pixels 200, the base substrate 110 and the pixel definition layer 150 in the display substrate shown in FIG. may have the same features as the sub-pixels 200, the base substrate 110 and the pixel definition layer 150 in the display substrate shown in the display substrate in any one of the examples illustrated in FIG. 19 to FIG. 21B and FIG. 23, which are not repeated here. The materials, shapes, and dimension relationship of the first sub-isolation structure 741 and the second sub-isolation structure 742 in the display substrate shown in FIG. 25 may be the same as the materials, shapes, and dimension relationship of the first sub-isolation structure 741 and the second sub-isolation structure 742 in the display substrate shown in FIG. 5, which are not repeated here.

For example, as illustrated in FIG. 25, the third sub-isolation structure 743 is located between the first sub-isolation structure 741 and the base substrate 110, in the isolation structure 140 between adjacent sub-pixels 200, the edge of the first sub-isolation structure 741 protrudes from the edge of the third sub-isolation structure 743 in the arrangement direction of adjacent sub-pixels 200, and the third sub-isolation structure 743 and the organic layer 180 are an integrated structure.

For example, as illustrated in FIG. 25, the third sub-isolation structure 743 may be a portion of the organic layer 180. For example, the third sub-isolation structure 743 may be a portion of the organic layer 180 protruding toward a side away from the base substrate 110. For example, the first sub-isolation structure 741 may be located on the portion of the organic layer 180 protruding toward the side away from the base substrate 110.

For example, as illustrated in FIG. 25, the material of the third sub-isolation structure 743 includes a photoresist, polyimide (PI) resin, acrylic resin, a silicon compound or polyacrylic resin.

For example, as illustrated in FIG. 25, the thickness of the third sub-isolation structure 743 may be 100 angstroms to 10000 angstroms. For example, the thickness of the third sub-isolation structure 743 may be 200 angstroms to 2000 angstroms.

For example, the cross-section of the third sub-isolation structure 743 taken along a plane along the arrangement direction of the adjacent sub-pixels 200 and perpendicular to the base substrate 110 includes a rectangle. For example, the cross-section of the third sub-isolation structure 743 taken along a plane along the arrangement direction of the adjacent sub-pixels 200 and perpendicular to the base substrate 110 includes a trapezoid, and an included angle between a lateral side of the trapezoid and a base of the trapezoid at a side close to the base substrate 110 is not greater than 90 degrees.

For example, as illustrated in FIG. 25, a length of an upper base of the trapezoidal cross-section of the third sub-isolation structure 743 is shorter than a length of a side of the cross-section of the first sub-isolation structure 741 close to the base substrate 110.

For example, the lateral side of the third sub-isolation structure 743 may be a straight side or a curved side, for example, the curved side bends toward a side away from a center of the third sub-isolation structure 743 where it is located, or the curved side bends toward a side close to the center of the third sub-isolation structure 743 where it is located. In this case, the included angle between the curved side and the lower base of the third sub-isolation structure 743 may refer to the included angle between the tangent line at the midpoint of the curved side and the lower base, or the included angle between the lower base and the tangent line at the intersection point of the curved side and the lower base.

For example, the difference between the formation of the isolation structure shown in FIG. 25 and the formation of the isolation structure shown in FIG. 23 lies in that: while etching the inorganic non-metallic material layer 030 by an dry etching method to form the first sub-isolation structure 741 and the second sub-isolation structure 742, a portion of the organic material layer 020 directly below the first sub-isolation structure 741 in the organic material layer 020 is dry etched to form the third sub-isolation structure 743. For example, a mask may be used to cover the inorganic non-metallic material layer 030 at the position where the first sub-isolation structure 741 and the second sub-isolation structure 742 are to be formed, so that the inorganic non-metallic material layer 030 at other positions other than the position where the first sub-isolation structure 741 and the second sub-isolation structure 742 are to be formed is etched, during the process of dry etching the inorganic non-metallic material layer 030, the etching gas would etch the portion of the organic material layer 020 that is not covered by the mask, so that the organic material layer (i.e. the third sub-isolation structure 743) having a certain thickness is remained directly below the remained inorganic non-metallic material layer (i.e. the first sub-isolation structure 741 and the second sub partition structure 742) after etching, so that a protrusion part directly below the first sub-isolation structure 741 and the second sub-isolation structure 742 is formed at the side of the organic material layer 020 away from the base substrate 110, and the protrusion part is the third sub-isolation structure 741. This example is not limited thereto, the first sub-isolation structure 741 and the second sub-isolation structure 742 may also be formed by using a wet etching process, thereafter, the third sub-isolation structure 743 is formed by a dry etching process; alternatively, the above-mentioned first sub-isolation structure 741, second sub-isolation structure 742 and third sub-isolation structure 743 may be formed by processes including a dry etching followed by a wet etching.

For example, as illustrated in FIG. 22A and FIG. 22B, during the process of dry etching the inorganic non-metallic material layer 030, the etched thickness of the organic material layer 020 may be 100 angstroms to 10000 angstroms, and the thickness of the formed third sub-isolation structure 743 may be 100 angstroms to 10000 angstroms. For example, during the process of performing dry etching on the inorganic non-metallic material layer 030, the etched thickness of the organic material layer 020 may be 200 angstroms to 2000 angstroms, and the thickness of the formed third sub-isolation structure 743 may be 200 angstroms to 2000 angstroms.

At least one embodiment of the present disclosure further provides a display substrate. FIG. 26 is a schematic structural view of another display substrate provided by an embodiment of the present disclosure. As illustrated in FIG. 26, the display substrate 100 includes a base substrate 110 and a plurality of sub-pixels (not shown); the plurality of sub-pixels are located on the base substrate 110, and each sub-pixel includes a light emitting element; each light emitting element includes a light emitting functional layer and a first electrode 131 and a second electrode (not shown) located on two sides of the light emitting functional layer, the first electrode 131 is located between the light emitting functional layer and the base substrate 110; the second electrode is at least partially located on a side of the light emitting functional layer away from the first electrode 131. It should be noted that, the specific structures of sub-pixels, light emitting elements, and light emitting functional layers may be referred to FIG. 1 and FIG. 2, which are not repeated here in the disclosure.

As illustrated in FIG. 26, the display substrate 100 further includes a pixel isolation structure 140, which is located on the base substrate 110 and between adjacent sub-pixels; at least one of the plurality of sub-functional film layers in the light emitting functional layer is disconnected at the position where the pixel isolation structure 140 is located. The display substrate 100 further includes a pixel definition layer 150; the pixel definition layer 150 is partially located on a side of the first electrode 131 away from the base substrate 110; the pixel definition layer 150 includes a plurality of pixel openings 152; the plurality of pixel openings 152 are in one-to-one correspondence with the plurality of sub-pixels 200 to define the effective light emitting regions of the plurality of sub-pixels 200; the pixel openings 152 are configured to expose the first electrodes 131, so that the first electrodes 131 contact the subsequently formed light emitting function layer 120.

As shown in FIG. 26, the pixel isolation structure 140 includes an inward recessed structure 140C and a shielding part 140S, the inward recessed structure 140C is located at an edge of the first electrode 131 and is recessed toward the pixel definition layer 150, the shielding part 140S is located on a side of the recess 140C away from the base substrate 110 and is a part of the pixel definition layer 150. As such, the conductive sub-layer of the light emitting functional layer is disconnected at the position where the shielding part is located. Therefore, through disposing the above-mentioned pixel isolation structure between adjacent sub-pixels, the display substrate can avoid crosstalk between adjacent sub-pixels caused by the sub-functional layer with high conductivity in the light emitting functional layer.

On the other hand, since the display substrate can avoid crosstalk between adjacent sub-pixels through the pixel isolation structure, the display substrate can increase pixel density while adopting a tandem EL design. Therefore, the display substrate can have the advantages of long life, low power consumption, high brightness, and high resolution.

In some examples, as illustrated in FIG. 26, an orthographic projection of the inward recessed structure 140C on the base substrate 110 is overlapped with an orthographic projection of the shielding part 140S on the base substrate 110.

FIG. 27 is a schematic structural view of another display substrate provided by an embodiment of the present disclosure. As illustrated in FIG. 27, the inward recessed structure 140C includes a residual structure 140R located at a position of the inward recessed structure 140 close to the pixel definition layer 150.

In some examples, as illustrated in FIG. 27, the material of the residual structure 140R includes a metal, such as silver.

An embodiment of the present disclosure further provides a display substrate. FIG. 28 is a schematic structural view of another display substrate provided by an embodiment of the present disclosure. The display substrate illustrated in FIG. 28 provides another pixel isolation structure. As illustrated in FIG. 28, the display substrate 100 further includes a pixel definition layer 150 located on the base substrate 110; the pixel definition layer 150 is partially located on a side of the first electrode 131 away from the base substrate 110; the pixel definition layer 150 includes a plurality of pixel openings 152 and pixel spacing openings 154; the plurality of pixel openings 152 are in one-to-one correspondence with the plurality of sub-pixels 200 to define the effective light emitting regions of the plurality of sub-pixels 200; the pixel openings 152 are configured to expose the first electrodes 131 so that the first electrodes 131 contact the subsequently formed light emitting functional layer 120. The pixel spacing opening 154 is located between adjacent first electrodes 131, and at least part of the isolation structure 140 is located in the pixel spacing opening 154.

As illustrated in FIG. 28, the pixel isolation structure 140 includes an inward recessed structure 140C and a shielding part 140S. The inward recessed structure 140C is located at the edge of the pixel spacing opening 154 and recessed toward the pixel definition layer 150. For example, the inward recessed structure 140C may be recessed toward the pixel definition layer 150 along a direction parallel to the base substrate 110. The shielding part 140S is located on a side of the recess 140C away from the base substrate 110, and is a part of the pixel definition layer 150. As such, the conductive sub-layer of the light emitting functional layer is disconnected at the position where the shielding part is located. Therefore, through disposing the above-mentioned pixel isolation structure between adjacent sub-pixels, the display substrate can avoid crosstalk between adjacent sub-pixels caused by the sub-functional layer with high conductivity in the light emitting functional layer.

FIG. 29 is a schematic structural view of another display substrate provided by an embodiment of the present disclosure. As illustrated in FIG. 29, the inward recessed structure 140C includes a residual structure 140R located at a position of the inward recessed structure 140 close to the pixel definition layer 150.

In some examples, as illustrated in FIG. 29, the material of the residual structure 140R includes at least one of metal, metal oxide, and organic material; the above-mentioned metal may be silver, and the above-mentioned metal oxide may be indium zinc oxide, the above-mentioned organic material may be an amino polymer.

In some examples, in the case that the material of the residual structure 140 is amino polymer, the material of the planarization layer includes photoresist, polyimide (PI) resin, acrylic resin, a silicon compound or polyacrylic resin. Therefore, the solvent of the planarization layer is mainly composed of non-fluorinated organic solvent, although these photoresists may contain a small amount of fluorination, they have not reached the level of being basically soluble in a fluorinated solution or perfluorinated solvent, so the orthogonal property (the solution and the solvent would not react with each other) thereof can be utilized, and the above-mentioned pixel isolation structure may be formed by using an etching process.

FIG. 30A to FIG. 30C are schematic views illustrating steps of another method for manufacturing a display substrate provided by an embodiment of the present disclosure. The method for manufacturing the display substrate includes the following steps.

As illustrated in FIG. 30A, first electrodes 131 and a sacrificial structure 430 are formed on a side of the planarization layer 180 away from the base substrate 110. It should be noted that the above-mentioned residual structure may be a part of the sacrificial structure.

As illustrated in FIG. 30B, a pixel definition layer 150 is formed on a side of the first electrodes 131 and the sacrificial structure 430 away from the base substrate 110. The pixel definition layer 150 includes a plurality of pixel openings 152 and pixel spacing openings 154; the plurality of pixel openings 152 are disposed in one-to-one correspondence with the plurality of first electrodes 131; the pixel openings 152 are configured to expose the first electrodes 131, so that the first electrodes 131 contact the subsequently formed light emitting functional layer 120. The pixel spacing opening 154 is located between adjacent first electrodes 131, and the sacrificial structure 430 is partially exposed by the pixel spacing opening 154.

As illustrated in FIG. 30C, the display substrate is etched using the pixel definition layer 150 as a mask, so as to remove the sacrificial structure 430 and form the above-mentioned pixel isolation structure 140.

FIG. 31A to FIG. 31C are schematic views illustrating steps of another method for manufacturing a display substrate provided by an embodiment of the present disclosure, the method for manufacturing the display substrate includes the following steps.

As illustrated in FIG. 31A, first electrodes 131, a protection structure 240 and a sacrificial structure 430 are formed on a side of the planarization layer 180 away from the base substrate 110, and the protection structure 240 and the first electrodes 131 are disposed in the same layer. The material of the protection structure 240 is the same as that of the first electrode 131, and the material of the protection structure 240 is different from that of the sacrificial structure 430.

As illustrated in FIG. 31B, a pixel definition layer 150 is formed on a side of the first electrodes 131 and the sacrificial structure 430 away from the base substrate 110. The pixel definition layer 150 includes a plurality of pixel openings 152 and pixel spacing openings 154; the plurality of pixel openings 152 are disposed in one-to-one correspondence with the plurality of first electrodes 131; the pixel openings 152 are configured to expose the first electrodes 131, so that the first electrodes 131 contact the subsequently formed light emitting functional layer 120. The pixel spacing opening 154 is located between adjacent first electrodes 131, and the sacrificial structure 430 is partially exposed by the pixel spacing opening 154.

As illustrated in FIG. 31C, the display substrate is etched using the pixel definition layer 150 as a mask, so as to remove the sacrificial structure 430 and form the above-mentioned pixel isolation structure 140.

The following points need to be explained:

(1) In the drawings of the embodiments of the present disclosure, only the structures related to the embodiments of the present disclosure are involved, and other structures can refer to the general design.

(2) Without conflict, the features in the same embodiment and different embodiments of the present disclosure can be combined with each other.

The above is only the illustrative embodiments of the disclosure, but the scope of protection of the disclosure is not limited to this, the scope of protection of the present disclosure shall be subject to the scope of protection of the claims.

The invention claimed is:

1. A display substrate, comprising:

a base substrate;

a plurality of sub-pixels, located on the base substrate, wherein each of the plurality of sub-pixels comprises a light emitting element, and the light emitting element comprises a light emitting functional layer, and a first electrode and a second electrode located on two sides of the light emitting functional layer, wherein the first electrode is located between the light emitting functional layer and the base substrate, and the light emitting functional layer comprises a conductive sub-layer; and an isolation structure, located on the base substrate, wherein the isolation structure is located between adjacent sub-pixels of the plurality of sub-pixels, and the conductive sub-layer in the light emitting functional layer is disconnected at a position where the isolation structure is located, the plurality of sub-pixels comprise a plurality of first color sub-pixels, a plurality of second color sub-pixels, and a plurality of third color sub-pixels, and the isolation structure comprises a plurality of ring-shaped isolation parts, each of the plurality of ring-shaped isolation parts surrounds one of the plurality of first color sub-pixels, one of the plurality of second color sub-pixels, or one of the plurality of third color sub-pixels, wherein the light emitting functional layer comprises a first light emitting layer and a second light emitting layer located on two sides of the conductive sub-layer in a direction perpendicular to the base substrate, and the conductive sub-layer is a charge generation layer.

2. The display substrate according to claim 1, wherein the plurality of ring-shaped isolation parts comprise a plurality of first ring-shaped pixel isolation parts and a plurality of second ring-shaped pixel isolation parts, and the plurality of first ring-shaped pixel isolation parts are disposed in correspondence with the plurality of first color sub-pixels, and the plurality of second ring-shaped pixel isolation parts are disposed in correspondence with the plurality of third color sub-pixels, each of the plurality of first ring-shaped pixel isolation parts surrounds one of the plurality of first color sub-pixels, and each of the plurality of second ring-shaped pixel isolation parts surrounds one of the plurality of third color sub-pixels.

3. The display substrate according to claim 2, wherein the isolation structure between a first color sub-pixel of the plurality of first color sub-pixels and a second color sub-pixel of the plurality of second color sub-pixels that are adjacent to each other only comprises a first ring-shaped pixel isolation part of the plurality of first ring-shaped pixel isolation parts.

4. The display substrate according to claim 2, wherein the isolation structure between a third color sub-pixel of the plurality of third color sub-pixels and a second color sub-pixel of the plurality of second color sub-pixels that are adjacent to each other only comprises a second ring-shaped pixel isolation part of the plurality of second ring-shaped pixel isolation parts.

5. The display substrate according to claim 2, wherein the plurality of first ring-shaped pixel isolation parts respectively comprise first openings, and each of the first openings is located on an extension line of a diagonal of an effective light emitting region of a first color sub-pixel of the plurality of first color sub-pixels.

6. The display substrate according to claim 5, wherein the first electrode of the first color sub-pixel comprises a first body part and a first connection part, and the first connection part is connected to the first body part, and configured to be connected with a pixel driving circuit, the first connection part is located at a position where a corresponding first opening is located.

7. The display substrate according to claim 5, wherein the plurality of second ring-shaped pixel isolation parts respectively comprise second openings, and each of the second openings is located on an extension line of a diagonal of an effective light emitting region of a third color sub-pixel of the plurality of third color sub-pixels.

8. The display substrate according to claim 7, wherein the first electrode of the third color sub-pixel comprises a second body part and a second connection part, and the second connection part is connected to the second body part, and configured to be connected with a pixel driving circuit, the second connection part is located at a position where a corresponding second opening is located.

9. The display substrate according to claim 8, wherein the first openings are arranged in an array to form first opening rows and first opening columns along a first direction and a second direction, the second openings are arranged in an array to form second opening rows and second opening columns along the first direction and the second direction, the first opening rows are substantially parallel to the second opening rows, and the first opening columns are substantially parallel to the second opening columns.

10. The display substrate according to claim 9, wherein the first opening rows are located between the plurality of first color sub-pixels and the plurality of third color sub-pixels, and the second opening rows are located between the plurality of first color sub-pixels and the plurality of third color sub-pixels.

11. The display substrate according to claim 1, further comprising:

a pixel definition layer, located on the base substrate, wherein the pixel definition layer is partially located on a side of the first electrode away from the base substrate, the pixel definition layer comprises a plurality of pixel openings and a pixel spacing opening, and the plurality of pixel openings are in one-to-one correspondence with the plurality of sub-pixels to define effective light emitting regions of the plurality of sub-pixels, each of the plurality of pixel openings is configured to expose the first electrode, the pixel spacing opening is located between adjacent first electrodes, and at least a portion of the isolation structure is located between the pixel definition layer and the base substrate.

12. The display substrate according to claim 11, wherein an edge of the isolation structure at a side in an arrangement direction of adjacent sub-pixels is located between the pixel definition layer and the base substrate.

13. The display substrate according to claim 12, wherein the edge of the isolation structure at the side in the arrangement direction is covered by the pixel definition layer.

14. The display substrate according to claim 1, further comprising:

a planarization layer, located between the base substrate and the first electrode; and a protection structure, located between the planarization layer and the first electrode.

15. The display substrate according to claim 14, wherein an orthographic projection of the first electrode on the base substrate falls within an orthographic projection of the protection structure on the base substrate.

16. The display substrate according to claim 14, wherein the protection structure and the isolation structure are disposed in a same layer.

17. The display substrate according to claim 1, wherein a side of the isolation structure in an arrangement direction of adjacent sub-pixels comprises an isolation surface, an included angle between the isolation surface and a plane where the base substrate is located ranges from 80 degrees to 100 degrees, and a dimension of the isolation structure in a direction perpendicular to the base substrate ranges from 500 Å to 1500 Å.

18. The display substrate according to claim 1, wherein the plurality of first color sub-pixels and the plurality of third color sub-pixels are alternately arranged along a first direction and a second direction to form a plurality of first pixel rows and a plurality of first pixel columns, and the plurality of second color sub-pixels are arranged in an array along the first direction and the second direction to form a plurality of second pixel rows and a plurality of second pixel columns, the plurality of first pixel rows and the plurality of second pixel columns are alternately arranged along the second direction and staggered from each other in the first direction, the plurality of first pixel columns and the plurality of second pixel columns are alternately arranged along the first direction and staggered from each other in the second direction, the isolation structure is located between adjacent first color sub-pixel and third color sub-pixel, and/or, the isolation structure is located between adjacent second color sub-pixel and third color sub-pixel, and/or, the isolation structure is located between adjacent first color sub-pixel and second color sub-pixel.

19. A method for manufacturing a display substrate, comprising:

forming a plurality of first electrodes on a base substrate;

forming an isolation structure on the base substrate;

forming a light emitting functional layer on a side of the isolation structure and the plurality of first electrodes away from the base substrate, and the light emitting functional layer comprises a conductive sub-layer; and forming a second electrode on a side of the light emitting functional layer away from the base substrate, the second electrode, the light emitting functional layer and the plurality of first electrodes form light emitting elements of the plurality of sub-pixels, wherein the isolation structure is located between adjacent sub-pixels of the plurality of sub-pixels, and the conductive sub-layer in the light emitting functional layer is disconnected at a position where the isolation structure is located, the plurality of sub-pixels comprise a plurality of first color sub-pixels, a plurality of second color sub-pixels, and a plurality of third color sub-pixels, and the isolation structure comprises a plurality of ring-shaped isolation parts, and each of the plurality of ring-shaped isolation parts surround one of one first color sub-pixel, one second color sub-pixel and one third color sub-pixel, wherein the light emitting functional layer comprises a first light emitting layer and a second light emitting layer located on two sides of the conductive sub-layer in a direction perpendicular to the base substrate, and the conductive sub-layer is a charge generation layer.

* * * * *